United States Patent
Suzawa et al.

(10) Patent No.: US 9,064,967 B2
(45) Date of Patent: *Jun. 23, 2015

(54) SEMICONDUCTOR ELEMENT, SEMICONDUCTOR DEVICE, AND METHOD FOR MANUFACTURING THE SAME

(71) Applicant: Semiconductor Energy Laboratory Co., Ltd., Atsugi-shi, Kanagawa-ken (JP)

(72) Inventors: Hideomi Suzawa, Kanagawa (JP); Motomu Kurata, Kanagawa (JP); Mayumi Mikami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/472,602

(22) Filed: Aug. 29, 2014

(65) Prior Publication Data

US 2014/0367678 A1    Dec. 18, 2014

Related U.S. Application Data

(63) Continuation of application No. 13/956,444, filed on Aug. 1, 2013, now Pat. No. 8,823,074, which is a continuation of application No. 12/956,624, filed on Nov. 30, 2010, now Pat. No. 8,501,564.

(30) Foreign Application Priority Data

Dec. 4, 2009  (JP) ................................ 2009-276004

(51) Int. Cl.
*H01L 29/788* (2006.01)
*H01L 21/336* (2006.01)
(Continued)

(52) U.S. Cl.
CPC ........ *H01L 29/7869* (2013.01); *H01L 27/1225* (2013.01); *H01L 29/41733* (2013.01);
(Continued)

(58) Field of Classification Search
USPC ........... 438/201, 211, 241, 266; 257/316–322
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

International Search Report (Application No. PCT/JP2010/070418) Dated Jan. 11, 2011.

(Continued)

*Primary Examiner* — Calvin Lee
(74) *Attorney, Agent, or Firm* — Fish & Richardson P.C.

(57) ABSTRACT

The semiconductor element includes an oxide semiconductor layer on an insulating surface; a source electrode layer and a drain electrode layer over the oxide semiconductor layer; a gate insulating layer over the oxide semiconductor layer, the source electrode layer, and the drain electrode layer; and a gate electrode layer over the gate insulating layer. The source electrode layer and the drain electrode layer have sidewalls which are in contact with a top surface of the oxide semiconductor layer.

23 Claims, 28 Drawing Sheets

(51) Int. Cl.
  *H01L 29/786* (2006.01)
  *H01L 27/12* (2006.01)
  *H01L 29/417* (2006.01)
  *H01L 27/108* (2006.01)
  *H01L 29/12* (2006.01)
  *H01L 29/66* (2006.01)

(52) U.S. Cl.
  CPC ........ *H01L29/78696* (2013.01); *H01L 27/108* (2013.01); *H01L 29/12* (2013.01); *H01L 29/66969* (2013.01); *H01L 29/78648* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,855,969 B2 | 2/2005 | Inoh |
| 6,890,783 B2 | 5/2005 | Kimura et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,087,475 B2 | 8/2006 | Inoh |
| 7,105,868 B2 | 9/2006 | Nause et al. |
| 7,157,323 B2 | 1/2007 | Gan et al. |
| 7,211,825 B2 | 5/2007 | Shih et al. |
| 7,238,557 B2 | 7/2007 | Hayakawa |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,863,600 B2 | 1/2011 | Nomoto |
| 7,919,365 B2 | 4/2011 | Kim et al. |
| 7,981,734 B2 | 7/2011 | Furuta et al. |
| 8,179,490 B2 | 5/2012 | Lin et al. |
| 8,501,564 B2 * | 8/2013 | Suzawa et al. ................ 438/266 |
| 8,530,891 B2 | 9/2013 | Inoue et al. |
| 8,748,879 B2 | 6/2014 | Yano et al. |
| 8,823,074 B2 * | 9/2014 | Suzawa et al. ................ 257/316 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0056826 A1 | 3/2005 | Appenzeller et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Lee et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/1025813 | 10/2008 | Ito et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0032665 A1 | 2/2010 | Yamazaki et al. |
| 2010/0032668 A1 | 2/2010 | Yamazaki et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2011/0114943 A1 | 5/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| JP | 2003-086808 A | 3/2003 |
|---|---|---|
| JP | 2003-309267 A | 10/2003 |
| JP | 2004-103957 A | 4/2004 |
| JP | 2004-273614 A | 9/2004 |
| JP | 2004-273732 A | 9/2004 |
| JP | 2006-049577 A | 2/2006 |
| JP | 2006-165527 A | 6/2006 |
| JP | 2006-165528 A | 6/2006 |
| JP | 2006-165529 A | 6/2006 |
| JP | 2007-096055 A | 4/2007 |
| JP | 2007-284342 A | 11/2007 |
| JP | 2008-535205 | 8/2008 |
| WO | WO-2003/081687 | 10/2003 |
| WO | WO-2004/114391 | 12/2004 |
| WO | WO-2005/093850 | 10/2005 |
| WO | WO-2007/029844 | 3/2007 |
| WO | WO-2007/089048 | 8/2007 |
| WO | WO-2008/126492 | 10/2008 |
| WO | WO-2008/136505 | 11/2008 |

OTHER PUBLICATIONS

Written Opinion (Application No. PCT/JP2010/070418) Dated Jan. 11, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984; vol. 29, No. 5, pp. 2957-2959.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003. vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDS '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3,1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashlm et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09:Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009. pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1 , 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150. pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, no. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 SID International Symposium Digest of Technical Papers, May 20, 2008, vol. 39, pp. 621-624

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

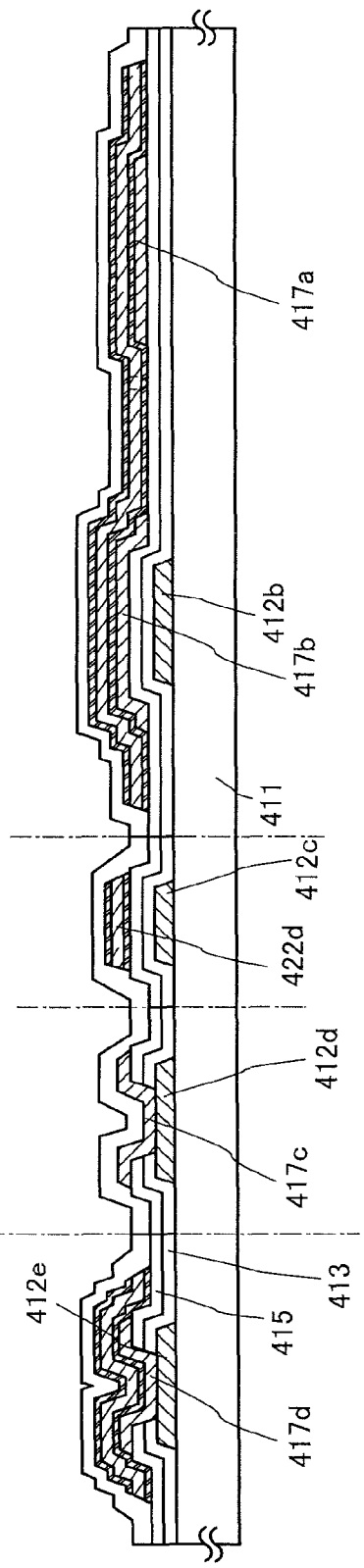
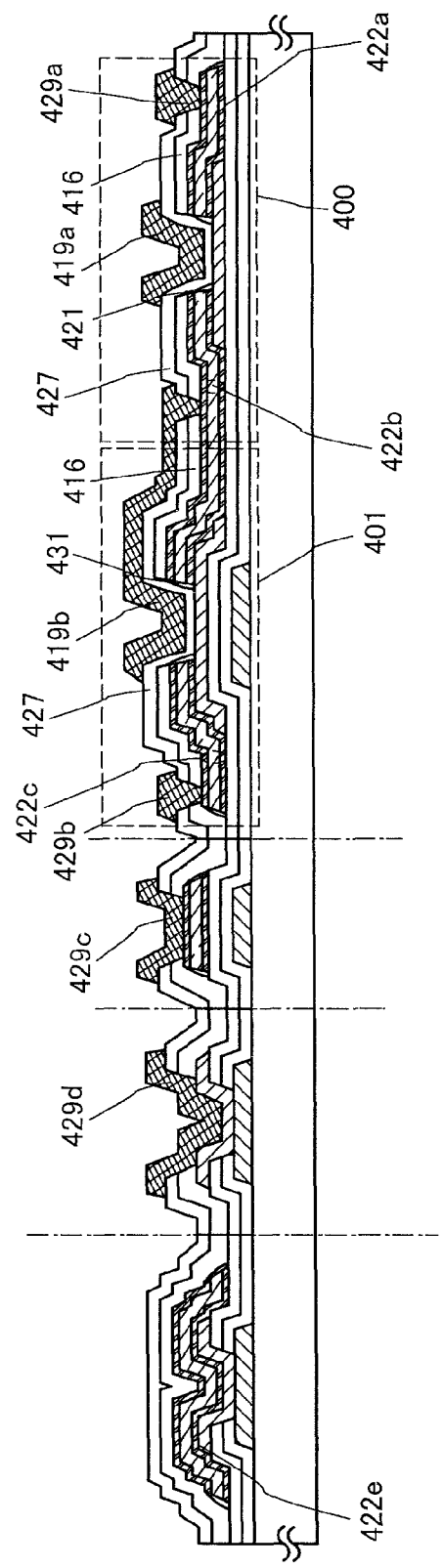
FIG. 5A
FIG. 5B

SEMICONDUCTOR ELEMENT, SEMICONDUCTOR DEVICE, AND METHOD FOR MANUFACTURING THE SAME

CROSS-REFERENCE TO RELATED APPLICATIONS

This application is a continuation of U.S. application Ser. No. 13/956,444 filed Aug. 1, 2013, now U.S. Pat. No. 8,823,074 issued Sep. 2, 2014, which is a continuation of U.S. application Ser. No. 12/956,624 filed Nov. 30, 2010, now U.S. Pat. No. 8,501,564 issued Aug. 6, 2013, which claims the benefit of a foreign priority application filed in Japan as Serial No. 2009-276004 on Dec. 4, 2009, all of which are incorporated by reference.

TECHNICAL FIELD

The present invention relates to a semiconductor element including an oxide semiconductor and a semiconductor device including the semiconductor element. The present invention relates to, for example, an electronic device including a semiconductor integrated circuit as a component. In addition, the present invention relates to a method for manufacturing the semiconductor element and the semiconductor device.

In this specification, a "semiconductor device" refers to all devices which can function by utilizing semiconductor characteristics, and electro-optical devices, semiconductor circuits, electronic components, and electronic devices are all included in the category of the semiconductor device.

BACKGROUND ART

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) such as an LSI, a CPU, or a memory is mounted on a circuit board, for example, a printed wiring board, to be used as one of components of a variety of electronic devices.

Further, a semiconductor device capable of transmitting and receiving data has been developed. Such a semiconductor device is called a wireless tag, an RFID tag, or the like. Those put into practical use include a semiconductor circuit (IC chip) formed using an antenna and a semiconductor substrate in many cases.

A silicon-based semiconductor material has been known as a semiconductor material that can be used for a transistor; however, an oxide semiconductor has attracted attention as another material. As a material for the oxide semiconductor, zinc oxide and a material containing zinc oxide as a component are known. In addition, a transistor including an amorphous oxide (oxide semiconductor) having an electron carrier concentration of lower than $10^{18}/cm^3$ is disclosed (Patent Documents 1 to 3).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

Miniaturizing a semiconductor element by reduction in channel length L of the semiconductor element is given as a way to increase the operation speed of a circuit and reduce power consumption of the semiconductor integrated circuit manufactured using the semiconductor element including an oxide semiconductor.

The space between a source electrode layer and a drain electrode layer which are formed over an oxide semiconductor layer needs to be reduced in order to reduce a channel length L of a top-gate semiconductor element including an oxide semiconductor for miniaturization of the semiconductor element. However, reducing the space between the source electrode layer and the drain electrode layer through a photo process is limited. For that reason, it is difficult to manufacture a minute semiconductor element.

In view of the foregoing, an object of one embodiment of the present invention is to provide a top-gate semiconductor element including an oxide semiconductor, which has a short channel length L and can be miniaturized. In addition, an object of one embodiment of the present invention is to provide a method for manufacturing the semiconductor element.

Further, an object of one embodiment of the present invention is to increase the operation speed of a circuit, and furthermore, to reduce power consumption by using a minute semiconductor element which has a short channel length L in a semiconductor integrated circuit such as an LSI, a CPU, or a memory.

Further, an object of one embodiment of the present invention is to provide a highly reliable semiconductor element and a semiconductor device including the semiconductor element by improving the coverage of a source electrode layer and a drain electrode layer with a gate insulating layer to prevent a short circuit between the gate electrode layer and the source electrode layer or the drain electrode layer.

In a top-gate semiconductor element including an oxide semiconductor, sidewalls are provided for a source electrode layer and a drain electrode layer, whereby the semiconductor element can have a short channel length L and can be minute. In addition, the minute semiconductor element which has a short channel length L is used in a semiconductor integrated circuit such as an LSI, a CPU, or a memory, whereby the operation speed of the circuit can be increased, and furthermore, power consumption can be reduced.

Further, sidewalls are provided for a source electrode layer and a drain electrode layer in a top-gate semiconductor element including an oxide semiconductor, so that side surfaces of the source electrode layer and the drain electrode layer are tapered; thus, the coverage with a gate insulating layer can be improved and a short circuit between a gate electrode layer and the source electrode layer or the drain electrode layer can be prevented. Accordingly, a highly reliable semiconductor element can be manufactured.

A normally-off semiconductor element in which off-state current is small can be manufactured by using an oxide semiconductor layer which has a large energy gap and in which the hydrogen concentration is sufficiently reduced and the purity is increased by removal of impurities such as hydrogen and moisture. The use of the semiconductor element makes it possible to realize a semiconductor device whose power consumption due to leakage current is small.

One embodiment of the present invention is a semiconductor element. The semiconductor element includes an oxide semiconductor layer on an insulating surface; a source electrode layer and a drain electrode layer over the oxide semiconductor layer; a gate insulating layer over the oxide semiconductor layer, the source electrode layer, and the drain electrode layer; and a gate electrode layer over the gate insulating layer. The source electrode layer and the drain electrode layer have sidewalls which are in contact with a top surface of the oxide semiconductor layer.

One embodiment of the present invention is a semiconductor element. The semiconductor element includes an oxide semiconductor layer on an insulating surface, and a source electrode layer and a drain electrode layer over the oxide semiconductor layer. The source electrode layer includes a first source electrode layer and a second source electrode layer over the first source electrode layer. The drain electrode layer includes a first drain electrode layer and a second drain electrode layer over the first drain electrode layer. A sidewall provided for the second source electrode layer is in contact with a top surface of the first source electrode layer. A sidewall provided for the second drain electrode layer is in contact with a top surface of the first drain electrode layer. The semiconductor element also includes a gate insulating layer over the oxide semiconductor layer, the source electrode layer, the drain electrode layer, and the sidewalls, and a gate electrode layer over the gate insulating layer. The first source electrode layer extends beyond an edge of the second source electrode layer and the first drain electrode layer extends beyond an edge of the second drain electrode layer.

With any of the above structures, at least one of the above objects can be achieved.

A conductive layer may be formed below the oxide semiconductor layer. The semiconductor element of the present invention has another structure in which a conductive layer is provided on the insulating surface and a first insulating layer which covers the conductive layer is provided in each of the above structures, and the conductive layer overlaps with the oxide semiconductor layer with the first insulating layer interposed therebetween.

In order to reduce parasitic capacitance, the semiconductor element of the present invention has another structure in which the gate insulating layer and a second insulating layer are provided between the gate electrode layer and the source electrode layer or the drain electrode layer in each of the above structures. In other words, in the semiconductor element, the source electrode layer or the drain electrode layer overlaps with part of the gate electrode layer with the gate insulating layer and the second insulating layer interposed therebetween. By providing the gate insulating layer and the second insulating layer between the gate electrode layer and the source electrode layer or the drain electrode layer, the space between the gate electrode layer and the source electrode layer or the space between the gate electrode layer and the drain electrode layer is increased, whereby parasitic capacitance can be reduced.

When the second insulating layer is provided, in order that the source electrode layer and the drain electrode layer have tapered shapes, etching conditions such as a selectivity ratio of the second insulating layer to the source electrode layer or the drain electrode layer need to be controlled, which makes processing by etching difficult. Unless the source electrode layer and the drain electrode layer are tapered, a problem arises in that the coverage with the gate insulating layer stacked thereover is reduced. However, in the semiconductor element according to one embodiment of the present invention, sidewalls are provided on side surfaces of the source electrode layer and the drain electrode layer, which give tapered shapes to the source electrode layer and the drain electrode layer; thus, edges of the source electrode layer and the drain electrode layer do not need to be processed to have tapered shapes. Accordingly, the semiconductor element can be easily manufactured.

In each of the above structures, the carrier concentration in the oxide semiconductor layer is preferably lower than $1 \times 10^{12}/cm^3$. In addition, in each of the above structures, the off-state current of the semiconductor element is preferably less than $1 \times 10^{-13}$ A.

One embodiment of the present invention is a semiconductor device including the semiconductor element having each of the above structures.

Further, a semiconductor circuit can be manufactured by combining a plurality of semiconductor elements each including an oxide semiconductor layer in which the hydrogen concentration is sufficiently reduced. As the semiconductor circuit, for example, an EDMOS circuit can be formed. The semiconductor device includes an EDMOS circuit which includes, on an insulating surface, a first semiconductor element including a first oxide semiconductor layer and a second semiconductor element including a second oxide semiconductor layer. The first oxide semiconductor layer and the second oxide semiconductor layer have a carrier concentration of lower than $1 \times 10^{12}/cm^3$.

Here, the EDMOS circuit refers to an inverter circuit including an enhancement mode transistor and a depletion mode transistor in combination.

As well as an LSI, a CPU, or a memory, a power supply circuit, a transmitting and receiving circuit, an amplifier of an audio processing circuit, a driver circuit of a display portion, a controller, a converter of an audio processing circuit, or the like can be manufactured using the semiconductor element having each of the above structures.

A plurality of semiconductor integrated circuits can be mounted on one package to increase the density of a semiconductor device, which is a so-called MCP (multi chip package).

Further, in the case where the semiconductor integrated circuit is mounted on a circuit board, the semiconductor integrated circuit may be mounted in a face-up state or a flip-chip state (face-down state).

One embodiment of the present invention is a method for manufacturing a semiconductor element. The method includes the steps of forming an oxide semiconductor layer on an insulating surface; forming a source electrode layer and a drain electrode layer over the oxide semiconductor layer; forming a film serving as a sidewall over the oxide semiconductor layer, the source electrode layer, and the drain electrode layer; forming sidewalls of the source electrode layer and the drain electrode layer, which are in contact with a top surface of the oxide semiconductor layer, by etching the film serving as a sidewall; forming a gate insulating layer over the oxide semiconductor layer, the source electrode layer, the drain electrode layer, and the sidewalls; and forming a gate electrode layer over the gate insulating layer.

One embodiment of the present invention is a method for manufacturing a semiconductor element. The method includes the steps of forming an oxide semiconductor layer on an insulating surface; forming a first conductive film and a second conductive film over the oxide semiconductor layer; forming a second source electrode layer and a second drain electrode layer by etching the second conductive film; forming a film serving as a sidewall over the first conductive film, the second source electrode layer, and the second drain electrode layer; forming sidewalls of the second source electrode layer and the second drain electrode layer by etching the film serving as a sidewall; forming a first source electrode layer and a first drain electrode layer by etching the first conductive film, using the sidewalls as masks; forming a gate insulating layer over the oxide semiconductor layer, the first source electrode layer, the second source electrode layer, the first drain electrode layer, the second drain electrode layer, and the sidewalls; and forming a gate electrode layer over the gate insulating layer. The first source electrode layer extends beyond an edge of the second source electrode layer. The first drain electrode layer extends beyond an edge of the second drain electrode layer. The sidewall is in contact with a top surface of the first source electrode layer or the first drain electrode layer.

One embodiment of the present invention is a method for manufacturing a semiconductor element in each of the above structures, which includes the steps of forming a conductive layer on the insulating surface; forming an insulating layer which covers the conductive layer; and forming the oxide semiconductor layer overlapping with the conductive layer with the insulating layer interposed therebetween.

Note that in this specification, the "channel length L" refers to the length in the direction connecting the source electrode layer and the drain electrode layer in a region where a bottom surface of a gate electrode layer overlap with an oxide semiconductor layer.

In this specification and the like, the terms "over" and "below" do not necessarily mean "directly on" and "directly below", respectively, in the description of the positional relationship between components. For example, the expression of "a gate electrode layer over a gate insulating layer" does not exclude the case where another component is interposed between the gate insulating layer and the gate electrode layer. In addition, the terms "over" and "below" are used only for convenience of the description. Unless otherwise specified, the case where the positions thereof are interchanged is included.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

According to one embodiment of the present invention, a top-gate semiconductor element including an oxide semiconductor layer, which has a short channel length L and can be miniaturized can be provided by providing sidewalls for a source electrode layer and a drain electrode layer. In addition, according to one embodiment of the present invention, a method for manufacturing the semiconductor element can be provided.

Further, a minute semiconductor element which has a short channel length L according to one embodiment of the present invention is used in a semiconductor integrated circuit such as an LSI, a CPU, or a memory, whereby the operation speed of the circuit can be increased, and furthermore, power consumption can be reduced.

Further, in the semiconductor element according to one embodiment of the present invention, the sidewalls are provided on the side surfaces of the source electrode layer and the drain electrode layer, which give tapered shapes to the source electrode layer and the drain electrode layer; thus, the coverage with a gate insulating layer can be improved and a short circuit between a gate electrode layer and the source electrode layer or the drain electrode layer can be prevented. Accordingly, a highly reliable semiconductor element can be manufactured.

BRIEF DESCRIPTION OF DRAWINGS

FIGS. 5A and 5B are cross-sectional views illustrating one embodiment of the present invention.

BEST MODE FOR CARRYING OUT THE INVENTION

Figure 1A:
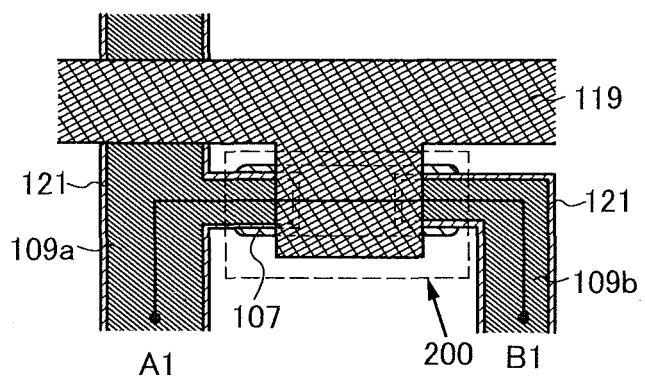
FIGS. 1A to 1D are a top view and cross-sectional views illustrating one embodiment of the present invention.

Hereinafter, Embodiments of the present invention will be described in detail with reference to the accompanying drawings. However, the present invention is not limited to the description below, and it is easily understood by those skilled in the art that the modes and details disclosed herein can be modified in various ways without departing from the spirit and scope of the present invention. Further, the present invention is not construed as being limited to the description of Embodiments.

Note that the position, size, range, or the like of each component illustrated in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, an example of a cross-sectional structure of a semiconductor element according to one embodiment of the present invention will be described.

Figure 1B:
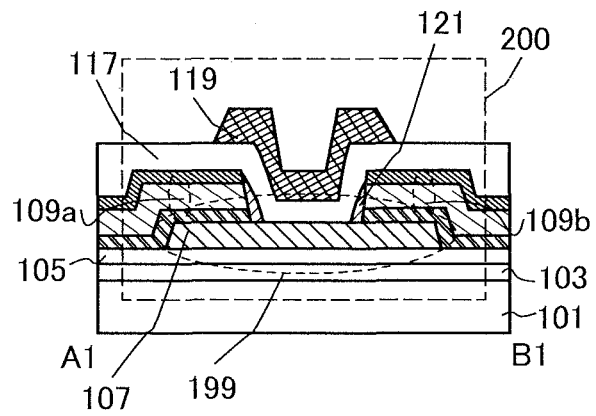
Figure 1C:
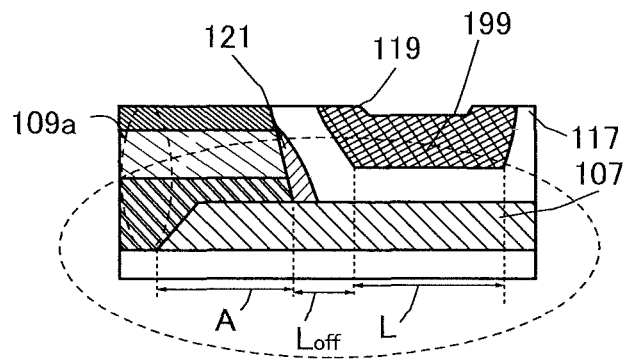
Figure 1D:
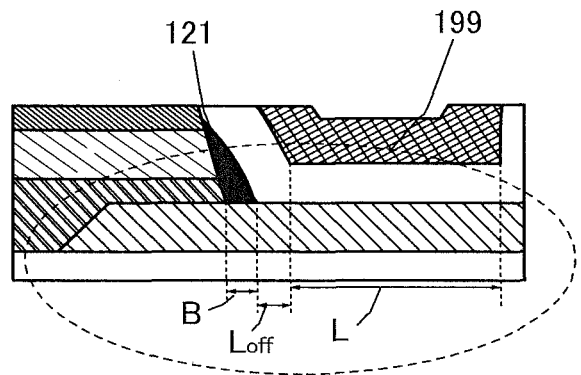

A semiconductor element of this embodiment will be described with reference to FIGS. 1A to 1D and FIGS. 28A and 28B. FIG. 1A is a top view of a semiconductor element of one embodiment of the present invention. FIG. 1B is a cross-sectional view taken along a line A1-B1 in FIG. 1A. FIGS. 1C and 1D are enlarged views of a dashed line portion 199 in FIG. 1B. In addition, FIGS. 28A and 28B each illustrate an example of a cross-sectional structure of a semiconductor element of one embodiment of the present invention. A transistor 200 illustrated in FIGS. 1A to 1D, a transistor 201 illustrated in FIG. 28A, and a transistor 300 illustrated in FIG. 28B are top-gate transistors.

The transistor 200 illustrated in FIGS. 1A and 1B includes a first insulating layer 103, a second insulating layer 105, an oxide semiconductor layer 107, a source electrode layer 109a, a drain electrode layer 109b, sidewalls 121, a gate insulating layer 117, and a gate electrode layer 119 over a substrate 101 having an insulating surface.

The transistor 200 includes the sidewalls 121 of the source electrode layer 109a and the drain electrode layer 109b. Bottom surfaces of the sidewalls 121 are in contact with a top surface of the oxide semiconductor layer 107. Reduction in the space between the source electrode layer 109a and the drain electrode layer 109b through a photo process is limited. However, when the sidewalls 121 are provided in the space by anisotropic etching, the width of part of the gate electrode layer 119, which is positioned between the source electrode layer 109a and the drain electrode layer 109b can be reduced; thus, a minute transistor which has a short channel length L can be manufactured. Reduction in the channel length L might cause a short-channel effect. The short-channel effect in a transistor including an oxide semiconductor will be described later in this embodiment.

Note that the "channel length L" in this specification refers to the length in the direction connecting the source electrode layer and the drain electrode layer in a region where a bottom surface of the gate electrode layer overlap with the oxide semiconductor layer (FIG. 1C).

In the transistor 200, sidewalls are provided on side surfaces of the source electrode layer and the drain electrode layer, which give tapered shapes to the source electrode layer and the drain electrode layer; thus, the coverage with the gate insulating layer can be improved and a short circuit between the gate electrode layer and the source electrode layer or the drain electrode layer can be prevented. Thus, the transistor 200 can be highly reliable.

When the sidewall 121 is formed using an insulating material, an offset region $L_{off}$ is provided as illustrated in FIG. 1C. In that case, the offset region $L_{off}$ refers to a region between the channel length L and a region A where an edge of the source electrode layer or the drain electrode layer overlaps with the oxide semiconductor layer. The provision of the offset region $L_{off}$ increases the distance between the gate electrode layer and the source electrode layer or the drain electrode layer, so that a short circuit can be further prevented from occurring between the electrodes. In addition, parasitic capacitance between the gate electrode layer and the source electrode layer or the drain electrode layer can be reduced.

In contrast, in the case where the sidewall 121 is formed using a conductive material, the sidewall 121 functions as a part of the source electrode layer or the drain electrode layer; thus, the offset region $L_{off}$ can be reduced (FIG. 1D). In that case, the offset region $L_{off}$ is defined by the distance between the channel length L and a region B where a bottom surface of the sidewall 121 overlaps with the oxide semiconductor layer. Thus, high on-state current and high mobility can be realized.

In other words, the offset region $L_{off}$ can be both increased and decreased by changing a material used for the sidewall 121.

Further, the transistor 200 includes the purified oxide semiconductor layer 107 as a channel region. The transistor 200 including the purified oxide semiconductor which has a large energy gap has small off-state current and an electric characteristic of being normally off (that is, current does not flow between the source electrode and the drain electrode when the gate voltage is 0 V), and further, has small temperature dependence of the transistor characteristics. For example, in the case where the drain voltage $V_d$ is +1 V or +10 V, the drain current $I_d$ is sufficiently high when the gate voltage $V_g$ is positive, and the drain current can be lower than or equal to $1 \times 10^{-13}$ A when the gate voltage $V_g$ ranges from −5 V to −20 V.

Note that the carrier concentration in the oxide semiconductor layer 107 in which the hydrogen concentration is sufficiently reduced and the purity is increased is lower than $1 \times 10^{12}/cm^3$, preferably lower than or equal to $1 \times 10^{11}/cm^3$, more preferably lower than or equal to $1.45 \times 10^{10}/cm^3$. A method for calculating the carrier concentration will be described later in this embodiment.

The energy gap of the oxide semiconductor layer 107 is greater than or equal to 2.0 eV, preferably greater than or equal to 2.5 eV, more preferably greater than or equal to 3.0 eV. Comparison with another material having a large energy gap will be described later. In addition, a transistor including an oxide semiconductor which is purified and has low carrier concentration has high resistance to hot carrier degradation. This will be also specifically described later.

As described above, the normally-off transistor 200 is manufactured by using the oxide semiconductor layer 107 which has a large energy gap and in which the hydrogen concentration is sufficiently reduced and the purity is increased, so that a semiconductor device having a novel structure can be realized.

Figure 28A:
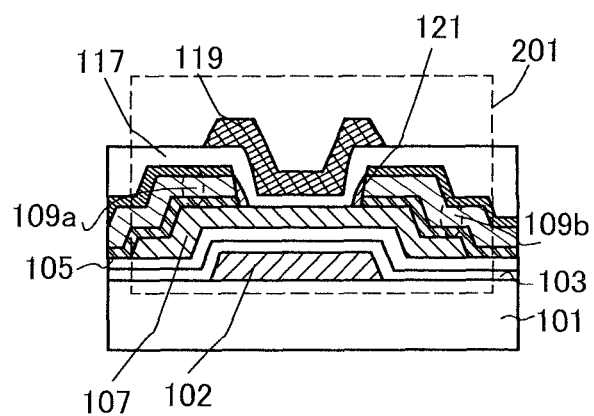
FIGS. 28A and 28B are cross-sectional views each illustrating one embodiment of the present invention.
Figure 28B:
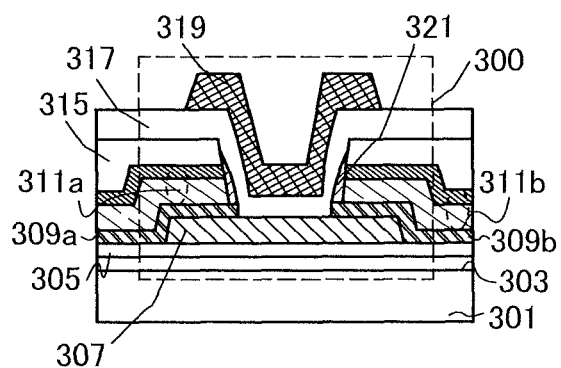

The transistor 201 illustrated in FIG. 28A includes an electrode layer 102, the first insulating layer 103, the second insulating layer 105, the oxide semiconductor layer 107, the source electrode layer 109a, the drain electrode layer 109b, the sidewalls 121, the gate insulating layer 117, and the gate electrode layer 119 over the substrate 101 having an insulating surface.

In other words, the transistor 201 has a structure in which the electrode layer 102 is added to the transistor 200.

The electrode layer 102 provided below the oxide semiconductor layer 107 of the transistor 201 can function as a back gate. The potential of the back gate can be fixed potential, for example, 0 V, or ground potential, and may be determined by a practitioner as appropriate. By providing the gate electrodes above and below the oxide semiconductor layer, in a bias-temperature stress test (hereinafter, referred to as a BT test) for examining the reliability of the transistor, the amount of change in threshold voltage of the transistor before and after the BT test can be reduced. In other words, the provision of the gate electrodes above and below the oxide semiconductor layer allows the reliability to be improved.

Further, the threshold voltage can be controlled by controlling gate voltage applied to the electrode layer 102. The transistor can function as an enhancement mode transistor by setting the threshold voltage to be positive. Alternatively, the transistor can function as a depletion mode transistor by setting the threshold voltage to be negative.

For example, an inverter circuit including an enhancement mode transistor and a depletion mode transistor in combination (an EDMOS inverter circuit; hereinafter simply referred to as an EDMOS circuit) can be used for a driver circuit. The driver circuit includes at least a logic circuit portion, and a switch portion or a buffer portion. The logic circuit portion has a circuit structure including the above EDMOS circuit. Further, a transistor in which large on-state current can flow is preferably used for the switch portion or the buffer portion. A depletion mode transistor or a transistor including gate electrodes above and below an oxide semiconductor layer is used.

Further, transistors having different structures can be manufactured over one substrate without significant increase in the number of manufacturing steps. For example, an EDMOS circuit can be formed using the transistor including gate electrodes above and below an oxide semiconductor layer as illustrated in FIGS. 28A and 28B, in an integrated circuit for high-speed driving, and a transistor including a gate electrode only above an oxide semiconductor layer as illustrated in FIGS. 1A to 1D can be formed in another region.

Note that an n-channel transistor whose threshold voltage is positive is defined as an enhancement mode transistor while an n-channel transistor whose threshold voltage is negative is defined as a depletion mode transistor, throughout this specification.

The transistor 300 illustrated in FIG. 28B includes a first insulating layer 303, a second insulating layer 305, an oxide semiconductor layer 307, a source electrode layer (a first source electrode layer 309a and a second source electrode layer 311a), a drain electrode layer (a first drain electrode layer 309b and a second drain electrode layer 311b), a third insulating layer 315, sidewalls 321, a gate insulating layer 317, and a gate electrode layer 319 over a substrate 301 having an insulating surface.

The transistor 300 includes the sidewalls 321 of the second source electrode layer 311a and the second drain electrode layer 311b. Bottom surfaces of the sidewalls 321 are in contact with top surfaces of the first source electrode layer 309a and the first drain electrode layer 309b. The transistor 300 includes the sidewalls 321, so that the transistor has a short channel length L. Reduction in the channel length L might cause a short-channel effect. A short-channel effect in a transistor including an oxide semiconductor will be described later in this embodiment.

The transistor 300 includes the third insulating layer 315. The provision of the third insulating layer 315 allows reduction in parasitic capacitance between the gate electrode layer 319 and the second source electrode layer 311a or between the gate electrode layer 319 and the second drain electrode layer 311b. Meanwhile, when the third insulating layer 315 is provided, in order that the second source electrode layer 311a and the second drain electrode layer 311b have tapered shapes, etching conditions such as a selectivity ratio of the third insulating layer 315 to the second source electrode layer 311a or the second drain electrode layer 311b need to be controlled, which makes processing by etching difficult. Unless the second source electrode layer 311a and the second drain electrode layer 311b are tapered, a problem arises in that the coverage with the gate insulating layer 317 stacked thereover is reduced. However, in the transistor according to one embodiment of the present invention, the sidewalls 321 are provided on side surfaces of the second source electrode layer 311a and the second drain electrode layer 311b, which give tapered shapes to the source electrode layer 311a and the drain electrode layer 311b; thus, the edges of the second source electrode layer 311a and the second drain electrode layer 311b do not need to be processed to have tapered shapes. Accordingly, the transistor can be easily manufactured.

The transistor 300 is different from the transistors 200 and 201 in that an offset region $L_{off}$ does not depend on a material for the sidewalls but is determined by the thickness of the gate insulating layer.

As described above, an oxide semiconductor which is made to be intrinsic or substantially intrinsic by removing impurities which can be carrier donors (donors or acceptors) in the oxide semiconductor to a very low level is used in the transistor of this embodiment.

The significance of purifying an oxide semiconductor and making an oxide semiconductor intrinsic (i-type), advantages of manufacturing a semiconductor device using the oxide semiconductor, and the like will be briefly described below.

<Making Oxide Semiconductor Intrinsic>

Note that, although a lot of researches on properties, such as density of state (DOS), of an oxide semiconductor have been conducted, they do not include the idea of sufficiently reducing localized states themselves. According to one embodiment of the disclosed invention, a purified oxide semiconductor is formed by removing water or hydrogen, which might be a cause of localized states, from the oxide semiconductor. This is based on the idea of sufficiently reducing localized states themselves, and makes it possible to manufacture excellent industrial products.

Note that when hydrogen, water, or the like is removed, oxygen is also removed in some cases. Therefore, it is preferable that the oxide semiconductor be further purified (made to be i-type) by supplying oxygen to dangling bonds of metal which are formed due to oxygen vacancy so that localized states resulted from oxygen defects are reduced. For example, the localized states resulted from the oxygen defects can be reduced in the following manner: an oxide film having excess oxygen is formed in a close contact with a channel formation region; and heat treatment at 200° C. to 400° C., typically, approximately 250° C., is performed so that oxygen is supplied to the oxide semiconductor from the oxide film. An inert gas may be switched to a gas containing oxygen during second heat treatment described later. Further, after the second heat treatment, oxygen can be supplied to the oxide semiconductor through a temperature decreasing process in an oxygen atmosphere or an atmosphere from which hydrogen, water, or the like has been sufficiently reduced.

A factor that deteriorates characteristics of an oxide semiconductor is thought to be a shallow level due to excess hydrogen at 0.1 eV to 0.2 eV below the conduction band, a deep level due to oxygen vacancy, or the like. Therefore, the technical idea that hydrogen is reduced as much as possible and oxygen is adequately supplied in order to eliminate such a defect would be right.

An oxide semiconductor is generally considered as an n-type semiconductor; however, according to one embodiment of the disclosed invention, an i-type oxide semiconductor is realized by removing impurities such as water or hydrogen and supplying oxygen which is a constituent element of the oxide semiconductor. In this respect, it can be said that one embodiment of the invention disclosed herein includes a novel technical idea because the oxide semiconductor according to one embodiment of the invention is made to be i-type in a manner different from that of silicon or the like which is made to be i-type by addition of impurities.

Further, an oxide semiconductor is made to be i-type, so that a transistor has favorable temperature characteristics; typically, as for the current-voltage characteristics of the transistor, in the temperature range of –25° C. to 150° C., there are few variations in on-state current, off-state current, field effect mobility, S value, and threshold voltage and there is little deterioration of the current-voltage characteristics due to temperature.

The technical idea of this embodiment is that impurities are not further added to an oxide semiconductor and, on the contrary, the oxide semiconductor itself is purified by removing impurities such as water and hydrogen which undesirably exist therein. In other words, an oxide semiconductor is purified by intentionally removing water or hydrogen which forms a donor level to further reduce oxygen vacancy and adequately supplying oxygen which is a main component of the oxide semiconductor.

The concentration of hydrogen in an as-deposited oxide semiconductor is measured by secondary ion mass spectrometry (SIMS) to be on the order of $10^{20}/cm^3$. The oxide semiconductor is made to have higher purity to be electrically i-type (intrinsic) semiconductor by intentionally removing water or hydrogen which causes a donor level and further adding oxygen (one of components of the oxide semiconductor) which is reduced at the same time as the removal of water or hydrogen.

In this embodiment, the amount of water and hydrogen in an oxide semiconductor is preferably smaller and the amount of carriers is also preferably smaller. In other words, the carrier concentration is preferably lower than $1 \times 10^{12}/cm^3$, more preferably lower than $1.45 \times 10^{10}/cm^3$. Furthermore, the ideal carrier concentration is close to zero or zero according to the technical idea of this embodiment. In particular, the oxide semiconductor can be purified by removing water or hydrogen which serves as an n-type impurity by heat treatment at a temperature higher than or equal to 450° C. and lower than or equal to 850° C., preferably higher than or equal to 550° C. and lower than or equal to 750° C. in an oxygen atmosphere, a nitrogen atmosphere, or an ultra-dry (air containing water at 20 ppm or less, preferably 1 ppm or less, more preferably 10 ppb or less) atmosphere. The oxide semiconductor is purified by removing impurities such as water or hydrogen, whereby the carrier concentration can be lower than $1 \times 10^{12}/cm^3$, preferably lower than $1.45 \times 10^{10}/cm^3$. The carriers in the oxide semiconductor are reduced or preferably eliminated, so that the oxide semiconductor functions as a path in a transistor through which carriers pass.

As described above, the oxide semiconductor is purified so that impurities that are not main components of the oxide semiconductor film, typically hydrogen, water, hydroxyl, or hydride, are contained as little as possible, whereby favorable operation of the transistor can be obtained. In addition, the amount of change in threshold voltage of the transistor before and after the BT test can be suppressed, whereby high reliability can be realized. Moreover, the temperature dependence of the electric characteristics can be suppressed.

<Comparison with Another Semiconductor Material>

Silicon carbide (e.g., 4H—SiC) is given as an example of a semiconductor material which can be compared with an oxide semiconductor. An oxide semiconductor and 4H—SiC have some things in common. The carrier concentration is one example thereof. In accordance with Fermi-Dirac distribution at normal temperature, the concentration of minority carriers in an oxide semiconductor is estimated to be approximately $10^{-7}/cm^3$, which is extremely low like the carrier concentration in 4H—SiC, that is, $6.7 \times 10^{-11}/cm^3$. When the minority carrier concentration in the oxide semiconductor is compared with the intrinsic carrier concentration in silicon (approximately $1.45 \times 10^{10}/cm^3$), it can be well understood that the minority carrier concentration in the oxide semiconductor is significantly low.

In addition, the energy band gap of the oxide semiconductor is 3.0 eV to 3.5 eV and that of 4H—SiC is 3.26 eV, which means that both the oxide semiconductor and silicon carbide are common in that both are wide-gap semiconductors.

On the other hand, there is a major difference between the oxide semiconductor and silicon carbide. That is the process temperature. Since silicon carbide generally needs to be subjected to heat treatment at 1500° C. to 2000° C., it is difficult to form a stack of silicon carbide and a semiconductor element formed using a semiconductor material which is not silicon carbide. This is because a semiconductor substrate, a semiconductor element, and the like are damaged by such high temperature. In contrast, the oxide semiconductor can be formed by heat treatment at 300° C. to 800° C.; therefore, it is possible to form an integrated circuit with the use of a semiconductor material which is not an oxide semiconductor and then to form a semiconductor element with the use of an oxide semiconductor.

In contrast to the case of using silicon carbide, in the case of using an oxide semiconductor, there is an advantage that a low heat-resistant substrate such as a glass substrate can be used. In addition, in the case of using an oxide semiconductor, heat treatment at high temperature is not needed, so that the energy cost can be sufficiently reduced as compared to the case of using silicon carbide. In silicon carbide, a crystal defect or a small amount of impurities involuntarily mixed causes carriers. Therefore, it is actually difficult to obtain a carrier concentration of lower than or equal to $10^{12}/cm^3$ for the reason given above though, in theory, it is possible to obtain a low carrier concentration in silicon carbide which is equal to that of the oxide semiconductor of one embodiment of the present invention. The same can be said for the comparison between the oxide semiconductor and gallium nitride that is also known as a wide-gap semiconductor.

<Electrical Conduction Mechanism of Transistor Including Oxide Semiconductor>

Here, the electrical conduction mechanism of a transistor including an oxide semiconductor is described with reference to FIG. 7, FIG. 8, FIGS. 9A and 9B, and FIG. 10. Note that the following description is based on the assumption of an ideal situation for easy understanding and does not necessarily reflect a real situation. Note also that the following description is just a consideration and is irrelevant to the validity of the present invention.

Figure 7:
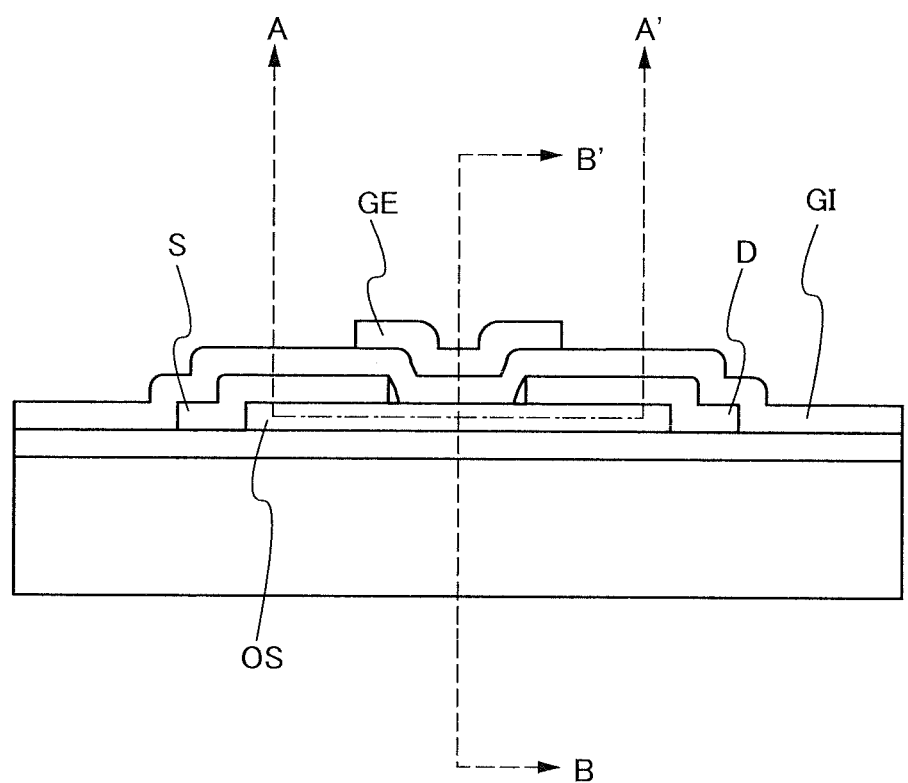
FIG. 7 is a cross-sectional view of a top-gate transistor including an oxide semiconductor.

FIG. 7 is a cross-sectional view of an inverted staggered transistor (thin film transistor) including an oxide semiconductor. A source electrode layer (S) and a drain electrode layer (D) are provided over an oxide semiconductor layer (OS), and a gate electrode layer (GE) is provided over the oxide semiconductor layer (OS), the source electrode layer (S), and the drain electrode layer (D) with a gate insulating layer (GI) therebetween.

Figure 8:
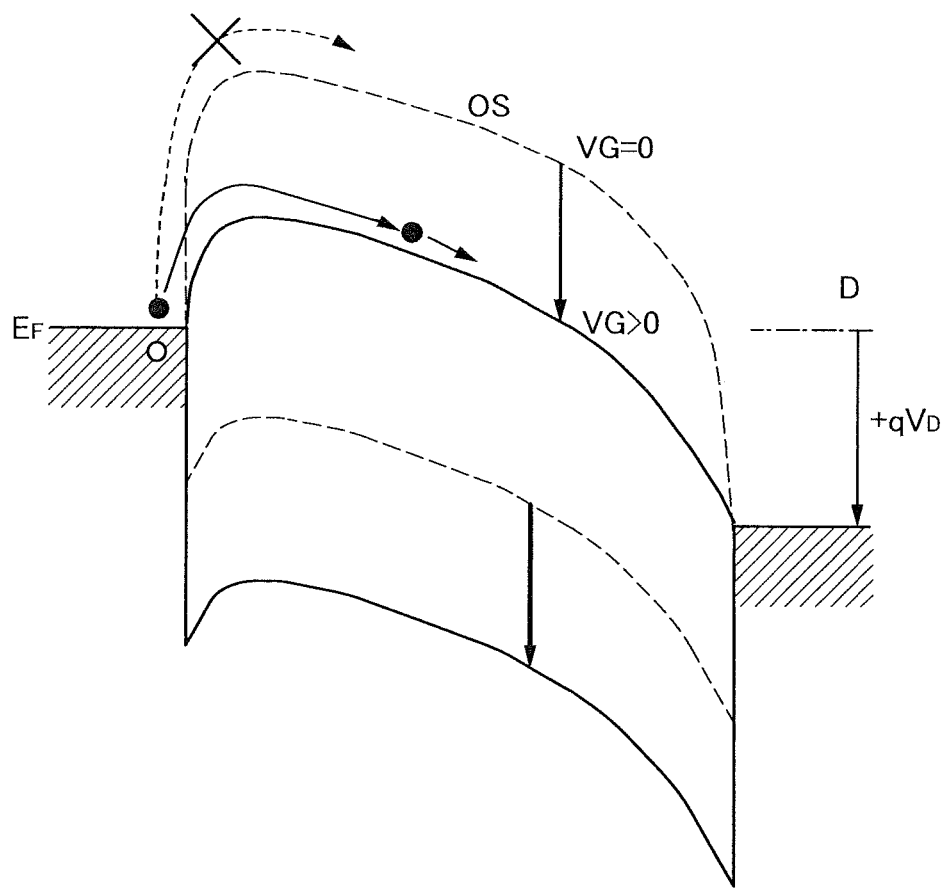
FIG. 8 is an energy band diagram (schematic diagram) illustrating a cross section taken along a line A-A' in FIG. 7.

FIG. 8 is an energy band diagram (schematic diagram) of layers of the transistor in cross section taken along a line A-A' in FIG. 7. In FIG. 8, a black circle (●) and a white circle (○) represent an electron and a hole and have electric charges (−q, +q), respectively. The dashed line shows the case where no voltage is applied to the gate electrode ($V_G=0$) with positive voltage ($V_D>0$) applied to the drain electrode and the solid line shows the case where positive voltage is applied to the gate electrode ($V_G>0$) with positive voltage ($V_D>0$) applied to the drain electrode. In the case where no voltage is applied to the gate electrode, carriers (electrons) are not injected to the oxide semiconductor side from an electrode because of high potential barrier, so that current does not flow, which means an off state. On the other hand, when positive voltage is applied to the gate electrode, potential barrier is lowered, so that current flows, which means an on state.

Figure 9A:
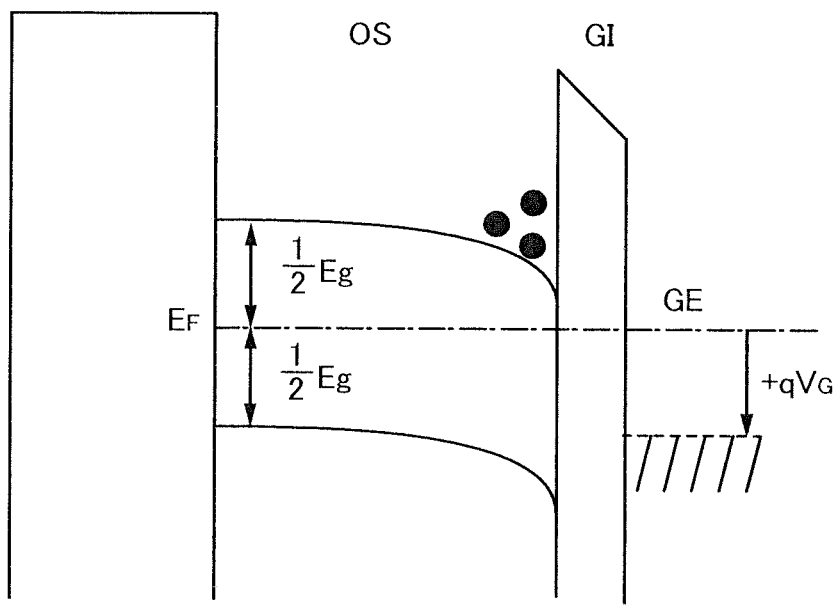
FIGS. 9A and 9B are energy band diagrams taken along a line B-B' in FIG. 7.
Figure 9B:
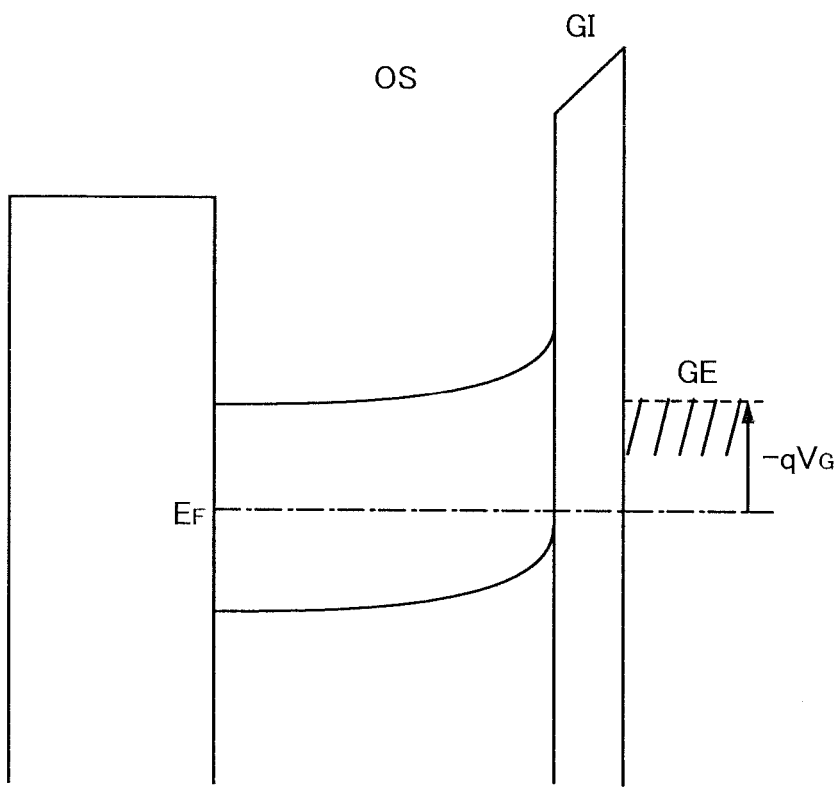

FIGS. 9A and 9B are energy band diagrams (schematic diagrams) taken along a line B-B' in FIG. 7. FIG. 9A shows a state where positive potential ($V_G>0$) is applied to the gate electrode layer (GE), that is, an on state where carriers (electrons) flow between the source and the drain. FIG. 9B shows a state where negative potential ($V_G<0$) is applied to the gate electrode layer (GE), that is, an off state (minority carriers do not flow).

Figure 10:
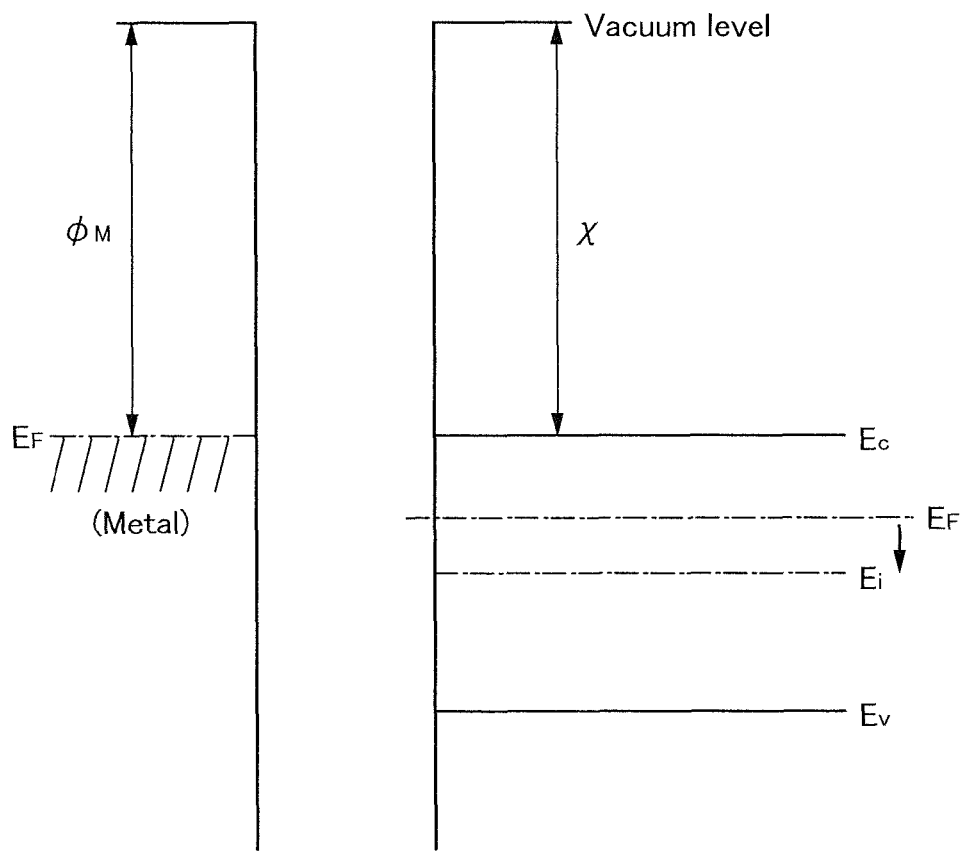
FIG. 10 shows the relation between the vacuum level and the work function ($\phi_M$) of metal and the relation between the vacuum level and the electron affinity ($\chi$) of an oxide semiconductor.

FIG. 10 shows the relation between the vacuum level and the work function ($\phi_M$) of metal and the relation between the vacuum level and the electron affinity ($\chi$) of an oxide semiconductor.

At normal temperature, electrons in the metal are degenerated and the Fermi level is located in the conduction band. In contrast, a conventional oxide semiconductor is generally an n-type semiconductor, and the Fermi level ($E_F$) is away from the intrinsic Fermi level (Ei) located in the middle of the band gap and is located closer to the conduction band. Note that it is known that some hydrogen in the oxide semiconductor serves as a donor and is one of the factors that cause the oxide semiconductor to be an n-type semiconductor.

In contrast, the oxide semiconductor according to one embodiment of the disclosed invention is an oxide semiconductor that is made to be intrinsic (i-type) or substantially intrinsic by being purified by removal of hydrogen in the oxide semiconductor, which causes an n-type oxide semiconductor, so that impurities that are not main components of the oxide semiconductor are prevented from being contained therein as much as possible. In other words, the oxide semiconductor according to one embodiment of the present invention has a feature in that it is made to be an i-type (intrinsic) semiconductor or made to be close thereto not by addition of impurities but by being purified by removal of impurities such as hydrogen or water as much as possible. This enables the Fermi level ($E_F$) to be at substantially the same level as the intrinsic Fermi level (Ei).

It is said that the electron affinity ($\chi$) of an oxide semiconductor is 4.3 eV in the case where the band gap ($E_g$) thereof is 3.15 eV. The work function of titanium (Ti) used for forming the source electrode layer and the drain electrode layer is substantially equal to the electron affinity ($\chi$) of the oxide semiconductor. In that case, the Schottky electron barrier is not formed at an interface between the metal and the oxide semiconductor.

At this time, as shown in FIG. 9A, the electrons move in the vicinity of the interface between the gate insulating layer and the purified oxide semiconductor (the energetically stable lowest part of the oxide semiconductor).

As shown in FIG. 9B, when negative potential is applied to the gate electrode layer (GE), the number of holes that are minority carriers is substantially zero; thus, the value of current is extremely close to zero.

As described above, the oxide semiconductor is made to be intrinsic (i-type) or substantially intrinsic by being purified so that elements that are not main components thereof (i.e., impurity elements) are contained as little as possible. Thus, the characteristics of the interface between the oxide semiconductor and the gate insulating layer become obvious. For that reason, the gate insulating layer needs to form a favorable interface with the oxide semiconductor. Specifically, it is preferable to use the following insulating layer, for example: an insulating layer formed by a CVD method using high-density plasma generated with a power supply frequency in the range of the VHF band to the microwave band or an insulating layer formed by a sputtering method.

The interface between the oxide semiconductor and the gate insulating layer is made favorable while the oxide semiconductor is purified, whereby an off-state current of less than or equal to $1 \times 10^{-13}$ A and a subthreshold swing (S value) of 0.1 V/dec. (the thickness of the gate insulating layer: 100 nm) can be realized at normal temperature in the case where a transistor has, for example, a channel width W of $1 \times 10^4$ μm and a channel length L of 3μμ.

The oxide semiconductor is purified as described above so as to contain elements that are not main components of the oxide semiconductor (i.e., impurity elements) as little as possible, whereby favorable operation of the transistor can be obtained.

<Resistance of Transistor Including Oxide Semiconductor to Hot Carrier Degradation>

Next, the resistance of a transistor including an oxide semiconductor to hot carrier degradation will be described with reference to FIG. 11, FIG. 12, and FIG. 13. Note that the following description is based on the assumption of an ideal situation for easy understanding and does not necessarily reflect a real situation. Note also that the following description is just a consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons having gained energy higher than the barrier of a gate insulating layer in a semiconductor layer are injected into the gate insulating layer or the like. Electrons gain energy by being accelerated by a low electric field.

DAHC injection refers to a phenomenon in which electrons generated by collision of electrons accelerated by a high electric field are injected into a gate insulating layer or the like. A difference between DAHC injection and CHE injection is whether or not they involve avalanche breakdown caused by impact ionization. Note that DAHC injection requires electrons having a kinetic energy higher than the band gap of a semiconductor.

Figure 11:
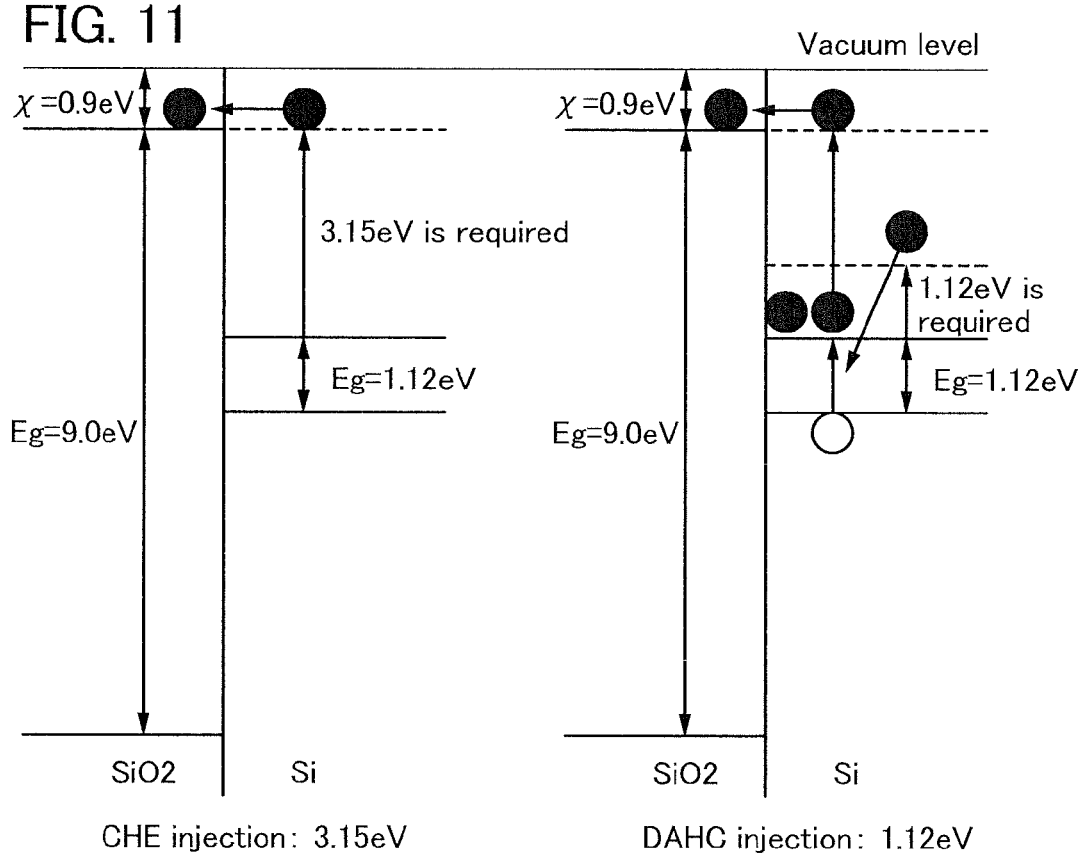
FIG. 11 is a diagram illustrating energy required for hot carrier injection in silicon (Si).
Figure 12:
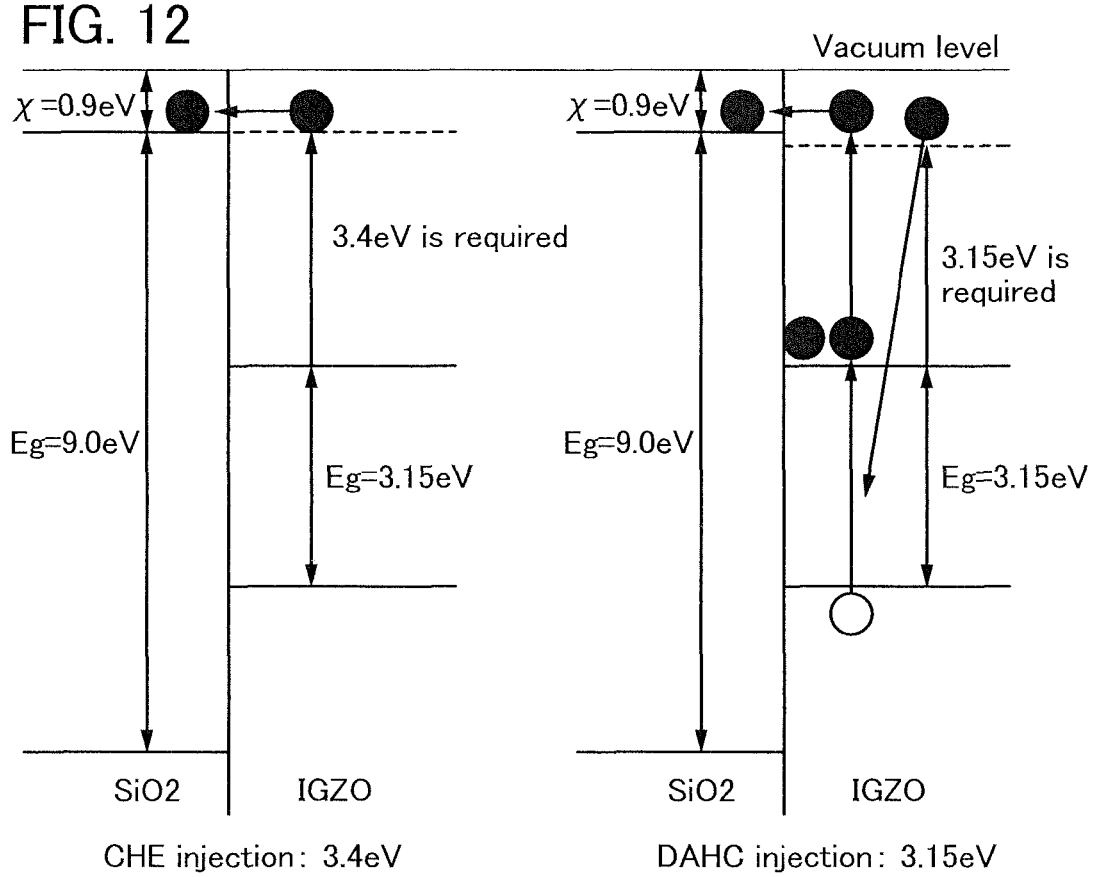
FIG. 12 is a diagram illustrating energy required for hot carrier injection in an In—Ga—Zn—O-based oxide semiconductor (IGZO).
Figure 13:
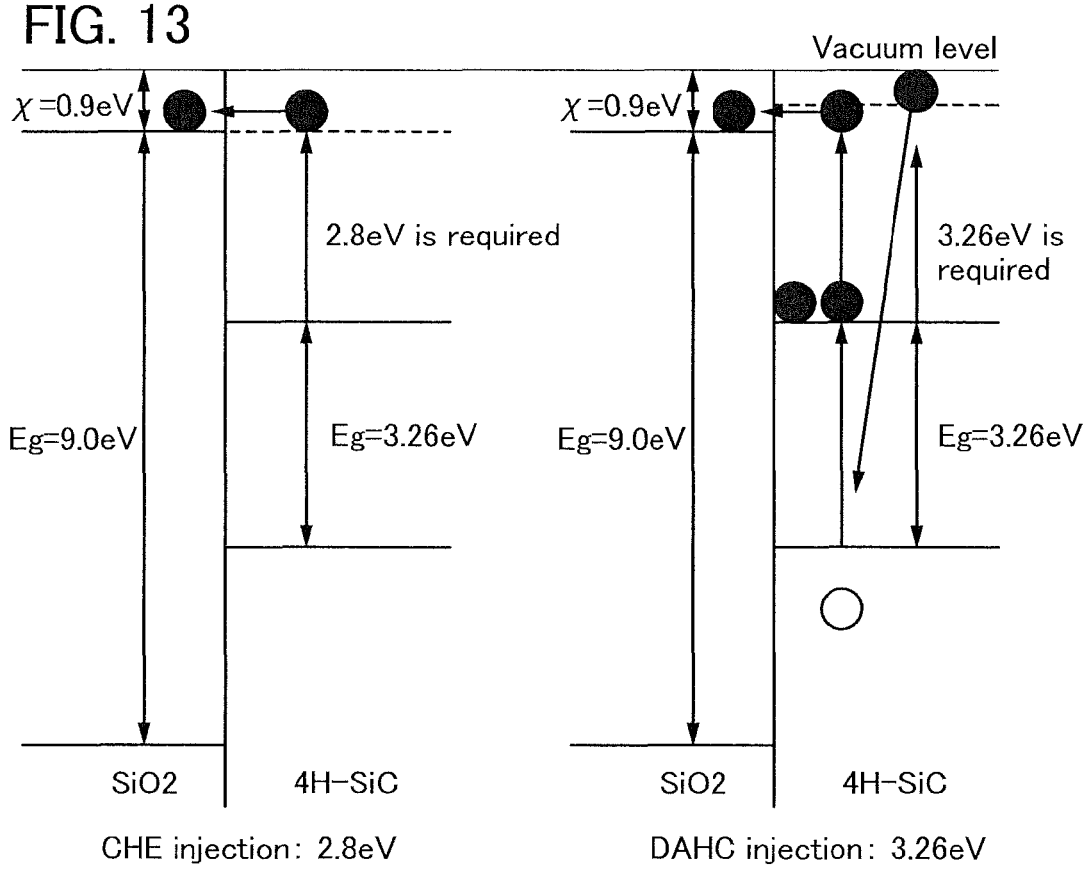
FIG. 13 is a diagram illustrating energy required for hot carrier injection in silicon carbide (4H—SiC).

FIG. 11 shows energy required for each hot carrier injection which is estimated from the band structure of silicon (Si) and FIG. 12 shows energy required for each hot carrier injection which is estimated from the band structure of an In—Ga—Zn—O-based oxide semiconductor (IGZO). In each of FIG. 11 and FIG. 12, CHE injection is shown in the left side and DAHC injection is shown in the right side.

Regarding silicon, degradation caused by DAHC injection is more serious than that caused by CHE injection. This results from the fact that carriers (e.g., electrons) which are accelerated without colliding are very few in silicon whereas silicon has a narrow band gap and avalanche breakdown readily occurs therein. The avalanche breakdown increases the number of electrons capable of travelling over the barrier of the gate insulating layer, and the probability of hot electrons in that case is higher than that of hot electrons in the case where the avalanche breakdown does not occur.

Regarding an In—Ga—Zn—O-based oxide semiconductor, the energy required for CHE injection does not greatly differ from that in the case of silicon, and the probability of CHE injection is still low similarly to silicon. However, because of the wide band gap, the energy required for DAHC injection is substantially equal to the energy required for CHE injection and higher than that in the case of silicon; thus, DAHC injection is less likely to occur in the first place.

In other words, the probabilities of both CHE injection and DAHC injection are low and the resistance to hot carrier degradation is higher than that of silicon.

The band gap of an In—Ga—Zn—O-based oxide semiconductor is comparable to that of silicon carbide (SiC) which attracts attention as a material having high withstand voltage. FIG. 13 shows energy required for each hot carrier injection regarding 4H—SiC. Regarding CHE injection, an In—Ga—Zn—O-based oxide semiconductor has a slightly higher threshold and can be said to have an advantage.

As described above, it can be seen that an In—Ga—Zn—O-based oxide semiconductor has significantly higher resistance to hot carrier degradation and higher resistance to source-drain breakdown than silicon. It can also be said that withstand voltage comparable to that of silicon carbide can be obtained.

<Short-Channel Effect in Transistor Including Oxide Semiconductor>

Next, a short-channel effect in a transistor including an oxide semiconductor will be described with reference to FIG. 14 and FIG. 15. Note that the following description is based on the assumption of an ideal situation for easy understanding and does not necessarily reflect a real situation. Note also that the following description is just a consideration.

The short-channel effect refers to degradation of electrical characteristics which become obvious with miniaturization of a transistor (a reduction in channel length (L)). The short-channel effect results from the influence of electric field distribution in the vicinity of a drain on a source. Specific examples of the short-channel effect are a decrease in threshold voltage, an increase in subthreshold swing (S value), an increase in leakage current, and the like.

Here, a structure with which a short-channel effect can be suppressed was examined using calculation results (by device simulation). Specifically, four kinds of models each having a different carrier concentration and a different thickness of an oxide semiconductor layer were prepared, and the relation between a channel length (L) and threshold voltage ($V_{th}$) was examined. As the models, bottom-gate transistors were employed, each of which had a carrier concentration of $1.7 \times 10^{-8}/cm^3$ or $1.0 \times 10^{15}/cm^3$ and an oxide semiconductor layer with a thickness of 1 μm or 30 nm. Note that an In—Ga—Zn—O-based oxide semiconductor was used as the oxide semiconductor, and a silicon oxynitride film with a thickness of 100 nm was used as a gate insulating layer. The band gap, electron affinity, relative permittivity, and electron mobility of the oxide semiconductor were assumed to be 3.15 eV, 4.3 eV, 15, and 10 cm$^2$/Vs, respectively. The relative permittivity of the silicon oxynitride film was assumed to be 4.0. The calculation was performed using device simulation software "ATLAS" produced by SILVACO, Inc.

Note that there is no significant difference in calculation results between a top-gate transistor and a bottom-gate transistor.

Figure 14:
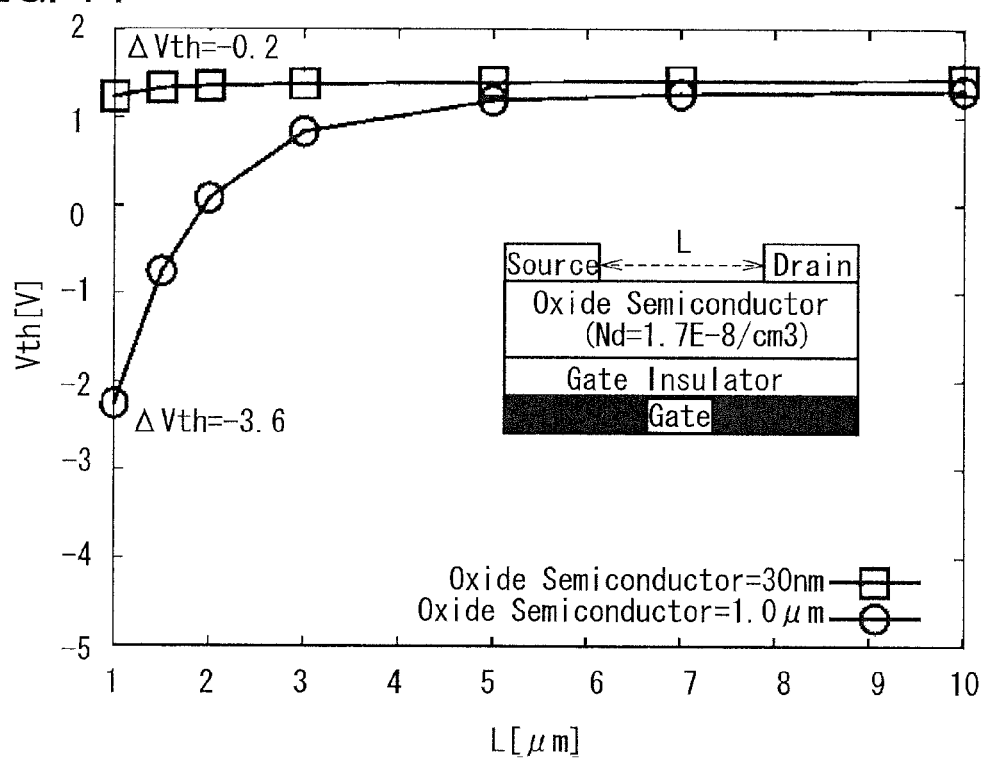
FIG. 14 shows the results of calculation (device simulation) on a short-channel effect.
Figure 15:
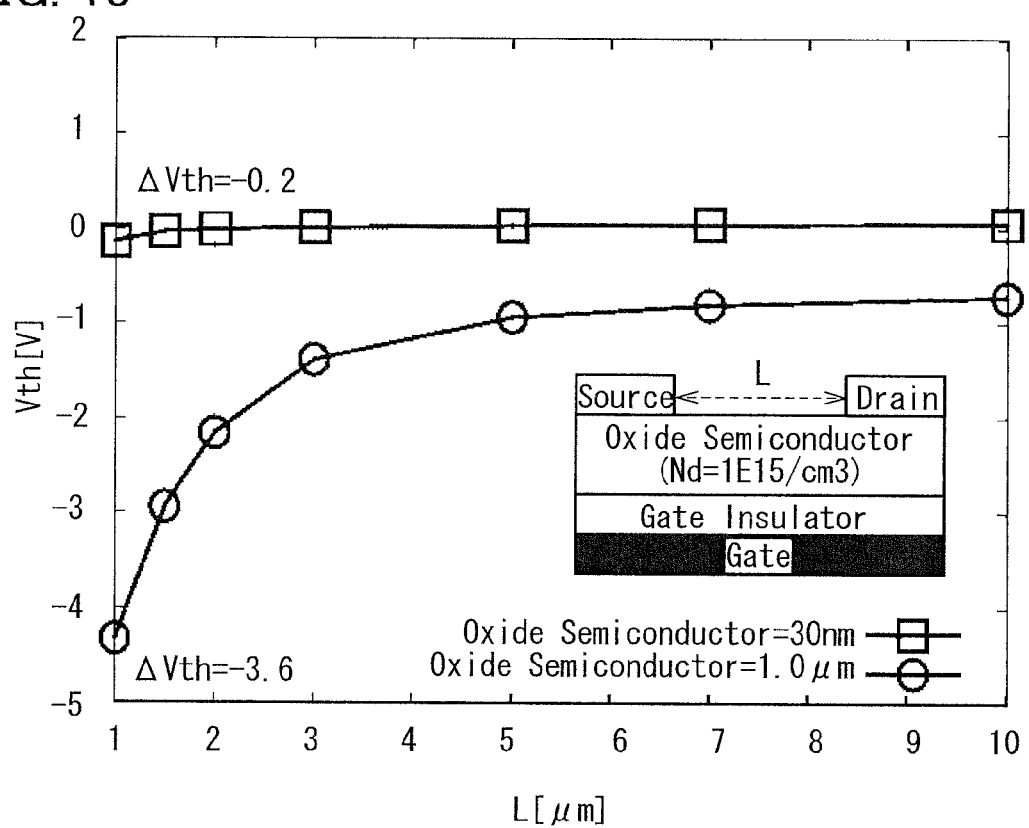
FIG. 15 shows the results of calculation (device simulation) on a short-channel effect.

FIG. 14 and FIG. 15 each show the calculation result. FIG. 14 shows the case where the carrier concentration is $1.7 \times 10^{-8}/cm^3$. FIG. 15 shows the case where the carrier concentration is $1.0 \times 10^{15}/cm^3$. FIG. 14 and FIG. 15 each show the amount of change ($\Delta V_{th}$) in threshold voltage ($V_{th}$) at the time when a transistor whose channel length (L) is 10 μm is used as a reference and the channel length (L) is changed from 10 μm to 1 μm. As shown in FIG. 14, in the case where the carrier concentration in the oxide semiconductor was $1.7 \times 10^{-8}/cm^3$ and the thickness of the oxide semiconductor layer was 1 μm, the amount of change ($\Delta V_{th}$) in threshold voltage was −3.6 V (i.e., $\Delta V_{th}$=−3.6 V). In addition, as shown in FIG. 14, in the case where the carrier concentration in the oxide semiconductor was $1.7 \times 10^{-8}/cm^3$ and the thickness of the oxide semiconductor layer was 30 nm, the amount of change ($\Delta V_{th}$) in threshold voltage was −0.2 V (i.e., $\Delta V_{th}$=−0.2 V). Moreover, as shown in FIG. 15, in the case where the carrier concentration in the oxide semiconductor was $1.0 \times 10^{15}/cm^3$ and the thickness of the oxide semiconductor layer was 1 μm, the amount of change ($\Delta V_{th}$) in threshold voltage was −3.6 V (i.e., $\Delta V_{th}$=−3.6 V). In addition, as shown in FIG. 15, in the case where the carrier concentration in the oxide semiconductor was $1.0 \times 10^{15}/cm^3$ and the thickness of the oxide semiconductor layer was 30 nm, the amount of change ($\Delta V_{th}$) in threshold voltage was −0.2 V (i.e., $\Delta V_{th}$=−0.2 V). The results show that a short-channel effect can be suppressed in a transistor including an oxide semiconductor by reducing the thickness of an oxide semiconductor layer. For example, it can be understood that in the case where the channel length (L) is approximately 1 μm, a short-channel effect can be sufficiently suppressed when the thickness of an oxide semiconductor having sufficiently low carrier concentration is approximately 30 nm.

<Carrier Concentration>

The technical idea according to the disclosed invention is making an oxide semiconductor layer as close as possible to an intrinsic (i-type) semiconductor layer by sufficiently reducing the carrier concentration therein. A method for calculating the carrier concentration and the actually measured carrier concentration will be described below with reference to FIG. 16 and FIG. 17.

First, a method for calculating the carrier concentration is briefly explained. The carrier concentration can be calculated in such a manner that a MOS capacitor is manufactured and the results of C-V measurement (capacitance voltage measurement) (i.e., C-V characteristics) of the MOS capacitor are evaluated.

Specifically, carrier concentration $N_d$ is calculated in the following manner: C-V characteristics are obtained by plotting relations between a gate voltage ($V_g$) and a capacitance (C) of an MOS capacitor; a graph of a relation between the gate voltage $V_g$ and $(1/C)^2$ is obtained with the use of the C-V characteristics; a differential value of $(1/C)^2$ in a weak inversion region of the graph is calculated; and the differential value is substituted into Formula I. Note that q, $\in_0$, and $\in$ in Formula I represent elementary electric charge, vacuum permittivity, and relative permittivity of an oxide semiconductor, respectively.

[Formula 1]

$$N_d = -\left(\frac{2}{q\varepsilon_0\varepsilon}\right) / \frac{d(1/C)^2}{dV} \quad (1)$$

Next, the carrier concentration actually measured by the above method will be described. For the measurement, a sample (an MOS capacitor) which was formed as follows was used: a titanium film was formed to a thickness of 300 nm over a glass substrate; a titanium nitride film was formed to a thickness of 100 nm over the titanium film; an oxide semiconductor layer using an In—Ga—Zn—O-based oxide semiconductor was formed to a thickness of 2 μm over the titanium nitride film; and a silver film was formed to a thickness of 300 nm over the oxide semiconductor layer. Note that the oxide semiconductor layer was formed using an oxide semiconductor target for film formation containing In, Ga, and Zn (e.g., a target having a composition ratio of $In_2O_3:Ga_2O_3:ZnO=1:1:1$ (molar ratio), a composition ratio of $In_2O_3:Ga_2O_3:ZnO=1:1:2$ (molar ratio), or $In_2O_3:Ga_2O_3:ZnO=1:1:4$ (molar ratio)) or the like by a sputtering method. Further, the oxide semiconductor layer was formed in a mixed atmosphere of argon and oxygen (the flow rates of Ar and $O_2$ were 30 sccm and 15 sccm, respectively).

Figure 16:
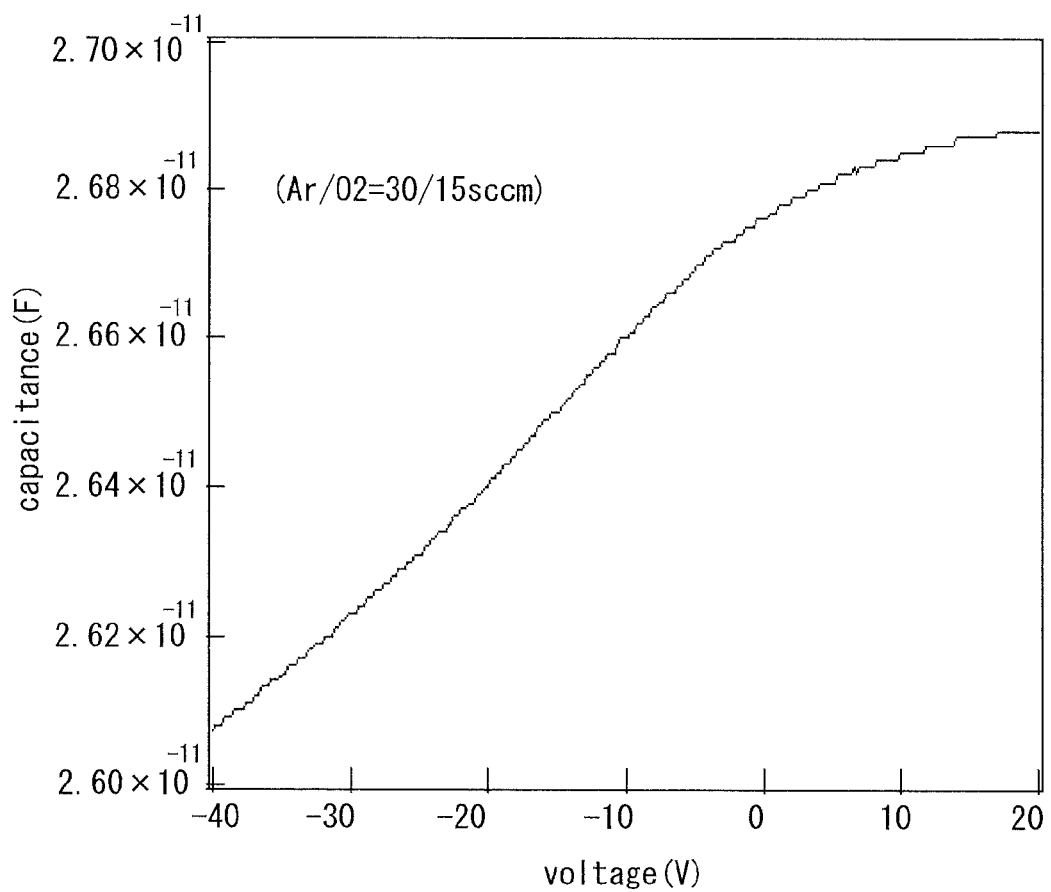
FIG. 16 shows C-V characteristics.
Figure 17:
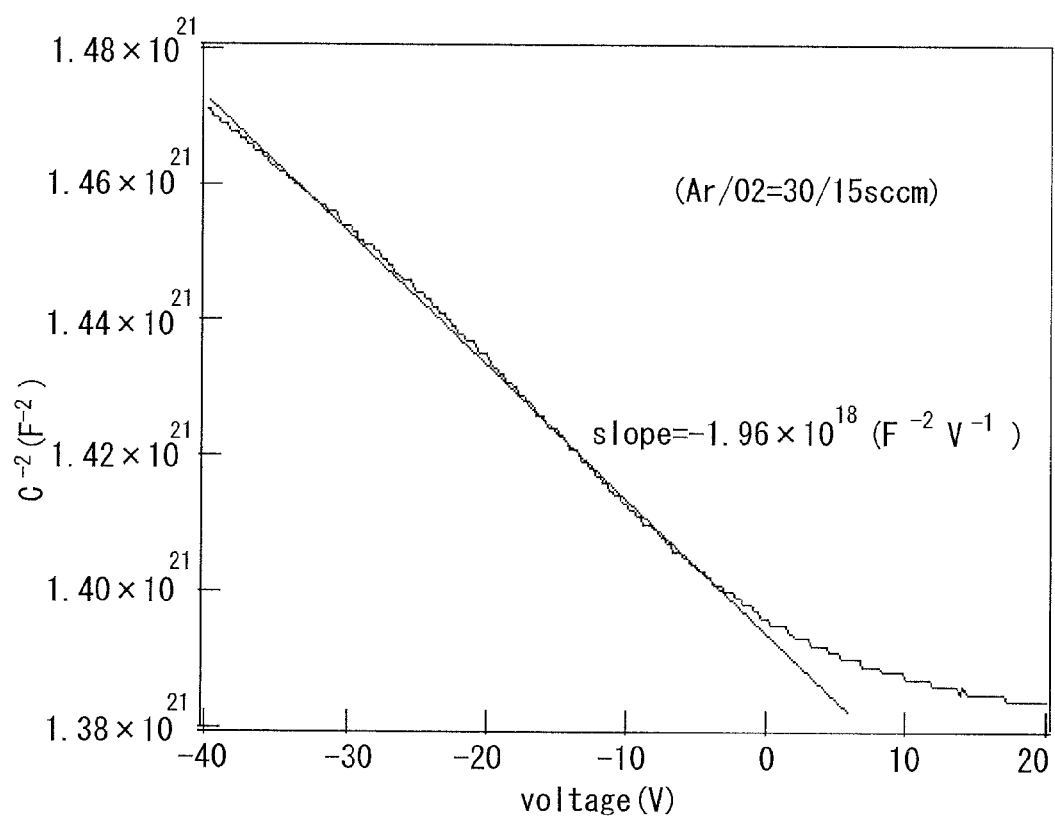
FIG. 17 shows the relation between $V_g$ and $(1/C)^2$.

FIG. 16 shows the C-V characteristics. FIG. 17 shows the relation between $V_g$ and $(1/C)^2$. The carrier concentration calculated using Formula I from the differential value of $(1/C)^2$ in a weak inversion region of the graph of FIG. 17 was $6.0×10^{10}/cm^3$.

In this manner, by using an i-type or substantially i-type oxide semiconductor having a large energy gap (e.g., with a carrier concentration of lower than $1×10^{12}/cm^3$, preferably lower than $1.45×10^{10}/cm^3$), a normally-off transistor with excellent off-state current characteristics can be obtained.

Accordingly, the semiconductor element of one embodiment of the present invention is a semiconductor which is made to be intrinsic or substantially intrinsic by removal of impurities which serve as electron donors (donors) in an oxide semiconductor, and a channel region is preferably formed using an oxide semiconductor which has a larger energy gap than a silicon semiconductor. A semiconductor element including an oxide semiconductor which has a large energy gap and in which the hydrogen concentration is sufficiently reduced and the purity is increased is manufactured, whereby a normally-off semiconductor device in which off-state current is small and the temperature dependence of transistor characteristics is small can be realized. In addition, the use of the semiconductor element makes it possible to realize a semiconductor device whose power consumption due to leakage current is small.

According to the semiconductor element of one embodiment of the present invention, a top-gate semiconductor element including an oxide semiconductor, which has a short channel length L and can be miniaturized can be realized by providing sidewalls for a source electrode layer and a drain electrode layer.

Further, the semiconductor element of one embodiment of the present invention has a short channel length L and can be miniaturized; thus, when the semiconductor element is used in a semiconductor integrated circuit such as an LSI, a CPU, or a memory, the operation speed of the circuit is increased, and furthermore, power consumption can be reduced.

Further, in the semiconductor element of one embodiment of the present invention, sidewalls are provided on side surfaces of a source electrode layer and a drain electrode layer, which give tapered shapes to the source electrode layer and the drain electrode layer; thus, the coverage with a gate insulating layer can be increased and a short circuit between a gate electrode layer and the source electrode layer or the drain electrode layer can be prevented. As a result, a highly reliable semiconductor element and a highly reliable semiconductor device including the semiconductor element can be realized.

This embodiment can be freely combined with any of the other embodiments.

(Embodiment 2)

In this embodiment, an example of a method for manufacturing a semiconductor element will be described. One embodiment of a method for manufacturing a semiconductor element of this embodiment will be described with reference to FIGS. 2A to 2D.

A process of manufacturing the transistors 200 and 201, which are described in Embodiment 1, over the substrate 101 having an insulating surface will be described below.

Although there is no particular limitation on a substrate which can be used as the substrate 101 having an insulating surface, the substrate needs to have heat resistance high enough to withstand at least heat treatment performed later. For example, a glass substrate made of aluminosilicate glass, barium borosilicate glass, aluminoborosilicate glass, or the like can be used.

Note that a substrate formed of an insulator such as a ceramic substrate, a quartz substrate, or a sapphire substrate may be used instead of the glass substrate. Alternatively, a crystallized glass substrate or the like may be used. Alternatively, a semiconductor substrate including an insulating layer on its surface, a plastic substrate, or the like can be used as appropriate.

First, the first insulating layer 103 is formed over the substrate 101 having an insulating surface. The first insulating layer 103 can be formed to have a single-layer or stacked-layer structure using a silicon oxide layer, a silicon nitride layer, a silicon oxynitride layer, or a silicon nitride oxide layer by a plasma CVD method, a sputtering method, or the like.

In the case where the transistor 201 described in Embodiment 1 is manufactured, after a conductive film is formed over the substrate 101 having an insulating surface, the electrode layer 102 is formed in a photolithography step, and then the first insulating layer 103 for covering the electrode layer 102 is formed. The electrode layer 102 can be formed using an element selected from Al, Cr, Cu, Ta, Ti, Mo, and W, an alloy containing any of these elements, an alloy containing any of these elements in combination, or the like. In this embodiment, the electrode layer 102 has a structure in which a tungsten nitride layer and a tungsten layer are stacked.

Next, the second insulating layer 105 is formed over the first insulating layer 103. As the second insulating layer 105 which is in contact with an oxide semiconductor layer, an oxide insulating layer such as a silicon oxide layer, a silicon oxynitride layer, an aluminum oxide layer, or an aluminum oxynitride layer is preferably used. As a method for forming the second insulating layer 105, a plasma CVD method, a sputtering method, or the like can be used; however, it is preferable that the second insulating layer 105 be formed by a sputtering method in order to prevent a large amount of hydrogen from being contained in the second insulating layer 105.

In this embodiment, as the second insulating layer 105, a silicon oxide layer is formed by a sputtering method. The substrate 101 is transferred to a treatment chamber, a sputtering gas which contains high-purity oxygen and from which hydrogen and moisture have been removed is introduced thereinto, and a silicon oxide layer is formed as the second insulating layer 105 over the substrate 101 with the use of a silicon target. The substrate 101 may be at room temperature or may be heated.

For example, the silicon oxide layer is formed by an RF sputtering method under the following conditions: quartz (preferably synthetic quartz) is used, the substrate temperature is 108° C., the distance between the substrate and the target (the T-S distance) is 60 mm, the pressure is 0.4 Pa, the high-frequency electric power is 1.5 kW, the atmosphere is an atmosphere containing oxygen and argon (the flow ratio of oxygen to argon is 1:1 (each flow rate is 25 sccm)). The thickness of the silicon oxide layer is 100 nm. Instead of quartz (preferably synthetic quartz), a silicon target can be used as a target for forming the silicon oxide layer. As a sputtering gas, oxygen or a mixed gas of oxygen and argon is used.

In this case, it is preferable that the second insulating layer 105 be formed while moisture remaining in the treatment chamber is removed so that hydrogen, hydroxyl, or moisture is prevented from being contained in the second insulating layer 105.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with a cryopump, for example, a hydrogen atom, a compound containing a hydrogen atom such as water ($H_2O$), and the like are removed; thus, the concentration of impurities in the second insulating layer 105 formed in the treatment chamber can be reduced.

The second insulating layer 105 may have a stacked-layer structure. For example, the second insulating layer 105 may have a structure in which a nitride insulating layer such as a silicon nitride layer, a silicon nitride oxide layer, or an aluminum nitride layer and the above oxide insulating layer are stacked in this order over the substrate 101.

For example, a silicon nitride layer is formed between the silicon oxide layer and the substrate by introducing a sputtering gas which contains high-purity nitrogen and from which hydrogen and moisture have been removed and using a silicon target. In this case also, it is preferable that the silicon nitride layer be formed while moisture remaining in the treatment chamber is removed in a manner similar to that of the silicon oxide layer.

The substrate may be heated also at the time of the formation of the silicon nitride layer.

In the case where the silicon nitride layer and the silicon oxide layer are stacked to form the second insulating layer 105, the silicon nitride layer and the silicon oxide layer can be formed in the same treatment chamber using the same silicon target. First, a sputtering gas containing nitrogen is introduced and a silicon nitride layer is formed using a silicon target placed inside the treatment chamber, and then the sputtering gas is switched to a sputtering gas containing oxygen and a silicon oxide layer is formed using the same silicon target. Since the silicon nitride layer and the silicon oxide layer can be formed in succession without being exposed to air, impurities such as hydrogen or moisture can be prevented from being adsorbed on a surface of the silicon nitride layer.

Next, an oxide semiconductor film is formed to a thickness of greater than or equal to 3 nm and less than or equal to 50 nm over the second insulating layer 105. It is particularly preferable to form an oxide semiconductor film with a thickness of greater than or equal to 3 nm and less than or equal to 20 nm in order to sufficiently suppress a short-channel effect.

The oxide semiconductor film is formed using an oxide semiconductor which has a large energy gap and is purified by sufficiently removing impurities such as hydrogen which serve as electron donors (donors) in the oxide semiconductor.

The carrier concentration can be measured by Hall effect measurement. The carrier concentration in the oxide semiconductor which is measured by Hall effect measurement is equivalent to $1.45 \times 10^{10}/cm^3$, which is the intrinsic carrier concentration in silicon, or lower. In accordance with Fermi-Dirac distribution at normal temperature, the intrinsic carrier concentration in an oxide semiconductor which has an energy gap of 3 eV or more is $10^{-7}/cm^3$ while the intrinsic carrier concentration in silicon is $10^{10}/cm^3$. In other words, the intrinsic carrier concentration in the oxide semiconductor is extremely close to zero.

The carrier concentration in the oxide semiconductor layer 107 used in this embodiment is lower than $1 \times 10^{12}/cm^3$, preferably lower than $1 \times 10^{11}/cm^3$, and the carrier concentration therein can be made to be extremely close to zero.

In order that hydrogen, hydroxyl, and moisture are contained as little as possible in the oxide semiconductor film, as pretreatment for the formation of the oxide semiconductor film, the substrate 101 over which the second insulating layer 105 is formed is preferably preheated in a preheating chamber of a sputtering apparatus, whereby impurities such as hydrogen or moisture adsorbed on the substrate 101 are eliminated and removed. As an evacuation unit provided for the preheating chamber, a cryopump is preferably used. Note that this preheating treatment can be omitted.

Note that before the oxide semiconductor film is formed by a sputtering method, dust attached to a surface of the second insulating layer 105 is preferably removed by reverse sputtering in which plasma is generated by introduction of an argon gas. The reverse sputtering refers to a method in which, without application of voltage to a target side, a high-frequency power source is used for application of voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

The oxide semiconductor film is formed by a sputtering method. As the oxide semiconductor film, the following can be used: a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al-Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; or a single-component metal oxide film such as an In—O-based film, a Sn—O-based film, or a Zn—O-based film. In addition, the above oxide semiconductor film may contain $SiO_2$.

As the oxide semiconductor film, a thin film represented by $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

In this embodiment, the oxide semiconductor film is formed by a sputtering method with the use of an In—Ga—Zn—O-based oxide semiconductor target for film formation. The oxide semiconductor film can be formed by a sputtering method in a rare gas (typically, argon) atmosphere, an oxygen atmosphere, or a mixed atmosphere of a rare gas (typically, argon) and oxygen. In the case of using a sputtering method, the oxide semiconductor film may be formed using a target containing $SiO_2$ at greater than or equal to 2 wt % and less than or equal to 10 wt %.

As another example of the In—Ga—Zn—O-based oxide semiconductor target for film formation, an oxide semiconductor target for film formation containing In, Ga, and Zn (the composition ratio of $In_2O_3:Ga_2O_3:ZnO=1:1:1$ (molar ratio)) or the like can be used. As the oxide semiconductor target for film formation containing In, Ga, and Zn, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can also be used. The filling rate of the oxide semiconductor target for film formation is greater than or equal to 90% and less than or equal to 100%, preferably greater than or equal to 95% and less than or equal to 99.9%. With the use of the oxide semiconductor target for film formation with a high filling factor, a dense oxide semiconductor film is formed.

The oxide semiconductor film is formed over the substrate 101 in such a manner that the substrate is held in the treatment chamber kept at reduced pressure, a sputtering gas from which hydrogen and moisture have been removed is introduced into the treatment chamber while moisture remaining therein is removed, and the above-described target is used. In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. From the treatment chamber evacuated with a cryopump, for example, a hydrogen atom, a compound containing a hydrogen atom such as water ($H_2O$) (preferably also a compound containing a carbon atom), and the like are removed; thus, the concentration of impurities in the oxide semiconductor film formed in the treatment chamber can be reduced. The substrate may be heated when the oxide semiconductor film is formed.

As an example of the film formation conditions, the following conditions are employed: the temperature is room temperature, the distance between the substrate and the target is 60 mm, the pressure is 0.4 Pa, the direct-current (DC) electric power is 0.5 kW, and the atmosphere is an atmosphere containing oxygen and argon (the flow rate of oxygen is 15 sccm and the flow rate of argon is 30 sccm). A pulsed direct-current (DC) power source is preferably used, in which case powder substances (also referred to as particles or dust) can be reduced and the film thickness can be uniform.

Next, in a first photolithography step, the oxide semiconductor film is processed into the island-shaped oxide semiconductor layer 107. A resist mask for forming the island-shaped oxide semiconductor layer 107 may be formed by an ink-jet method. Formation of the resist mask by an ink-jet method needs no photomask; thus, the manufacturing cost can be reduced.

Note that the etching of the oxide semiconductor film may be dry etching, wet etching, or both dry etching and wet etching.

As an etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant used in the wet etching is removed together with the etched materials by cleaning. The waste liquid containing the etchant and the material etched off may be purified and the material may be reused. A material such as indium contained in the oxide semiconductor layer is collected from the waste liquid after the etching and is reused, so that the resources can be efficiently used and the cost can be reduced.

The etching conditions (such as an etchant, etching time, and temperature) are adjusted as appropriate depending on the material so that the oxide semiconductor film can be etched into a desired shape.

In this embodiment, the oxide semiconductor film is processed into the island-shaped oxide semiconductor layer 107 by a wet etching method with the use of a mixed solution of phosphoric acid, acetic acid, and nitric acid as an etchant.

In this embodiment, first heat treatment is performed on the oxide semiconductor layer 107. The temperature of the first heat treatment is higher than or equal to 300° C. and lower than or equal to 800° C., preferably higher than or equal to 400° C. and lower than or equal to 700° C. Here, the substrate is put in an electric furnace that is a kind of heat treatment apparatus and heat treatment is performed on the oxide semiconductor layer 107 at 450° C. in a nitrogen atmosphere for one hour, and then water and hydrogen are prevented from entering the oxide semiconductor layer with the oxide semiconductor layer not exposed to air; thus, the oxide semiconductor layer 107 is obtained. Through the first heat treatment, the oxide semiconductor layer 107 can be dehydrated or dehydrogenated.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon, is used.

For example, as the first heat treatment, GRTA may be performed as follows: the substrate is transferred into an inert gas heated to a temperature as high as 650° C. to 700° C., heated for several minutes, and transferred and taken out of the inert gas heated to the high temperature. GRTA enables high-temperature heat treatment in a short time.

Note that in the first heat treatment, it is preferable that water, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably lower than or equal to 1 ppm, more preferably lower than or equal to 0.1 ppm).

The first heat treatment for the oxide semiconductor layer can be performed before the oxide semiconductor film is processed into the island-shaped oxide semiconductor layer. In that case, the substrate is taken out of the heating apparatus after the first heat treatment, and then a photolithography step is performed.

The heat treatment which has an effect of dehydrating or dehydrogenating the oxide semiconductor layer may be performed at any of the following timings: after the oxide semiconductor layer is formed; after a source electrode layer and a drain electrode layer are formed over the oxide semiconductor layer; after a film which serves as sidewalls is provided for the source electrode layer and the drain electrode layer; and after a gate insulating layer is formed over the source electrode layer and the drain electrode layer.

However, as long as a purified oxide semiconductor layer in which hydrogen and water are sufficiently reduced at the time of the formation can be obtained, the first heat treatment is not necessarily performed. In the case where the purified oxide semiconductor layer in which the hydrogen concentration is sufficiently reduced at the time of the formation is formed, the substrate is held in a treatment chamber kept at reduced pressure and the substrate is heated to a temperature higher than or equal to room temperature and lower than 400° C. Then, a sputtering gas from which hydrogen and moisture have been removed is introduced into the treatment chamber while moisture remaining therein is removed, and metal oxide is used as a target. In the above-described manner, the oxide semiconductor layer is formed over the substrate. From the treatment chamber evacuated with a cryopump, for example, a hydrogen atom, a compound containing a hydrogen atom such as water ($H_2O$) (preferably also a compound containing a carbon atom), and the like are removed; thus, the concentration of impurities in the oxide semiconductor layer formed in the treatment chamber can be reduced. When sputtering film formation is performed while moisture remaining in the treatment chamber is removed using a cryopump, the substrate temperature in forming the oxide semiconductor layer can be in the range of room temperature to a temperature lower than 400° C.

Next, a conductive film is formed over the second insulating layer 105 and the oxide semiconductor layer 107. The conductive film may be formed by a sputtering method or a vacuum evaporation method. As examples of the material for the conductive film, an element selected from Al, Cr, Cu, Ta, Ti, Mo, or W; an alloy containing any of these elements as a component; an alloy film containing any of these elements in combination; and the like can be given. Further, one or more materials selected from manganese, magnesium, zirconium, and beryllium may be used. Further, the metal conductive film may have a single-layer structure or a stacked-layer structure of two or more layers. For example, a single-layer structure of an aluminum film containing silicon; a two-layer structure of an aluminum film and a titanium film stacked thereover; a three-layer structure of a titanium film, an aluminum film stacked thereover, and a titanium film stacked thereover; and the like can be given. Alternatively, a film, an alloy film, or a nitride film of a combination of Al and one or more elements selected from titanium (Ti), tantalum (Ta), tungsten (W), molybdenum (Mo), chromium (Cr), neodymium (Nd), and scandium (Sc). In this embodiment, a stacked film of a titanium film (with a thickness of greater than or equal to 10 nm and less than or equal to 100 nm), an aluminum film (with a thickness of greater than or equal to 20 nm and less than or equal to 500 nm), and a titanium film (with a thickness of greater than or equal to 10 nm and less than or equal to 100 nm) is formed as the conductive film.

Figure 2A:
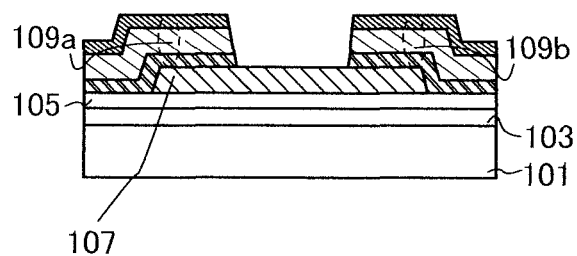
FIGS. 2A to 2D are cross-sectional views illustrating a manufacturing method of one embodiment of the present invention.

Next, in a second photolithography step, a resist mask is formed over the conductive film and the conductive film is selectively etched, so that the source electrode layer 109a and the drain electrode layer 109b are formed (FIG. 2A).

Note that in order to prevent the oxide semiconductor layer 107 from being removed and the second insulating layer 105 therebelow from being exposed at the time of the etching of the conductive film, materials and etching conditions are adjusted as appropriate.

In this embodiment, In—Ga—Zn—O-based oxide can be used for the oxide semiconductor layer 107, and organic acid such as citric acid or oxalic acid, ITO07N (produced by KANTO CHEMICAL CO., INC.), or the like can be used for an etchant.

Note that, in the second photolithography step, part of the oxide semiconductor layer 107 is also etched in some cases, so that an oxide semiconductor layer having a groove (a depressed portion) might be formed. The resist mask for forming the source electrode layer 109a and the drain electrode layer 109b may be formed by an ink-jet method. Formation of the resist mask by an ink-jet method needs no photomask; thus, the manufacturing cost can be reduced.

Ultraviolet light, KrF laser light, or ArF laser light is used for light exposure for forming the resist mask in the second photolithography step.

Figure 2B:
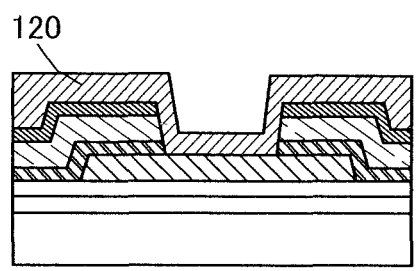

Next, an insulating layer 120 is formed over the oxide semiconductor layer 107, the source electrode layer 109a, and the drain electrode layer 109b (FIG. 2B).

As the insulating layer 120, a silicon oxide film, a silicon nitride film, a silicon oxynitride film, a silicon nitride oxide film, a titanium oxide film, an aluminum oxide film, or the like is formed by a sputtering method.

Figure 2C:
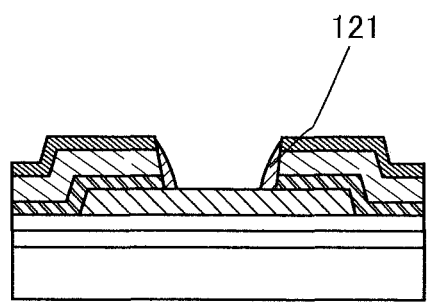

Next, most of the insulating layer 120 is removed by overall etching, so that the sidewalls 121 which are in contact with a top surface of the oxide semiconductor layer 107 are provided on side surfaces of the source electrode layer 109a and the drain electrode layer 109b and the top surface of the oxide semiconductor layer 107 (FIG. 2C). At this time, bottom edge portions of the insulating layer 120, which are in contact with the oxide semiconductor layer 107 is thicker than planar portions of the insulating layer 120, which are in contact with the source electrode layer 109a and the drain electrode layer 109b; thus, sidewalls 121 with desired shapes can be left by selecting etching conditions as appropriate. As the etching conditions, conditions under which anisotropic etching in which reactive ions perpendicularly enter the substrate can be performed are used. When the sidewall 121 is formed of an insulating layer, the sidewall 121 has insulating properties.

The sidewall 121 may be formed using a conductive material, for example, a metal material. Specifically, a metal film is formed, instead of the insulating layer 120, over the source electrode layer 109a and the drain electrode layer 109b. The metal film can be formed using a metal material such as a metal element such as titanium, aluminum, or tungsten, an alloy containing the metal element as a component, or an alloy containing the above metal elements in combination.

Next, most of the metal film is removed by etching, so that the sidewalls 121 of the source electrode layer 109a and the drain electrode layer 109b which are in contact with the top surface of the oxide semiconductor layer 107 are formed. The sidewall 121 formed using a conductive material becomes a conductive sidewall, so that the sidewall is electrically connected to the side surface of the source electrode layer 109a or the drain electrode layer 109b. In addition, the bottom surface of the sidewall of each of the source electrode layer 109a and the drain electrode layer 109b is in contact with the oxide semiconductor layer 107 to be electrically connected thereto.

Next, the gate insulating layer 117 is formed over the source electrode layer 109a, the drain electrode layer 109b, the sidewalls 121, and the oxide semiconductor layer 107.

The gate insulating layer 117 can be formed to have a single-layer structure or a stacked-layer structure using a silicon oxide layer, a silicon nitride layer, a silicon oxynitride layer, a silicon nitride oxide layer, a hafnium oxide layer, a tantalum oxide layer, and/or an aluminum oxide layer by a sputtering method or the like. Note that the gate insulating layer 117 is preferably formed by a sputtering method so that a large amount of hydrogen can be prevented from being contained in the gate insulating layer 117. In the case where a silicon oxide film is formed by a sputtering method, a silicon target or a quartz target is used as a target and oxygen or a mixed gas of oxygen and argon is used as a sputtering gas.

The gate insulating layer 117 can have a structure in which a silicon oxide layer and a silicon nitride layer are stacked in this order over the source electrode layer 109a and the drain electrode layer 109b. For example, a gate insulating layer with a thickness of 100 nm may be formed in such a manner that a silicon oxide layer ($SiO_x$ (x>0)) with a thickness of greater than or equal to 5 nm and less than or equal to 300 nm may be formed as a first gate insulating layer and a silicon nitride layer ($SiN_y$ (y>0)) with a thickness of greater than or equal to 50 nm and less than or equal to 200 nm may be stacked as a second gate insulating layer over the first gate insulating layer by a sputtering method. In this embodiment, a silicon oxide layer with a thickness of 100 nm is formed by an RF sputtering method in an atmosphere containing oxygen and argon (the flow ratio of oxygen to argon is 1:1 (each flow rate is 25 sccm)) under conditions where the pressure is 0.4 Pa and the high-frequency electric power is 1.5 kW.

Next, a conductive film is formed over the gate insulating layer 117, and then the gate electrode layer 119 is formed in a third photolithography step. Note that a resist mask may be formed by an ink-jet method. Formation of the resist mask by an ink-jet method needs no photomask; thus, the manufacturing cost can be reduced.

The gate electrode layer 119 can be formed to have a single-layer structure or a stacked-layer structure using a metal material such as molybdenum, titanium, chromium, tantalum, tungsten, aluminum, copper, neodymium, or scandium, or an alloy material which contains any of these materials as a main component.

For example, as a two-layer structure of the gate electrode layer 119, any of the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stacked structure of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of a material for the light-transmitting conductive film, light-transmitting conductive oxide or the like can be given.

In this embodiment, a tungsten film with a thickness of 150 nm is formed as the gate electrode layer 119.

Next, second heat treatment (preferably at a temperature higher than or equal to 200° C. and lower than or equal to 400° C., for example, higher than or equal to 250° C. and lower than or equal to 350° C.) is performed in an inert gas atmosphere or an oxygen gas atmosphere. In this embodiment, the second heat treatment is performed at 250° C. in a nitrogen atmosphere for one hour. The second heat treatment may be performed after a protective insulating layer or a planarization insulating layer is formed over the transistor 200.

Further, heat treatment may be performed at a temperature higher than or equal to 100° C. and lower than or equal to 200° C. for greater than or equal to 1 hour and less than or equal to 30 hours in the air. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed under reduced pressure before the formation of the oxide insulating layer. When the heat treatment is performed under reduced pressure, the heat treatment time can be shortened.

Figure 2D:
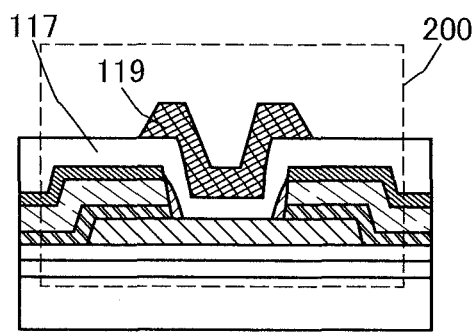

Through the above-described steps, the top-gate transistors 200 and 201 including the oxide semiconductor layers can be manufactured in each of which the sidewalls are provided for the source electrode layer and the drain electrode layer and which has a short channel length L and can be miniaturized (FIG. 2D). Specifically, the channel length L can be 10 nm to 1 µm.

A protective insulating layer or a planarization insulating layer for planarization may be provided over each of the thin film transistors 200 and 201. For example, the protective insulating layer may be formed to have a single-layer structure or a stacked-layer structure using a silicon oxide layer, a silicon nitride layer, a silicon oxynitride layer, a silicon nitride oxide layer, and/or an aluminum oxide layer.

The planarization insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating layers formed using any of these materials.

There is no particular limitation on the method for forming the planarization insulating layer, and the planarization insulating layer can be formed, depending on the material, by a method such as a sputtering method, an SOG method, a spin coating method, a dip coating method, a spray coating method, or a droplet discharge method (such as an ink-jet method, screen printing, offset printing, or the like), or a tool (equipment) such as a doctor knife, a roll coater, a curtain coater, or a knife coater.

Note that the siloxane resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

When both the gate insulating layer 117 and the first insulating layer 103 in the transistors 200 and 201 are formed using silicon nitride films, the oxide semiconductor layer 107 can be interposed between the silicon nitride films, whereby the entry of hydrogen or moisture can be effectively blocked. Such a structure makes it possible to reduce the concentration of water or hydrogen in the oxide semiconductor layer 107 to the minimum and to prevent the entry of water or hydrogen.

Although the transistors 200 and 201 are described as single-gate transistors, the transistors 200 and 201 can be manufactured as multi-gate transistors including a plurality of channel formation regions as necessary.

As described above, the provision of the sidewalls for the source electrode layer and the drain electrode layer makes it possible to realize a top-gate semiconductor element including an oxide semiconductor layer, which has a short channel length L and can be miniaturized. In addition, the semiconductor element of one embodiment of the present invention has a short channel length L and can be miniaturized; thus, when the semiconductor element is used in a semiconductor integrated circuit such as an LSI, a CPU, or a memory, the operation speed of the circuit is increased, and furthermore, power consumption can be reduced.

Further, in the semiconductor element of one embodiment of the present invention, the sidewalls are provided on the side surfaces of the source electrode layer and the drain electrode layer, which give tapered shapes to the source electrode layer and the drain electrode layer; thus, the coverage with the gate insulating layer can be increased and a short circuit between the gate electrode layer and the source electrode layer or the drain electrode layer can be prevented. As a result, a highly reliable semiconductor element and a highly reliable semiconductor device including the semiconductor element can be realized.

Further, a normally-off semiconductor element in which off-state current is small can be manufactured by using an oxide semiconductor layer which has a large energy gap and in which the hydrogen concentration is sufficiently reduced and the purity is increased by removal of impurities such as hydrogen and moisture. The use of the semiconductor element makes it possible to realize a semiconductor device whose power consumption due to leakage current is small.

The structures, methods, and the like described in this embodiment can be combined as appropriate with any of the structures, methods, and the like described in the other embodiments.

(Embodiment 3)

In this embodiment, a method for manufacturing a transistor which is different from that described in the above embodiment will be described with reference to drawings. Note that the manufacturing process (a material and the like which can be used) described in this embodiment has a lot in common with that described in Embodiment 2. Therefore, in the following description, description of the same portions will not be given, and different points will be described in detail.

The transistor 300 illustrated in FIG. 28B includes the first insulating layer 303, the second insulating layer 305, the oxide semiconductor layer 307, the first source electrode layer 309a, the second source electrode layer 311a, the first drain electrode layer 309b, the second drain electrode layer 311b, the third insulating layer 315, the sidewalls 321, the gate insulating layer 317, and the gate electrode layer 319 over the substrate 301 having an insulating surface.

An example of a method for manufacturing the transistor 300 illustrated in FIG. 28B will be described with reference to FIGS. 3A to 3F.

First, the first insulating layer 303 is formed over the substrate 301 having an insulating surface. Then, the second insulating layer 305 is formed over the first insulating layer 303. Then, an oxide semiconductor film with a thickness of greater than or equal to 3 nm and less than or equal to 50 nm, preferably greater than or equal to 3 nm and less than or equal to 30 nm, is formed over the second insulating layer 305, and the oxide semiconductor film is processed into the island-shaped oxide semiconductor layer 307 in a first photolithography step. In this embodiment, first heat treatment is performed on the oxide semiconductor layer 307.

Next, a first conductive film 306 and a second conductive film 308 are formed over the second insulating layer 305 and the oxide semiconductor layer 307. The first conductive film 306 and the second conductive film 308 can be formed to have a single-layer structure or a stacked-layer structure using a material which is the same as that for the source electrode layer 109a and the drain electrode layer 109b described in Embodiment 2.

In this embodiment, a stacked film of a titanium film (with a thickness of greater than or equal to 10 nm and less than or equal to 100 nm) and a tungsten film (with a thickness of greater than or equal to 10 nm and less than or equal to 100 nm) thereover is formed as the first conductive film 306, and a stacked film of an aluminum film (with a thickness of greater than or equal to 20 nm and less than or equal to 500 nm) and a titanium film (with a thickness of greater than or equal to 10 nm and less than or equal to 100 nm) thereover is formed as the second conductive film 308. When a material which is not likely to transmit a substance which contaminates an oxide semiconductor (specifically hydrogen or the like) is used for the first conductive film 306, the conductive film 306 serves as a barrier film. For example, when the first conductive film 306 is formed using a tungsten film which is not likely to transmit hydrogen, the second conductive film 308 and an insulating layer 320 which serves as a sidewall can be formed by a deposition method which might contaminate the oxide semiconductor layer 307 (specifically a CVD method).

Figure 3A:
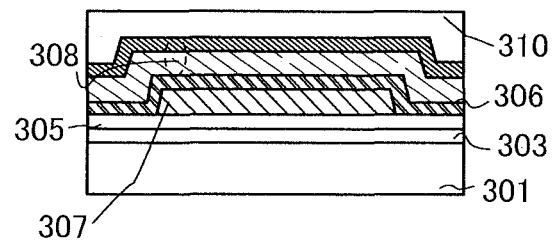
FIGS. 3A to 3F are cross-sectional views illustrating a manufacturing method of one embodiment of the present invention.

Next, an insulating layer 310 with a thickness of greater than or equal to 200 nm and less than or equal to 2000 nm is formed over the second conductive film 308 by a plasma CVD method, a sputtering method, or the like, as a single layer or a stacked layer using a silicon oxide layer, a silicon nitride layer, a silicon oxynitride layer, and/or a silicon nitride oxide layer (FIG. 3A). An organic material having heat resistance, such as polyimide, acrylic, benzocyclobutene, polyamide, or epoxy can be used for the insulating layer. Other than such organic materials, a low-dielectric constant material (a low-k material), a siloxane-based resin, phosphosilicate glass (PSG), borophosphosilicate glass (BPSG), or the like may be used.

There is no particular limitation on the method for forming the insulating layer, and the insulating layer can be formed, depending on the material, by a method such as a sputtering method, an SOG method, a spin coating method, a dip coating method, a spray coating method, or a droplet discharge method (such as an ink-jet method, screen printing, offset printing, or the like), or a tool (equipment) such as a doctor knife, a roll coater, a curtain coater, or a knife coater.

Figure 3B:
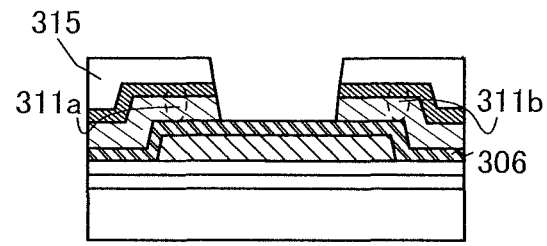

Next, in a second photolithography step, a resist mask is formed over the insulating layer 310 and selective etching is performed, so that the second source electrode layer 311a, the second drain electrode layer 311b, and the third insulating layer 315 are formed (FIG. 3B).

The third insulating layer 315 is provided in order to reduce parasitic capacitance between the gate electrode layer 319 formed later and the second source electrode layer 311a or the second drain electrode layer 311b. Meanwhile, when the third insulating layer 315 is provided, in order that the second source electrode layer 311a and the second drain electrode layer 311b have tapered shapes, etching conditions such as a selectivity ratio of the third insulating layer 315 to the second source electrode layer 311a or the second drain electrode layer 311b need to be controlled, which makes processing by etching difficult. Unless the second source electrode layer 311a and the second drain electrode layer 311b are tapered, a problem arises in that the coverage with the gate insulating layer 317 stacked thereover is reduced. However, in the transistor according to one embodiment of the present invention, the sidewalls 321 are provided on side surfaces of the second source electrode layer 311a and the second drain electrode layer 311b, which give tapered shapes to the source electrode layer 311a and the drain electrode layer 311b; thus, the edges of the second source electrode layer 311a and the second drain electrode layer 311b do not need to be processed to have tapered shapes. Accordingly, the transistor can be easily manufactured.

Figure 3C:
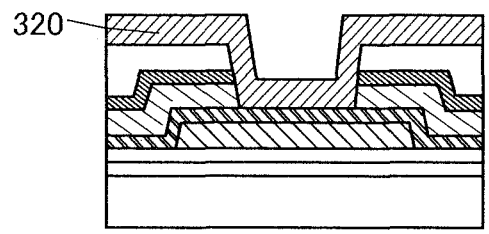

Next, the insulating layer 320 is formed over the first conductive film 306, the second source electrode layer 311a, the second drain electrode layer 311b, and the third insulating layer 315 (FIG. 3C).

As the insulating layer 320, a silicon oxide film, a silicon nitride film, a silicon oxynitride film, a silicon nitride oxide film, a titanium oxide film, an aluminum oxide film, or the like can be formed by a sputtering method. A metal film may be used instead of the insulating layer 320. In the case where the first conductive film 306 is formed using a material which is not likely to transmit a substance which contaminates an oxide semiconductor (specifically hydrogen or the like), the insulating layer 320 may be formed by a CVD method. The insulating layer 320 which serves as a sidewall is preferably formed by a CVD method, in which case the insulating layer 320 can be formed to have a uniform thickness.

Figure 3D:
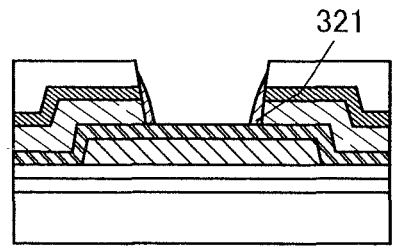

Next, most of the insulating layer 320 is removed by overall etching, so that the sidewalls 321 are formed on side surfaces of the second source electrode layer 311a and the second drain electrode layer 311b. At this time, bottom surfaces of the sidewalls 321 are in contact with a top surface of the first conductive film 306 (FIG. 3D). At this time, bottom edge portions of the insulating layer 320, which are in contact with the first conductive film 306 is thicker than planar portions of the insulating layer 320, which are in contact with the third insulating layer 315; thus, the insulating layer 320 with a desired shape can be left as the sidewalls 321 by appropriately selecting etching conditions. As the etching condition, conditions under which anisotropic etching in which reactive ions perpendicularly enter the substrate can be performed are used. The sidewalls 321 may be further in contact with side surfaces of the third insulating layer 315.

Figure 3E:
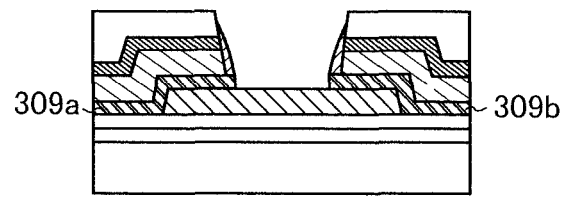

Next, the first conductive film 306 is etched using the third insulating layer 315 and the sidewalls 321 as hard masks, so that the first source electrode layer 309a and the first drain electrode layer 309b are formed (FIG. 3E). The etching is performed using the sidewalls 321 as masks, whereby the channel length L can be shortened.

Next, the gate insulating layer 317 is formed over the third insulating layer 315, the sidewalls 321, the first source electrode layer 309a, the first drain electrode layer 309b, and the oxide semiconductor layer 307. Then, a conductive film is formed over the gate insulating layer 317, and after that the gate electrode layer 319 is formed in a third photolithography step.

Figure 3F:
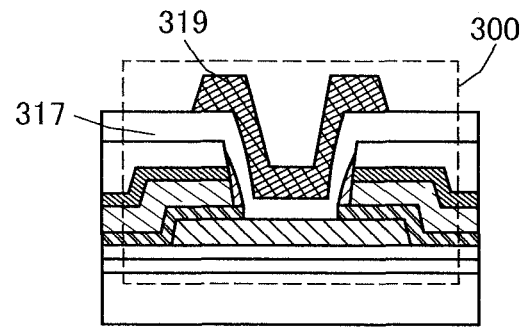

Next, second heat treatment (preferably at a temperature higher than or equal to 200° C. and lower than or equal to 400° C., for example, higher than or equal to 250° C. and lower than or equal to 350° C.) is performed in an inert gas atmosphere or an oxygen gas atmosphere. Through the above-described steps, the transistor 300 including the sidewalls on the source electrode layer and the drain electrode layer can be manufactured (FIG. 3F).

As described above, the sidewalls are provided for the source electrode layer and the drain electrode layer in the semiconductor element of one embodiment of the present invention, whereby a top-gate semiconductor element including an oxide semiconductor layer, which has a short channel length L and can be miniaturized can be realized.

Further, the semiconductor element of one embodiment of the present invention has a short channel length L and can be miniaturized; thus, when the semiconductor element is used in a semiconductor integrated circuit such as an LSI, a CPU, or a memory, the operation speed of the circuit is increased, and furthermore, power consumption can be reduced.

Further, in the semiconductor element of one embodiment of the present invention, the sidewalls are provided on the side surfaces of the source electrode layer and the drain electrode layer, which give tapered shapes to the source electrode layer and the drain electrode layer; thus, the coverage with the gate insulating layer can be increased and a short circuit between the gate electrode layer and the source electrode layer or the drain electrode layer can be prevented. As a result, a highly reliable semiconductor element and a highly reliable semiconductor device including the semiconductor element can be realized.

Further, in the semiconductor element of one embodiment of the present invention, the oxide semiconductor layer which has a large energy gap and in which the hydrogen concentration is sufficiently reduced and the purity is increased by removal of impurities such as hydrogen and moisture is used, whereby a normally-off semiconductor element in which off-state current is small can be manufactured. The use of the semiconductor element makes it possible to realize a semiconductor device whose power consumption due to leakage current is small.

The structures, methods, and the like described in this embodiment can be combined as appropriate with any of the structures, methods, and the like described in the other embodiments.

(Embodiment 4)

In this embodiment, an example in which an inverter circuit of an integrated circuit is formed using two n-channel transistors will be described. A manufacturing process of the transistor is almost the same as that in Embodiment 2; therefore, only different portions will be described in detail.

The integrated circuit is formed using an inverter circuit, a capacitor, a resistor, and the like; therefore, a process of forming a capacitor and two kinds of resistors over the same substrate in addition to the inverter circuit will also be described.

In the case where the inverter circuit includes a combination of two n-channel transistors, the following are given as examples of the inverter circuit: an EDMOS circuit including a combination of an enhancement mode transistor and a depletion mode transistor and an EEMOS circuit including a combination of two enhancement mode transistors.

Figure 4:
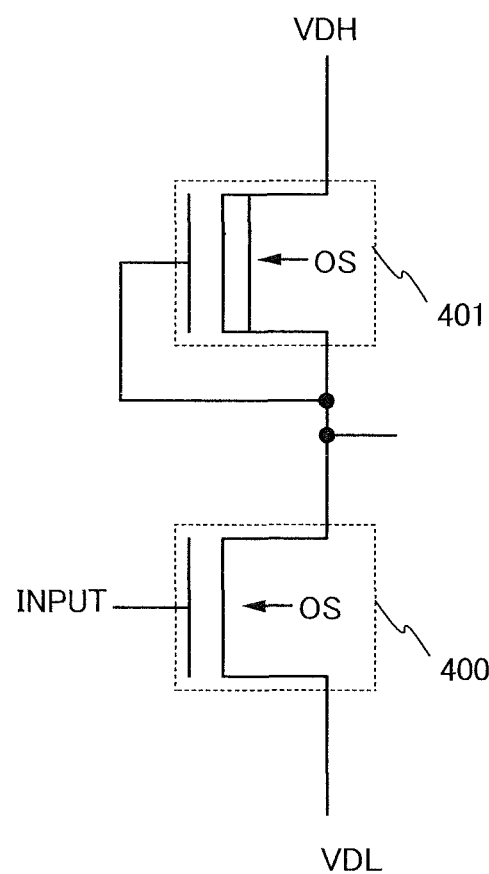
FIG. 4 is an equivalent circuit diagram illustrating one embodiment of the present invention.

In this embodiment, an example of an EDMOS circuit will be described. FIG. 4 illustrates an equivalent circuit of the EDMOS circuit. FIG. 5B illustrates a cross-sectional structure of the inverter circuit.

FIG. 5B illustrates a cross-sectional structure of a circuit whose connection is illustrated in FIG. 4. An example in which a first transistor 400 is an enhancement mode n-channel transistor and a second transistor 401 is a depletion mode n-channel transistor is illustrated.

In FIG. 5B, electrode layers 412b, 412c, 412d, and 412e are formed over a substrate 411. The electrode layers 412b, 412c, 412d, and 412e can be formed in a step and with a material which are the same as those of the electrode layer 102 in Embodiment 2.

Voltage is applied to the electrode layer 412b and the threshold voltage is set to be negative, whereby the second transistor 401 functions as a depletion mode transistor. The electrode layer 412c is one electrode included in the capacitor. The electrode layer 412d is one electrode connected to a first resistor. The electrode layer 412e is one electrode connected to a second resistor.

In addition, a first insulating layer 413 and a second insulating layer 415 for covering the electrode layers 412b, 412c, 412d, and 412e are formed. In a capacitor portion, parts of the first insulating layer 413 and the second insulating layer 415, which overlap with the electrode layer 412c serve as dielectrics.

A second oxide semiconductor layer 417b may be thicker than a first oxide semiconductor layer 417a. Deposition and patterning are each performed twice in order to make the thickness of the second oxide semiconductor layer 417b larger than that of the first oxide semiconductor layer 417a. The thickness of the second oxide semiconductor layer 417b is increased, whereby the second transistor 401 can function as a depletion mode transistor, and voltage to make the threshold voltage negative does not need to be applied to the electrode layer 412b; thus, the electrode layer 412b can be omitted.

A third oxide semiconductor layer 417c functions as the first resistor. An opening is formed in parts of the first insulating layer 413 and the second insulating layer 415, which overlap with the electrode layer 412d, and the third oxide semiconductor layer 417c and the electrode layer 412d are electrically connected to each other through the opening. Further, a fourth oxide semiconductor layer 417d functions as the second resistor. An opening is formed in parts of the first insulating layer 413 and the second insulating layer 415, which overlap with the electrode layer 412e, and the fourth oxide semiconductor layer 417d and the electrode layer 412e are electrically connected to each other through the opening.

The fourth oxide semiconductor layer 417d may be thicker than the third oxide semiconductor layer 417c. When the third oxide semiconductor layer 417c and the fourth oxide semiconductor layer 417d have different thicknesses, the value of the resistivity of the first resistor can be different from that of the second resistor.

The first transistor 400 includes a first gate electrode layer 419a and the first oxide semiconductor layer 417a which overlaps with the first gate electrode layer 419a with a gate insulating layer 427 interposed therebetween. A first electrode layer 422a which is in contact with part of the first oxide semiconductor layer 417a is electrically connected to a first wiring 429a. The first wiring 429a is a power supply line to which negative voltage $V_{DL}$ is applied (a negative power supply line). This power supply line may be a power supply line with a ground potential (a ground potential power supply line).

In this embodiment, the first electrode layer 422a includes three layers and is formed using a material which is the same as that for the source electrode layer 109a and the drain electrode layer 109b in Embodiment 2. In this embodiment, after conductive films are patterned, an insulating film is formed (see FIG. 5A), and furthermore, the conductive layer and the insulating film are selectively etched, so that the first electrode layer 422a, a second electrode layer 422b, a third electrode layer 422c, and a third insulating layer 416 are formed (see FIG. 5B). The third insulating layer 416 is provided in order to reduce parasitic capacitance between a second gate electrode layer 419b and the second electrode layer 422b which are formed later.

In the capacitor portion, a fourth electrode layer 422d which is a capacitor electrode layer is formed in a step and with a material which are the same as those of the first electrode layer 422a. The fourth electrode layer 422d overlaps with the electrode layer 412c.

A fifth electrode layer 422e is formed on and in contact with the fourth oxide semiconductor layer 417d which is the second resistor, in a step and with a material which are the same as those of the first electrode layer 422a.

Further, the first transistor 400 includes sidewalls 421 of the first electrode layer 422a and the second electrode layer 422b. Bottom surfaces of the sidewalls 421 are in contact with a top surface of the first oxide semiconductor layer 417a. Similarly, the second transistor 401 includes sidewalls 431 of the second electrode layer 422b and the third electrode layer 422c. Bottom surfaces of the sidewalls 431 are in contact with a top surface of the second oxide semiconductor layer 417b. The provision of the sidewalls makes it possible to manufacture a minute transistor which has a short channel length L; thus, the operation speed of a circuit can be increased, and furthermore, power consumption can be reduced.

The second transistor 401 includes the second gate electrode layer 419b which functions as a second wiring and the second oxide semiconductor layer 417b which overlaps with the second gate electrode layer 419b with the gate insulating layer 427 interposed therebetween. A third wiring 429b is a power supply line to which positive voltage $V_{DH}$ is applied (a positive power supply line).

In addition, the second transistor 401 includes the second electrode layer 422b and the third electrode layer 422c which are partly in contact with and overlap with the second oxide semiconductor layer 417b. Note that the second electrode layer 422b and the third electrode layer 422c are formed in a step and with a material which are the same as those of the first electrode layer 422a.

An opening reaching the second electrode layer 422b is formed in the third insulating layer 416 and the gate insulating layer 427. The second electrode layer 422b is electrically connected to the second gate electrode layer 419b which functions as a second wiring, whereby the first transistor 400 and the second transistor 401 are connected to form an EDMOS circuit.

A fourth wiring 429c which is connected to the fourth electrode layer 422d through an opening formed in parts of the third insulating layer 416 and the gate insulating layer 427, which overlap with the electrode layer 412c functions as a capacitor wiring.

A fifth wiring 429d is in contact with the third oxide semiconductor layer 417c which functions as the first resistor through an opening formed in parts of the third insulating layer 416 and the gate insulating layer 427, which overlap with the electrode layer 412d.

In this embodiment, the example in which the EDMOS circuit, the capacitor portion, the first resistor, and the second resistor are formed over one substrate with the use of the transistor described in Embodiment 2 is described; however, the present invention is not particularly limited thereto, and the transistor described in Embodiment 3 can also be formed over the same substrate.

Figure 6A:
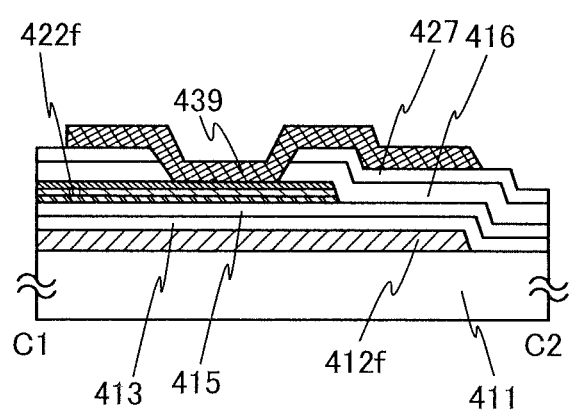
FIGS. 6A and 6B are a cross-sectional view and a top view illustrating one embodiment of the present invention.
Figure 6B:
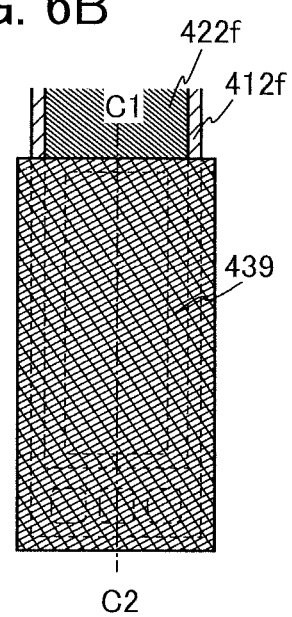

FIG. 6A illustrates a cross-sectional structure of a terminal portion of a wiring which can be formed over the same substrate in this embodiment. FIG. 6A is a cross-sectional view taken along a line C1-C2 in FIG. 6B.

In FIG. 6A, a conductive layer 439 formed over a stack of the third insulating layer 416 and the gate insulating layer 427 is a connection terminal electrode which functions as an input terminal. In addition, in FIG. 6A, in the terminal portion, an electrode layer 412f which is formed using a material which is the same as that for the electrode layers 412b, 412c, 412d, and 412e is provided below and overlaps with a sixth electrode layer 422f which serves as a terminal electrode layer electrically connected to the first electrode layer 422a, with the first insulating layer 413 and the second insulating layer 415 interposed therebetween. The electrode layer 412f is not electrically connected to the sixth electrode layer 422f. When the electrode layer 412f is set to have potential different from that of the sixth electrode layer 422f, for example, floating potential, GND, or 0 V, capacitance for preventing noise or static electricity can be formed. In addition, the sixth electrode layer 422f is electrically connected to the conductive layer 439, and the third insulating layer 416 and the gate insulating layer 427 are interposed between the sixth electrode layer 422f and the conductive layer 439.

Further, the sixth electrode layer 422f can be formed with a material and in a step which are the same as those of the first electrode layer 422a. In addition, the conductive layer 439 can be formed with a material and in a step which are the same as those of the first gate electrode layer 419a and the second gate electrode layer 419b.

This embodiment can be freely combined with any of other embodiments.

(Embodiment 5)

In this embodiment, an example of manufacturing a CPU (central processing unit) using the EDMOS circuit described in Embodiment 4 will be described.

Figure 18:
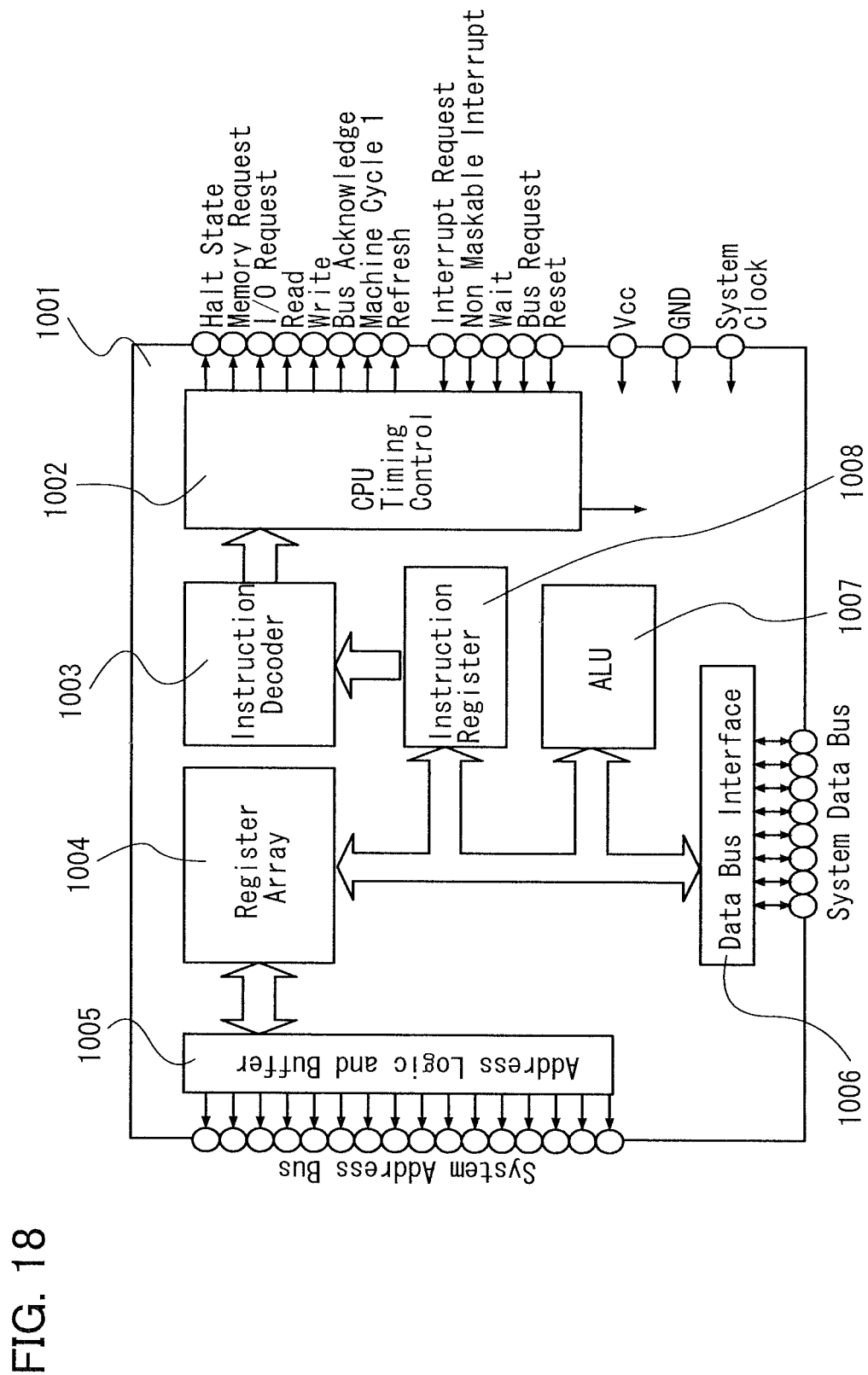
FIG. 18 is a block diagram illustrating one embodiment of the present invention.

FIG. 18 is an example of a block diagram of a CPU. A CPU 1001 illustrated in FIG. 18 includes a timing control circuit 1002, an instruction decoder 1003, a register array 1004, an address logic and buffer circuit 1005, a data bus interface 1006, an ALU 1007, an instruction register 1008, and the like.

These circuits are manufactured using any of the transistors, the inverter circuit, the resistor, the capacitor, and the like described in Embodiments 1 to 4. The transistors described in Embodiments 1 to 4 each include an oxide semiconductor layer which has a large energy gap and in which the hydrogen concentration is sufficiently reduced; thus, the transistors can be normally-off transistors with extremely small off-state current. In addition, in each of the transistors described in Embodiments 1 to 4, the sidewalls are provided for the source electrode layer and the drain electrode layer; thus, the transistor has a short channel length L and can be miniaturized, and the operation speed of the circuit can be increased. Thus, at least part of the CPU 1001 is formed using the transistor of one embodiment of the present invention, whereby low power consumption can be realized.

Here, each circuit is briefly described. The timing control circuit 1002 receives instructions from the outside, converts them into information for the inside, and transmits the information to another block. In addition, the timing control circuit 1002 gives directions such as reading and writing of memory data to the outside, according to internal operation. The instruction decoder 1003 has a function of converting instructions from the outside into information for the inside. The register array 1004 is a volatile memory for temporarily storing data. The address logic and buffer circuit 1005 is a circuit for specifying the address of an external memory. The data bus interface 1006 is a circuit for taking data in and out of an external memory or a device such as a printer. The ALU 1007 is a circuit for performing an operation. The instruction register 1008 is a circuit for temporarily storing instructions. The CPU includes combination of these circuits.

This embodiment can be freely combined with any of other embodiments.

(Embodiment 6)

In this embodiment, an example of usage of the semiconductor device described in the above embodiment will be described. Specifically, application examples of a semiconductor device capable of inputting and outputting data without contact will be described below with reference to drawings. The semiconductor device capable of inputting and outputting data without contact is also referred to as an RFID tag, an ID tag, an IC tag, an RF tag, a wireless tag, an electronic tag, or a wireless chip, depending on the usage.

An example of a top structure of a semiconductor device described in this embodiment will be described with reference to FIGS. 21A to 21C. A semiconductor device illustrated in FIG. 21A includes a semiconductor integrated circuit chip 500 provided with an antenna (also referred to as an on-chip antenna) and a supporting substrate 506 provided with an antenna 505 (also referred to as a booster antenna). The semiconductor integrated circuit chip 500 is provided over an insulating layer 510 that is formed over the supporting substrate 506 and the antenna 505. The semiconductor integrated circuit chip 500 can be fixed to the supporting substrate 506 and the antenna 505 by using the insulating layer 510. FIG. 21B is a perspective view of the semiconductor device illustrated in FIG. 21A in which the semiconductor integrated circuit chip 500 and the antenna 505 formed over the supporting substrate 506 are stacked. FIG. 21C is a cross-sectional view taken along a dashed line X-Y in FIG. 21B.

Note that a conductive shield is provided on a surface of the semiconductor integrated circuit chip 500 in order to prevent electrostatic breakdown of the semiconductor integrated circuit (e.g., malfunction of the circuit or damage to a semiconductor element) due to electrostatic discharge. In the case where the conductive shield has high resistance and current cannot pass through the pattern of the antenna 505, the antenna 505 and the conductive shield provided on the surface of the semiconductor integrated circuit chip 500 may be provided in contact with each other.

A semiconductor integrated circuit provided in the semiconductor integrated circuit chip 500 includes a plurality of elements such as transistors for constituting a memory portion or a logic portion. As the transistors for constituting the memory portion or the logic portion, the transistor of one embodiment of the present invention is used. As a semiconductor element in a semiconductor device according to this embodiment, not only a field-effect transistor but also a memory element including a semiconductor layer can be employed; thus, a semiconductor device which can meet functions required for various applications can be manufactured and provided.

Figure 20A:
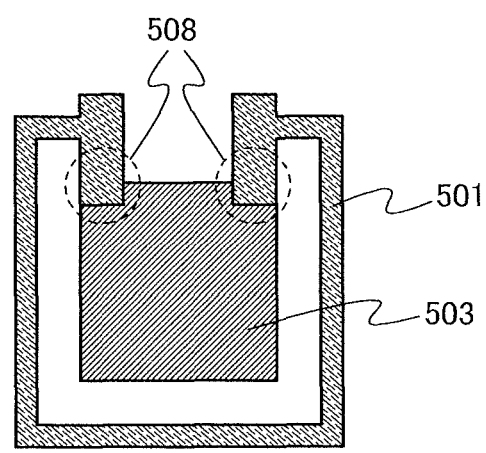
FIGS. 20A and 20B each illustrate a semiconductor device.
Figure 21A:
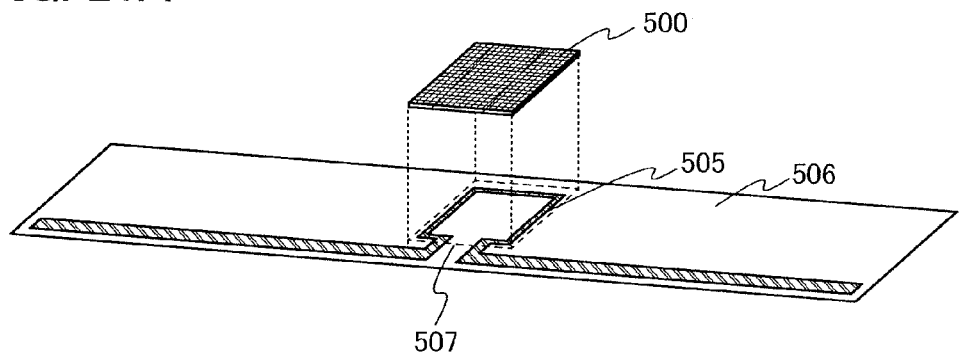
FIGS. 21A to 21C illustrate a semiconductor device.
Figure 21B:
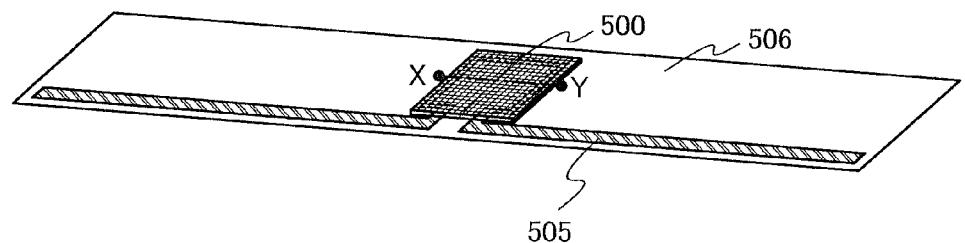
Figure 21C:
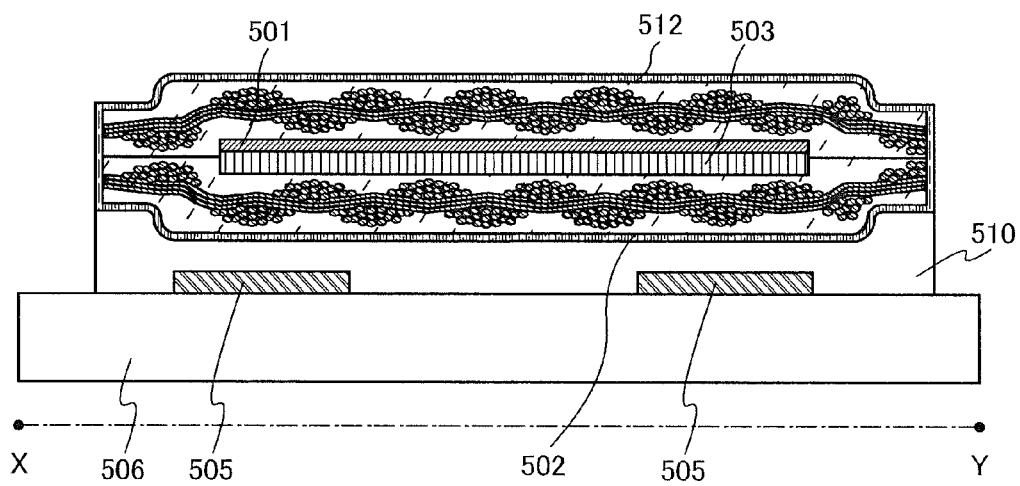

FIG. 20A is an enlarged view of the antenna and the semiconductor integrated circuit which are included in the semiconductor integrated circuit chip 500 illustrated in FIG. 21A. In FIG. 20A, the antenna 501 is a rectangular loop antenna with one winding; however, one embodiment of the present invention is not limited to this structure. The shape of the loop antenna is not limited to a rectangle and may be a shape with curve, for example, a circle. In addition, the number of windings is not limited to one and may be plural. Note that in the case where the antenna 501 has one winding, parasitic capacitance between the semiconductor integrated circuit 503 and the antenna 501 can be reduced.

Figure 20B:
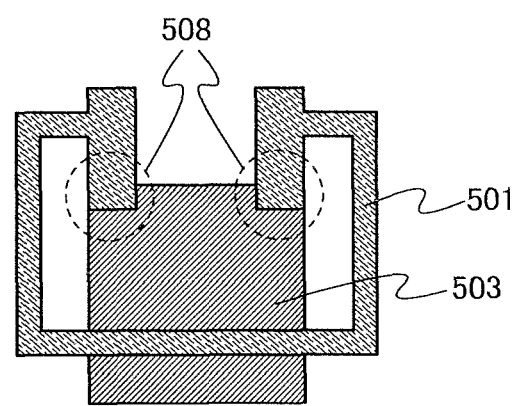

In FIG. 20A and FIG. 21C, the antenna 501 is placed so as to surround the periphery of the semiconductor integrated circuit 503, and except for portions corresponding to feeding points 508 indicated by the dashed line, the antenna 501 is arranged in a region that does not overlap with the semiconductor integrated circuit 503. However, one embodiment of the present invention is not limited to this structure. As illustrated in FIG. 20B, the antenna 501 may be arranged so as to partly overlap with the semiconductor integrated circuit 503 in addition to the portions corresponding to the feeding points 508 indicated by the dashed line. However, as illustrated in FIG. 20A and FIG. 21C, the antenna 501 is arranged in the region that does not overlap with the semiconductor integrated circuit 503; thus, the parasitic capacitance between the semiconductor integrated circuit 503 and the antenna 501 can be reduced.

In FIG. 21A, the antenna 505 can transmit and receive signals or supply power by using the antenna 501 and electromagnetic induction mainly in a loop-shaped portion surrounded by a dashed line 507. Further, the antenna 505 can transmit and receive signals or supply power to/from an interrogator by a radio wave mainly in a region other than the portion surrounded by the dashed line 507. A radio wave used as a carrier (carrier wave) between the interrogator and the semiconductor device preferably has a frequency of about 30 MHz to 5 GHz, and for example, may have a frequency band of 950 MHz or 2.45 GHz.

Although the antenna 505 is a rectangular and loop-shaped antenna with one winding in the region surrounded by the dashed line 507, one embodiment of the present invention is not limited to this structure. The shape of the loop antenna is not limited to a rectangle and may be a shape with curve, for example, a circle. In addition, the number of windings is not limited to one and may be plural.

For the semiconductor device described in this embodiment, an electromagnetic induction method, an electromagnetic coupling method, or a microwave method can be employed. In the case of a microwave method, the shapes of the antenna 501 and the antenna 505 may be determined as appropriate in accordance with the wavelength of an electromagnetic wave.

In the case where a microwave method (e.g., UHF band (860 MHz band to 960 MHz band), or 2.45 GHz band) is used as the signal transmission method in the semiconductor device, the length, shape, or the like of the antenna may be determined as appropriate in consideration of the wavelength of an electromagnetic wave used for signal transmission. For example, the antenna can be formed into a linear shape (e.g., a dipole antenna) or a flat shape (e.g., a patch antenna or an antenna having a ribbon shape). Further, the shape of the antenna is not limited to a linear shape, and the antenna may have a curved shape, a serpentine curved shape, or a shape combining them in consideration of the wavelength of the electromagnetic wave.

Figure 22:
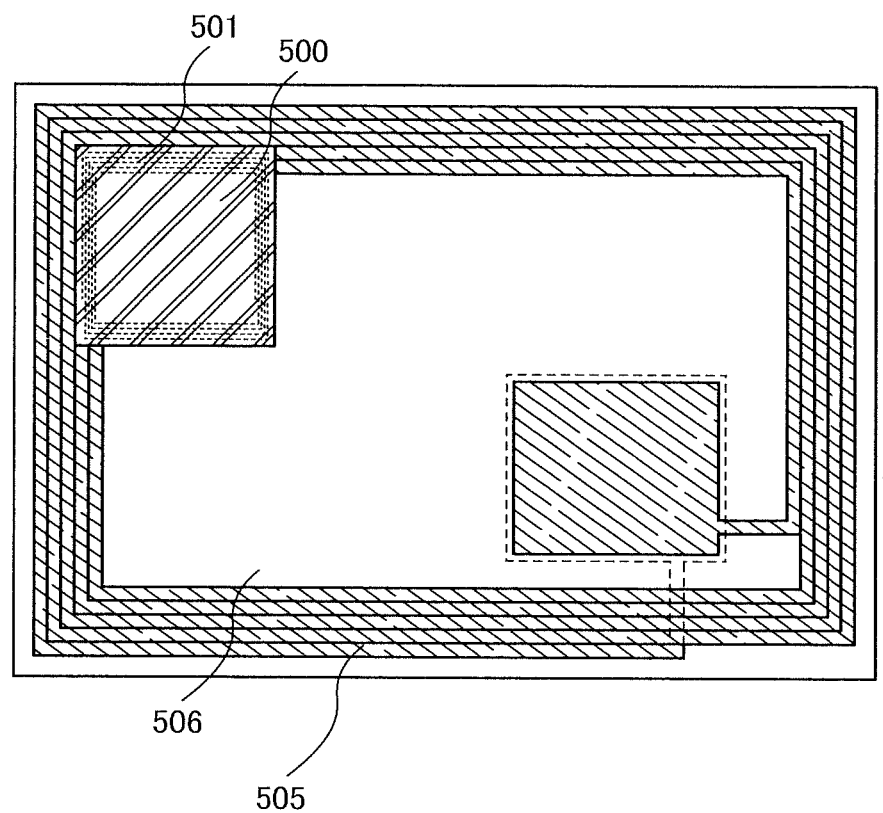
FIG. 22 illustrates a semiconductor device.

FIG. 22 illustrates an example of a semiconductor device provided with the coiled antenna 501 and the coiled antenna 505, to which an electromagnetic induction method or an electromagnetic coupling method is applied.

In FIG. 22, the semiconductor integrated circuit chip 500 provided with the coiled antenna 501 is formed over the supporting substrate 506 provided with the coiled antenna 505 as a booster antenna.

Next, structures of the semiconductor integrated circuit chip 500 and the booster antenna, and arrangement thereof will be described. The semiconductor device including the transistor of one embodiment of the present invention can be used for the semiconductor integrated circuit chip 500 illustrated in FIG. 21C, and here, a chip obtained by dividing the semiconductor devices into individual chips is referred to as a semiconductor integrated circuit chip.

The semiconductor integrated circuit 503 illustrated in FIG. 21C is sandwiched between a first insulator 512 and a second insulator 502 and side surfaces of the semiconductor integrated circuit 503 are sealed. In this embodiment, the first insulator and the second insulator between which a plurality of semiconductor integrated circuits is sandwiched are attached, and then the semiconductor integrated circuits are individually divided into stacks. A conductive shield is formed for the divided stacks, and the semiconductor integrated circuit chips 500 are formed. There is no particular limitation on the dividing means as long as the means is capable of physical dividing, and dividing is performed by laser beam irradiation in this embodiment.

In FIG. 21C, the semiconductor integrated circuit 503 is closer to the antenna 505 than the antenna 501 is; however one embodiment of the present invention is not limited to this structure. The antenna 501 may be arranged to be closer to the antenna 505 than the semiconductor integrated circuit 503 is. The semiconductor integrated circuit 503 and the antenna 501 may be directly attached to the first insulator 512 and the second insulator 502, or may be attached by a bonding layer functioning as an adhesive.

Figure 19:
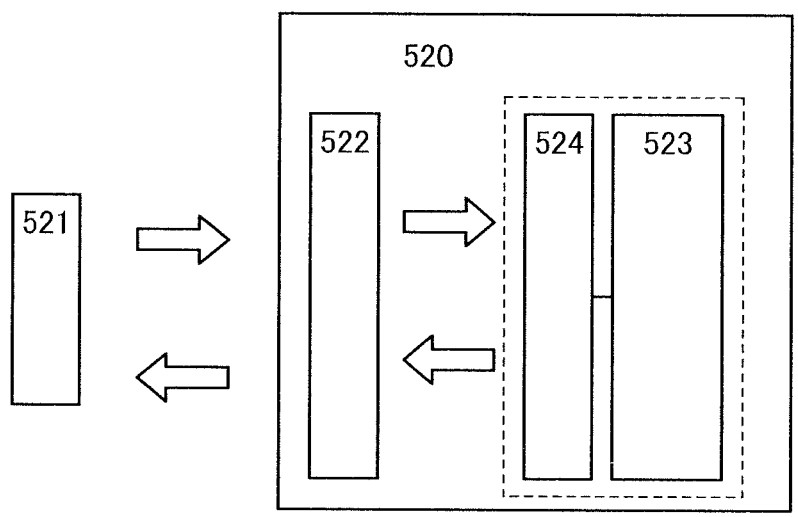
FIG. 19 illustrates a semiconductor device.

Next, operation of the semiconductor device of this embodiment will be described. FIG. 19 is a block diagram illustrating an example of a structure of a semiconductor device of this embodiment. A semiconductor device 520 illustrated in FIG. 19 includes a booster antenna 522, a semiconductor integrated circuit 523, and an on-chip antenna 524. When an electromagnetic wave is transmitted from an interrogator 521, the booster antenna 522 receives the electromagnetic wave to generate alternate current therein, whereby a magnetic field is generated around the booster antenna 522. Then, a loop-shaped portion included in the booster antenna 522 and the on-chip antenna 524 having a loop shape are electromagnetically coupled to each other, so that induced electromotive force is generated in the on-chip antenna 524. The semiconductor integrated circuit 523 receives a signal or electric power from the interrogator 521 by using the induced electromotive force. In contrast, when current flows through the on-chip antenna 524 in accordance with a signal generated in the semiconductor integrated circuit 523 so that induced electromotive force is generated in the booster antenna 522, a signal can be transmitted to the interrogator 521 over a reflected wave of an electric wave transmitted from the interrogator 521.

Note that the booster antenna 522 can be divided into the loop-shaped portion which is mainly electromagnetically coupled to the on-chip antenna 524 and a portion which mainly receives an electric wave from the interrogator 521. The shape of the portion of the booster antenna 522 which mainly receives radio waves from the interrogator 521 is not particularly limited as long as the booster antenna 522 can receive radio waves. For example, the shape of a dipole antenna, a folded dipole antenna, a slot antenna, a meander line antenna, a microstrip antenna, or the like may be used.

Although FIGS. 21A to 21C illustrate the structure of the semiconductor device having only one antenna, one embodiment of the present invention is not limited to this structure. The semiconductor device may have two antennas: one for receiving electric power and the other for receiving signals. When two antennas are included, a frequency of a radio wave for supplying power and a frequency of a radio wave for transmitting a signal can be separately used.

In the semiconductor device of this embodiment, the on-chip antenna is used and a signal or electric power can be transmitted and received between the booster antenna and the on-chip antenna without contact; therefore, unlike the case where an external antenna is connected to a semiconductor integrated circuit, the semiconductor integrated circuit and the antenna are less likely to be disconnected due to external force, and generation of initial failure in the connection can also be suppressed. In addition, since the booster antenna is used in this embodiment, unlike the case where only the on-chip antenna is used, the advantage of an external antenna can also be offered. In other words, the area of the semiconductor integrated circuit does not significantly limit the size or shape of the on-chip antenna, the frequency band of radio waves capable of being received is not limited, and the communication distance can be increased.

The semiconductor integrated circuit can be directly formed on a flexible substrate. Alternatively, the semiconductor integrated circuit may be transferred from a formation substrate (e.g., a glass substrate) to another substrate (e.g., a plastic substrate).

There is no particular limitation on the method of transferring the semiconductor integrated circuit from the formation substrate to another substrate, and a variety of methods can be used. For example, a separation layer may be formed between the formation substrate and the semiconductor integrated circuit.

For example, in the case where a metal oxide film is formed as the separation layer, the metal oxide film is weakened by crystallization, and an element layer including the semiconductor integrated circuit, which is a layer to be separated, can be separated from the formation substrate. After the metal oxide film is weakened by crystallization, part of the separation layer may be removed by etching with use of a halogen fluoride gas such as $NF_3$, $BrF_3$, or $ClF_3$, and then separation may be performed in the weakened metal oxide film.

Further, in the case where a substrate having a light-transmitting property is used as the formation substrate and a film containing nitrogen, oxygen, hydrogen or the like (e.g., an amorphous silicon film containing hydrogen, an alloy film containing hydrogen, an alloy film containing oxygen or the like) is used as the separation layer, the separation layer is irradiated with laser light through the formation substrate, and nitrogen, oxygen, or hydrogen contained in the separation layer is evaporated so that separation can occur between the formation substrate and the separation layer.

Alternatively, the layer to be separated may be separated from the formation substrate by removing the separation layer by etching.

Alternatively, a method of removing the formation substrate by mechanical grinding or a method of removing the formation substrate by etching using a halogen fluoride gas such as $NF_3$, $BrF_3$, or $ClF_3$ or HF, or the like can be employed. In this case, the separation layer can be omitted.

Alternatively, laser irradiation, etching using a gas, a solution, or the like, or a sharp knife or a scalpel, can be used so as to form a groove to expose the separation layer. The groove can trigger separation of the layer to be separated from the formation substrate from the separation layer.

As the separation method, for example, mechanical force (separation treatment with human hands or with a gripper, separation treatment by rotation of a roller, or the like) may also be used. Alternatively, the layer to be separated may be separated from the separation layer in such a manner that liquid is dropped into the groove so that the liquid to be infiltrated into the interface between the separation layer and the layer to be separated. Alternatively, a method can be employed in which a fluoride gas such as $NF_3$, $BrF_3$, or $ClF_3$ is introduced into the groove, and the separation layer is removed by etching with the use of the fluoride gas so that the layer to be separated is separated from the formation substrate. Further alternatively, the separation may be performed while pouring liquid such as water during the separation.

As another separation method, in the case where the separation layer is formed using tungsten, separation can be performed while the separation layer is etched by a mixed solution of ammonia water and hydrogen peroxide water.

As described above, by using the transistor of one embodiment of the present invention, a semiconductor device can be manufactured. The transistor of one embodiment of the present invention has a short channel length L and can be miniaturized; thus, the operation speed of the circuit can be increased, and furthermore, power consumption of the semiconductor device can be reduced.

This embodiment can be freely combined with any of other embodiments.

(Embodiment 7)

In this embodiment, application examples of a semiconductor device capable of inputting and outputting data without contact which is formed using the device described in Embodiment 6 will be described with reference to drawings. The semiconductor device capable of inputting and outputting data without contact is also referred to as an RFID tag, an ID tag, an IC tag, an IC chip, an RF tag, a wireless tag, an electronic tag, or a wireless chip, depending on the usage.

Figure 23A:
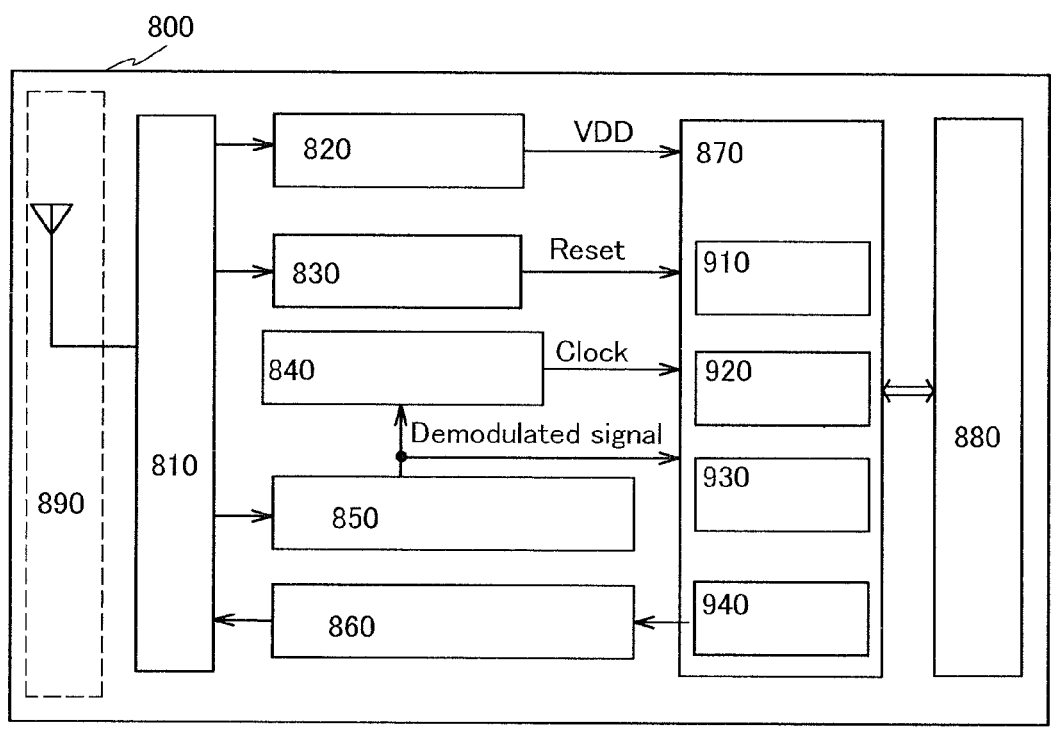
FIGS. 23A to 23C illustrate a semiconductor device.

A semiconductor device 800 has a function of exchanging data without contact and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (FIG. 23A). The high-frequency circuit 810 receives a signal from the antenna 890 and outputs a signal received from the data demodulation circuit 860 through the antenna 890. The power supply circuit 820 generates power supply potential from the received signal. The reset circuit 830 generates a reset signal. The clock generation circuit 840 generates various clock signals on the basis of the signal input from the antenna 890. The data demodulation circuit 850 demodulates the received signal and outputs the signal to the control circuit 870. The data modulation circuit 860 modulates a signal received from the control circuit 870. The control circuit 870 includes, for example, a code extracting circuit 910, a code judging circuit 920, a CRC judging circuit 930, and an output unit circuit 940. The code extracting circuit 910 extracts each of a plurality of codes included in an instruction transmitted to the control circuit 870. The code judging circuit 920 judges the content of the instruction by comparing the extracted code with a code corresponding to a reference. The CRC judging circuit 930 detects whether or not there is a transmission error or the like on the basis of the judged code.

Next, an example of the operation of the above semiconductor device will be described. First, a radio signal is received by the antenna 890. The radio signal is transmitted to the power supply circuit 820 via the high frequency circuit 810, thereby generating high power supply potential (hereinafter referred to as a $V_{DD}$). The $V_{DD}$ is supplied to each circuit included in the semiconductor device 800. A signal which is transmitted to the data demodulation circuit 850 via the high frequency circuit 810 is demodulated (hereinafter, the signal is referred to as a demodulated signal). Moreover, a signal passed through the reset circuit 830 and the clock generation circuit 840 via the high frequency circuit 810, and the demodulated signal are transmitted to the control circuit 870. The signals transmitted to the control circuit 870 are analyzed by the code extracting circuit 910, the code judging circuit 920, the CRC judging circuit 930, and the like. Then, on the basis of the analyzed signals, information of the semiconductor device stored in the memory circuit 880 is output. The output data of the semiconductor device is encoded via the output unit circuit 940. In addition, the encoded data of the semiconductor device 800 passes through the data modulation circuit 860 to be transmitted as a radio signal via the antenna 890. Note that low power supply potential (hereinafter referred to as $V_{SS}$) is common in the plurality of circuits included in the semiconductor device 800, and GND can be used as $V_{SS}$.

In this manner, the data of the semiconductor device 800 can be read by transmitting a signal from a communication device to the semiconductor device 800 and receiving a signal from the semiconductor device 800 by the communication device.

Further, the semiconductor device 800 may be one in which a power source (e.g., a battery) is not included and a power supply voltage is supplied to circuits by using electromagnetic waves. The semiconductor device 800 may also be one in which a power source (e.g., a battery) is included, and a power supply voltage is supplied to circuits by using both electromagnetic waves and the power source (battery).

Figure 23B:
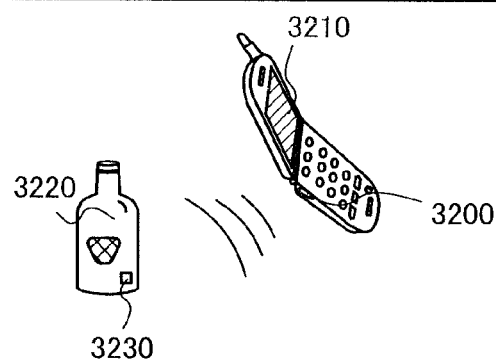
Figure 23C:
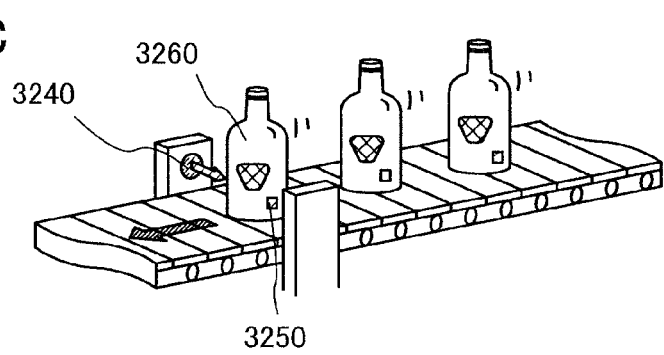

Next, an example of the usage of a semiconductor device capable of inputting and outputting data without contact will be described. A side surface of a mobile terminal which includes a display portion 3210 is provided with a communication device 3200. A side surface of a product 3220 is provided with a semiconductor device 3230 (FIG. 23B). When the communication device 3200 is put close to the semiconductor device 3230 on the product 3220, information on the product 3220, such as the raw material or the source of the product, inspection result in each production step, history of the distribution process, and explanation of the product, is displayed on the display portion 3210. Further, when a product 3260 is conveyed by a conveyer belt, the product 3260 can be inspected by using a communication device 3240 and a semiconductor device 3250 with which the product 3260 is provided (FIG. 23C). When the semiconductor device is used in a system in this manner, information can be obtained easily, and higher performance and higher added value are achieved.

As described above, a semiconductor device of the present invention, which has a very wide range of application, can be used in electronic devices in all kinds of fields.

(Embodiment 8)

In this embodiment, an example of a memory circuit which can be formed using any of the transistors described in Embodiments 1 to 4 will be described.

Figure 24A:
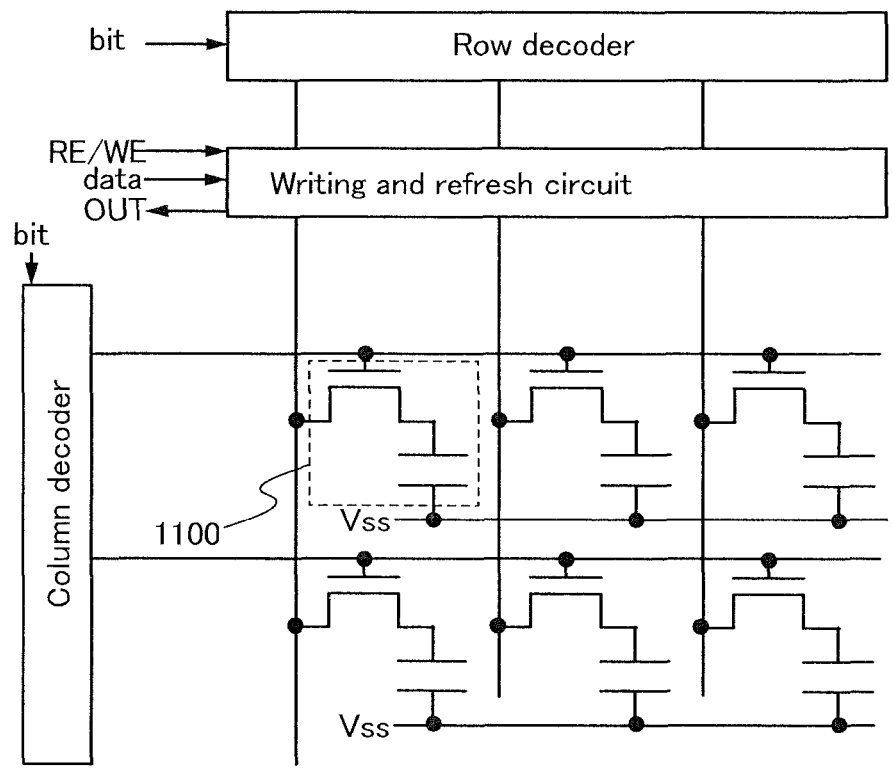
FIGS. 24A and 24B are equivalent circuit diagrams illustrating one embodiment of the present invention.

FIG. 24A is a block diagram of an example of a memory circuit. The memory circuit illustrated FIG. 24A includes a row decoder, a writing and refresh circuit, a column decoder, and memory elements 1100 arranged in matrix. Signal lines connected to the memory elements 1100 arranged in matrix are connected to the row decoder via the writing and refresh circuit. Scan lines connected to the memory elements 1100 arranged in matrix are connected to the column decoder. A bit signal is input to the row decoder. A read enable signal and a write enable signal (RE/WE) and a data signal (data) are input to the writing and refresh circuit, and an output signal (OUT) is output from the writing and refresh circuit.

Each of the memory elements 1100 includes a capacitor and a transistor. One of a source and a drain of the transistor is connected to the signal line, and the other of the source and the drain of the transistor is connected to one electrode of the capacitor, and the other electrode of the capacitor is connected to the low potential side (preferably, reference potential Vss).

Figure 24B:
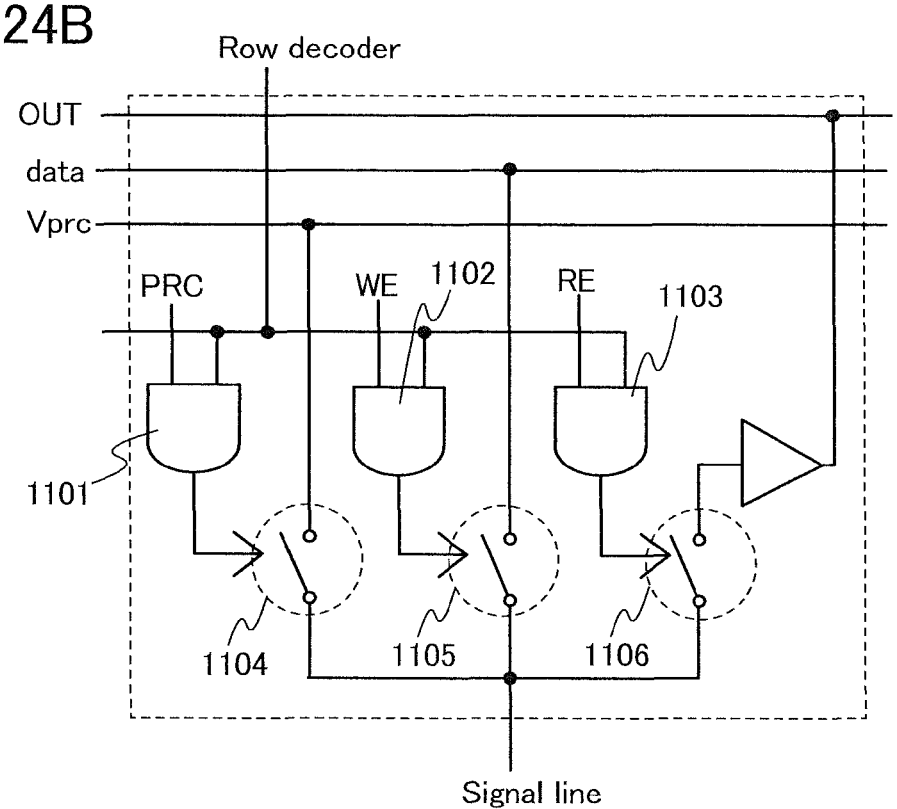

FIG. 24B illustrates a specific example of a structure of the refresh circuit provided in the writing and refresh circuit illustrated in FIG. 24A.

The writing and refresh circuit illustrated in FIG. 24B include an AND circuit and a sense amplifier. To one input of each of a first AND circuit 1101, a second AND circuit 1102, and a third AND circuit 1103, a signal is input from the row decoder. A PRC signal is input to the other input of the first AND circuit 1101, a write enable signal (WE) is input to the other input of the second AND circuit 1102, and a read enable signal (RE) is input to the other input of the third AND circuit 1103. The output of the first AND circuit 1101 controls on/off of a first switch 1104, the output of the second AND circuit 1102 controls on/off of a second switch 1105, and the output of the third AND circuit 1103 controls on/off of a third switch 1106. A pre-charge signal line Vprc is connected to the signal line through the first switch 1104, and a data signal line (data) is connected to the signal line through the second switch 1105.

The signal line connected though the first switch 1104 and the second switch 1105 are connected to the sense amplifier through the third switch 1106. A signal is output to the output signal line (OUT) from the sense amplifier.

The above-described AND circuit may have a general structure, and preferably has a simple structure.

The sense amplifier is a circuit having a function of amplifying a signal which is input.

Note that as a signal here, an analog signal or a digital signal which uses, for example, voltage, current, resistance, frequency, or the like can be used. For example, at least first potential and second potential are set, that is, high-level (also referred to as high potential or $V_H$) potential is used as the first potential and low-level (also referred to as low potential or $V_L$) potential is used as the second potential, whereby a binary digital signal can be set. Although $V_H$ and $V_L$ are preferably constant values, $V_H$ and $V_L$ each may take a range of values, in consideration of influence of noise.

As described above, a memory circuit can be manufactured using the transistor and the capacitor described in the above embodiment.

The refresh timing of the memory circuit is set to a certain time interval in the design phase on the basis of the leakage current of the memory elements which is evaluated in advance. In other words, the refresh timing is set in consideration of the temperature dependence of leakage current and fluctuation of the manufacturing process, after the chip is completed.

In a transistor of one embodiment of the present invention, sidewalls are provided for a source electrode layer and a drain electrode layer; thus, the transistor has a short channel length L and can be miniaturized. When a circuit is formed using the transistor, low power consumption can be realized and the operation of a memory circuit can be stabilized.

A transistor of one embodiment of the present invention includes an oxide semiconductor layer which has a large energy gap and in which the hydrogen concentration is sufficiently reduced; thus, off-state current of the transistor can be extremely small and the temperature characteristics of off-state current at a temperature ranging from −30° C. to 120° C. are hardly changed and an extremely small off-state current can be maintained. Accordingly, a normally-off transistor can be realized.

Thus, by using the transistor of one embodiment of the present invention, a refresh interval can be set long compared to a transistor including silicon, and power consumption in a standby period can be reduced.

Further, since the off-state current has little temperature dependence, the memory circuit in this embodiment is suitable for an in-vehicle electronic device. Since leakage current in a standby period is extremely small, in the case of using the memory circuit in an electric vehicle, the traveling distance per certain amount of charging hardly changes in a standby period.

This embodiment can be freely combined with any of other embodiments.

(Embodiment 9)

In this embodiment, an example of a shift register which can be formed using any of the transistors described in the above embodiments will be described.

Figure 25A:
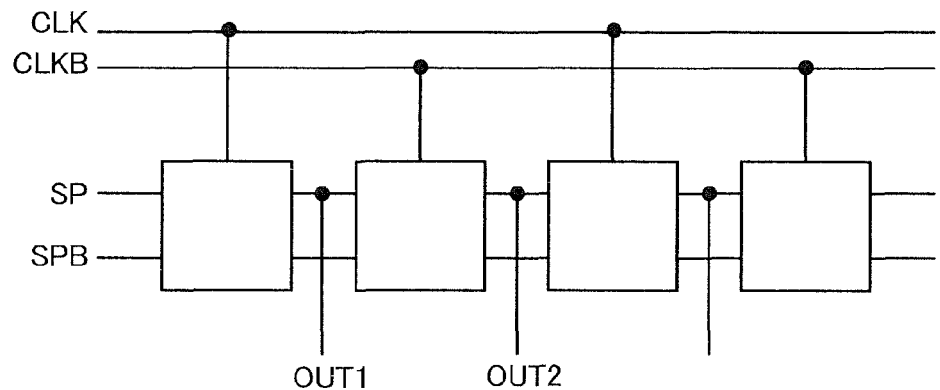
FIGS. 25A and 25B are equivalent circuit diagrams illustrating one embodiment of the present invention.

FIG. 25A is a block diagram illustrating an example of a shift register. The shift register illustrated in FIG. 25A includes two clock signal lines and two stages of flip-flops each of which is electrically connected to either of these clock signal lines. Note that a clock signal line may be further provided, and a larger number of stages of flip-flops may be provided.

In the two clock signal lines, each clock signal is input as follows: when one clock signal line is switched to high level ($V_H$), the other is switched to low level ($V_L$).

With reference to the shift register illustrated in FIG. 25A, an example of a shift register is illustrated, which includes flip-flops in order from a flip-flop in a first stage which is electrically connected to a first clock signal line CLK and a flip-flop in a second stage which is electrically connected to the second clock signal line CLKB, to a flip-flop in an (n−1)th stage and a flip-flop in an n-th stage. However, one embodiment of the present invention is not limited thereto, and the shift register includes at least a first flip-flop and a second flip-flop.

The clock signal line CLK is a wiring to which a clock signal CK is input.

The clock signal line CLKB is a wiring to which a clock signal CKB is input.

The clock signal CK and the clock signal CKB can be generated using, for example, a NOT circuit (inverter circuit).

A start signal SP and a start signal SPB are input to the first flip-flop, a clock signal CK is input thereto as a clock signal, and the first flip-flop outputs an output signal OUT1 depending on the states of the signal SP, the signal SPB, and the clock signal CK, which has been input. In this specification, the state of a signal refers to, for example, potential, current, or a frequency of the signal.

The start signal SP and the start signal SPB can be generated using, for example, a NOT circuit (inverter circuit).

In this specification, as a signal, for example, an analog signal or a digital signal which uses voltage, current, resistance, frequency, or the like can be used. For example, at least first potential and second potential are set, that is, high-level (also referred to as high potential or $V_H$) potential is used as the first potential and low-level (also referred to as low potential or $V_L$) potential is used as the second potential, whereby a binary digital signal can be set. Although $V_H$ and $V_L$ are preferably constant values, $V_H$ and $V_L$ each may take a range of values, in consideration of influence of noise.

The second flip-flop has the following function: to the second flip-flop, the output signal OUT1 of the first flip-flop is input as a start signal SP, and a clock signal CKB is input as a clock signal, and the second flip-flop outputs a signal OUT2 as an output signal, which is set depending on the states of an output signal and the clock signal CKB which have been input.

Figure 25B:
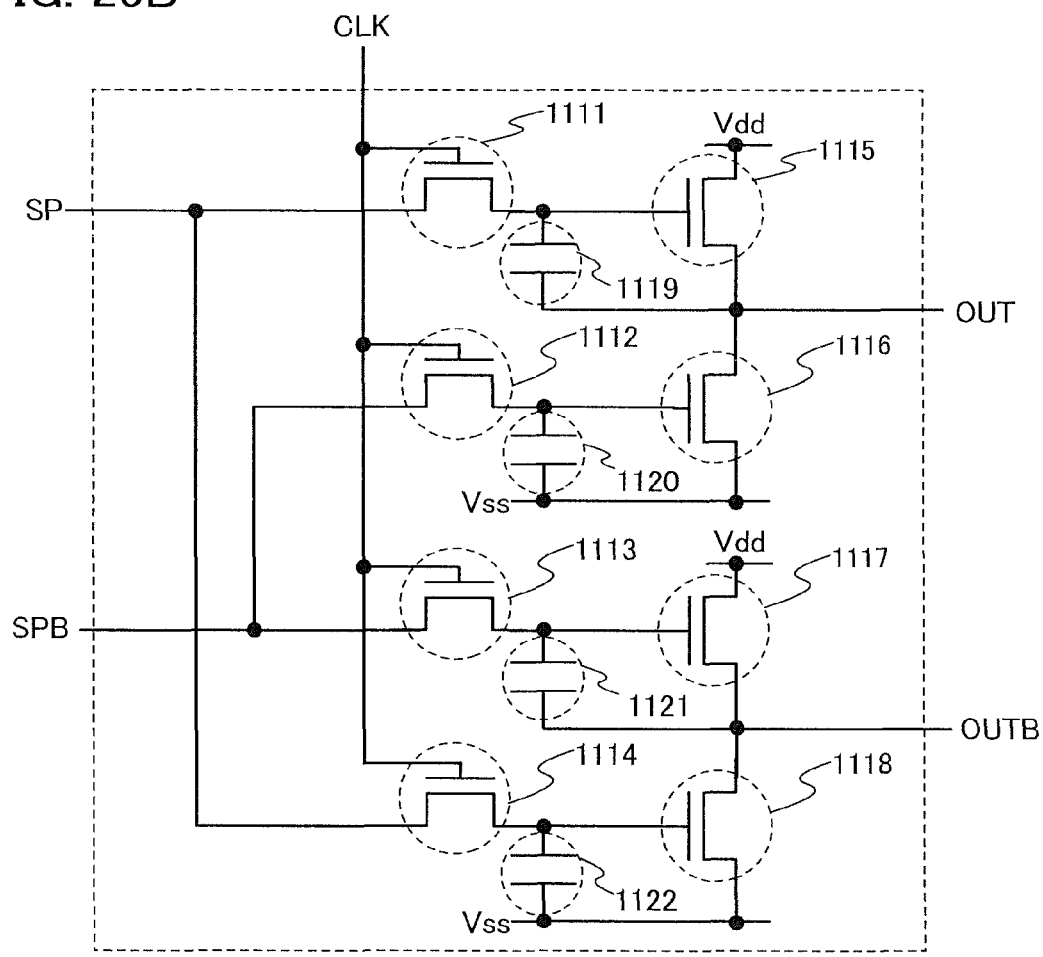

FIG. 25B illustrates a specific example of the structure of the first flip-flop illustrated in FIG. 25A.

The start signal SP is input to one of a source and a drain of a first transistor 1111 and one of a source or a drain of a fourth transistor 1114.

The start signal SPB is input to one of a source and a drain of a second transistor 1112 and one of a source or a drain of a third transistor 1113.

The clock signal CK is input to each gate of the first transistor 1111, the second transistor 1112, the third transistor 1113, and the fourth transistor 1114.

The other of the source and the drain of the first transistor 1111 is connected to a gate of a fifth transistor 1115 and one electrode of a first capacitor 1119.

The other of the source and the drain of the second transistor 1112 is connected to a gate of a sixth transistor 1116 and one electrode of a second capacitor 1120.

The other of the source and the drain of the third transistor 1113 is connected to a gate of a seventh transistor 1117 and one electrode of a third capacitor 1121.

The other of the source and the drain of the fourth transistor 1114 is connected to a gate of an eighth transistor 1118 and one electrode of a fourth capacitor 1122.

A drain of the fifth transistor 1115 is connected to the high potential side (preferably, power supply potential Vdd). A source of the fifth transistor 1115 is connected to the other electrode of the first capacitor 1119 and a drain of the sixth transistor 1116, and outputs an output signal OUT. The other electrode of the second capacitor 1120 and a source of the sixth transistor 1116 are connected to the low potential side (preferably, reference potential Vss).

A drain of the seventh transistor 1117 is connected to the high potential side (preferably, power supply potential $V_{dd}$). A source of the seventh transistor 1117 is connected to the other electrode of the third capacitor 1121 and a drain of the eighth transistor 1118, and outputs an output signal OUTB. The other electrode of the fourth capacitor 1122 and a source of the eighth transistor 1118 are connected to the low potential side (preferably, reference potential $V_{ss}$).

The first capacitor 1119, the second capacitor 1120, the third capacitor 1121, and the fourth capacitor 1122 can be formed over the same substrate as the transistor, using the capacitor described in the above embodiment.

As described above, the flip-flop circuit can be manufactured using the transistor of one embodiment of the present invention, which includes a purified oxide semiconductor layer. The transistor of one embodiment of the present invention in which sidewalls are provided for a source electrode layer and a drain electrode layer has a short channel length L and can be miniaturized; thus, the operation speed of a circuit can be increased and power consumption can be reduced.

This embodiment can be freely combined with any of other embodiments.

(Embodiment 10)

In this embodiment, an example of a booster circuit (a charge pump circuit) which can be formed using any of the transistors described in the above embodiments will be described.

Figure 26:
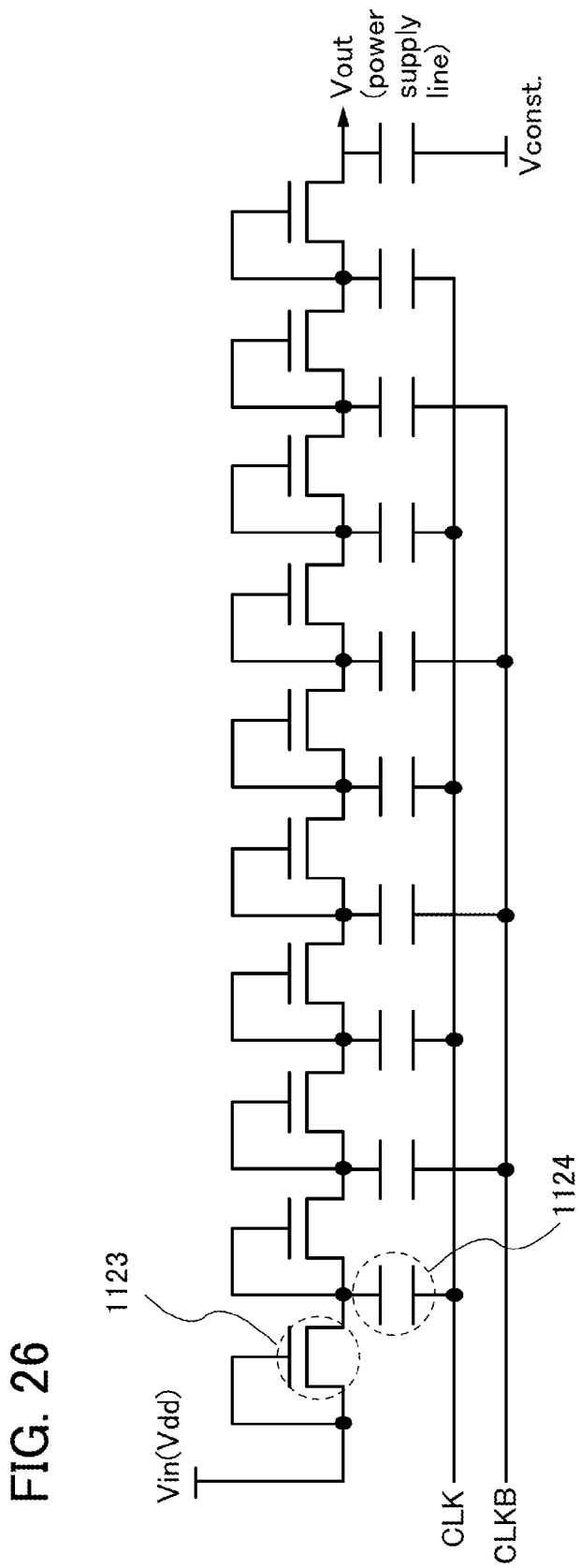
FIG. 26 is an equivalent circuit diagram illustrating one embodiment of the present invention.

FIG. 26 illustrates a specific example of a structure of a booster circuit. The booster circuit illustrated in FIG. 26 includes two clock signal lines CLK and CLKB. One electrode of each of a plurality of capacitors 1124 is connected to either the clock signal line CLK or the clock signal line CLKB. The other electrode of each of the plurality of capacitors 1124 is connected to a wiring to which a drain electrode of one of a plurality of transistors 1123, each of which is diode-connected in the forward bias direction, and a source electrode and a gate electrode of a transistor adjacent to the transistor are connected. Moreover, a storage capacitor, one of electrodes of which is connected to a drain electrode of a transistor at the last row and the other electrode is held at fixed potential is included.

Note that a clock signal line may be further provided.

A transistor and a capacitor may be additionally provided in accordance with the potential to be output.

In the two clock signal lines, each clock signal is input as follows: when one clock signal line is switched to high level ($V_H$), the other is switched to low level ($V_L$).

The clock signal CK and the clock signal CKB can be generated using, for example, a NOT circuit (an inverter circuit). The NOT circuit can be manufactured using the EDMOS circuit described in Embodiment 4.

By using the booster circuit illustrated in FIG. 26, potential input from $V_{in}$ can be raised to $V_{out}$. For example, when power supply potential $V_{dd}$ is input from $V_{in}$, potential higher than $V_{dd}$ can be output from $V_{out}$ and raised to predetermined potential. Thus, a signal with the potential raised to predetermined potential is input to, for example, a power supply line, and is used for each circuit mounted on the same substrate as the booster circuit.

Note that here, the fixed potential at which the other electrode of the storage capacitor is held may be, for example, power supply potential $V_{dd}$ or reference potential $V_{ss}$.

In this specification, as a signal, for example, an analog signal or a digital signal which uses voltage, current, resistance, frequency, or the like can be used. For example, at first potential and second potential are set, that is, high-level (also referred to as high potential or $V_H$) potential is used as the first potential and low-level (also referred to as low potential or $V_L$) potential is used as the second potential, whereby a binary digital signal can be set. Although $V_H$ and $V_L$ are preferably constant values, $V_H$ and $V_L$ each may take a range of values, in consideration of influence of noise.

As described above, the booster circuit can be manufactured using any of the transistors described in the above embodiments. The transistor of one embodiment of the present invention, in which sidewalls are provided for a source electrode layer and a drain electrode layer, has a short channel length L and can be miniaturized; thus, the operation speed of a circuit can be increased and power consumption can be reduced.

This embodiment can be freely combined with any of other embodiments.

(Embodiment 11)

In this embodiment, examples of electronic devices each of which is mounted with a semiconductor integrated circuit which can be obtained according to any of Embodiments 1 to 10 will be described with reference to FIGS. 27A to 27E. Note that the semiconductor integrated circuit is mounted on a circuit board or the like and then incorporated inside the main body of each electronic device.

A semiconductor integrated circuit including any of the transistors described in the above embodiments is mounted on a motherboard. A semiconductor integrated circuit is manufactured by mounting a logic circuit, a flash memory circuit, an SRAM circuit, a DRAM circuit, and the like. Further, the CPU described in the above embodiment or a logic circuit can be mounted as well. The semiconductor integrated circuit can be mounted by a wire bonding method. In that case also, integrated circuit films having various shapes can be mounted.

Further, an FPC is attached to the circuit board, and the circuit board is connected to a display device or the like through the FPC. A driver and a controller of a display portion can be formed. The driver of the display portion includes the shift register or the EDMOS circuit described in the above embodiment.

Figure 27A:
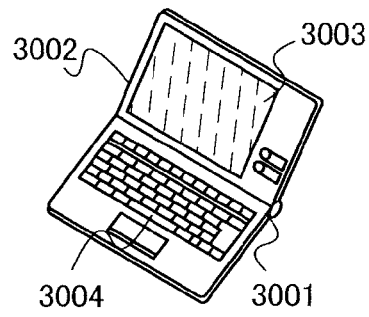
FIGS. 27A to 27E illustrate examples of electronic devices.

FIG. 27A illustrates a laptop personal computer manufactured by mounting at least the semiconductor integrated circuit as a component, which includes a main body 3001, a housing 3002, a display portion 3003, a keyboard 3004, and the like. The laptop personal computer includes the CPU described in the above embodiment, a DRAM circuit, or the like.

Figure 27D:
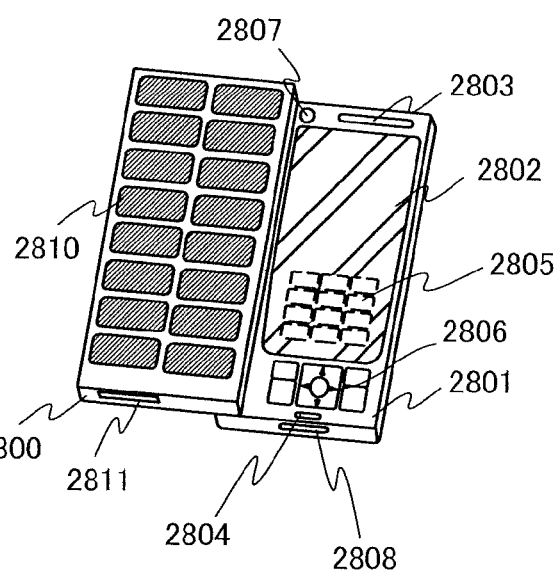
Figure 27B:
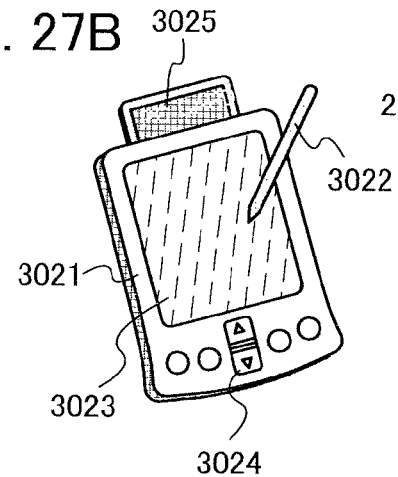

FIG. 27B illustrates a portable information terminal (PDA) manufactured by mounting at least the semiconductor integrated circuit as a component, which includes a display portion 3023, an external interface 3025, operation buttons 3024, and the like in a main body 3021. In addition, the portable information terminal device has a stylus 3022 as an accessory for operation.

Figure 27C:
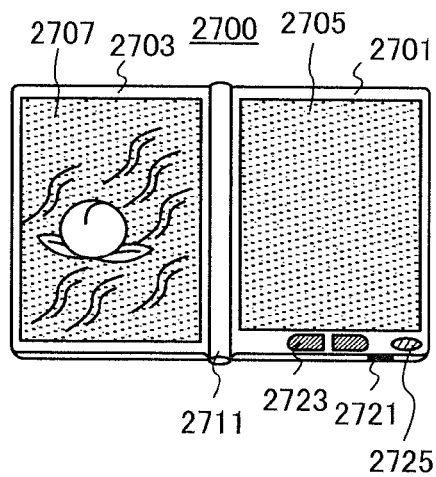

FIG. 27C illustrates an e-book reader equipped with an electronic paper manufactured by mounting at least the semiconductor integrated circuit as a component. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. FIG. 27C illustrates an example of an e-book reader. For example, an e-book reader 2700 includes two housings: a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 27C) can display text and a display portion on the left side (the display portion 2707 in FIG. 27C) can display graphics.

FIG. 27C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. In addition, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an ebook server.

FIG. 27D is a mobile phone manufactured by mounting at least the semiconductor integrated circuit as a component, which includes two housings: a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar battery cell 2810 for charging of the portable information terminal, an external memory slot 2811, and the like. In addition, an antenna is incorporated in the housing 2801.

Further, the display panel 2802 is provided with a touch panel. A plurality of operation keys 2805 which is displayed as images is indicated by the dashed line in FIG. 27D. The display panel 2802 is mounted with a booster circuit (the booster circuit described in the above embodiment) for raising voltage output from the solar battery cell 2810 to voltage needed for each circuit.

Further, in addition to the above structure, the contactless IC chip described in the above embodiment or a small memory device, or the like may be incorporated.

In the display panel 2802, the direction of display is changed as appropriate depending on the usage pattern. Further, the display device is provided with the camera lens 2807 on the same surface as the display panel 2802; thus, it can be used as a video phone. The speaker 2803 and the microphone 2804 can be used for videophone, recording, playback, and the like without being limited to verbal communication. Moreover, the housings 2800 and 2801 in a state where they are developed as illustrated in FIG. 27D can be slid so that one is lapped over the other; therefore, the size of the mobile phone can be reduced, which makes the mobile phone suitable for being carried around.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 27E:
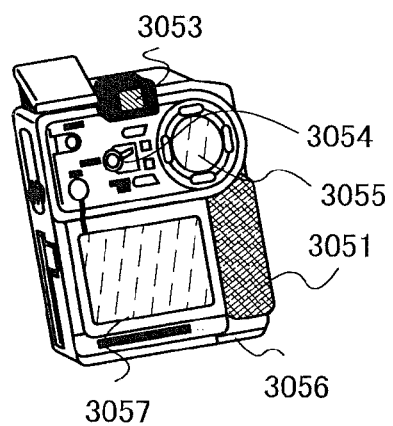

FIG. 27E illustrates a digital camera manufactured by mounting at least the semiconductor integrated circuit as a component, which includes a main body 3051, a display portion A 3057, an eyepiece 3053, operation switches 3054, a display portion B 3055, a battery 3056, and the like.

As described above, a semiconductor device including the transistor described in the above embodiment has a very wide range of application, and can be used in electronic devices in all kinds of fields. The transistor of one embodiment of the present invention, in which sidewalls are provided for a source electrode layer and a drain electrode layer, has a short channel length L and can be miniaturized. Thus, by using the transistor of one embodiment of the present invention, the operation speed of a circuit can be increased and power consumption of an electronic device can be reduced.

This embodiment can be freely combined with any one of Embodiments 1 to 10.

This application is based on Japanese Patent Application serial no. 2009-276004 filed with Japan Patent Office on Dec. 4, 2009, the entire contents of which are hereby incorporated by reference.

The invention claimed is:

1. A semiconductor device comprising:
    an oxide semiconductor layer over an insulating surface;
    a source electrode layer and a drain electrode layer over the oxide semiconductor layer, the source electrode layer and the drain electrode layer each electrically connected to the oxide semiconductor layer;
    a gate insulating layer over the oxide semiconductor layer, the source electrode layer, and the drain electrode layer; and
    a gate electrode layer over the gate insulating layer,
    wherein the gate electrode layer overlaps with the oxide semiconductor layer, the source electrode layer, and the drain electrode layer,
    wherein the source electrode layer and the drain electrode layer each has a stacked-layer structure, and
    wherein a side surface of each of the source electrode layer and the drain electrode layer is tapered.

2. The semiconductor device according to claim 1, wherein the source electrode layer and the drain electrode layer each comprises a first conductive layer and a second conductive layer over the first conductive layer, and wherein a distance between inner sides of the first conductive layer of the source electrode layer and the first conductive layer of the drain electrode layer is shorter than a distance between inner sides of the second conductive layer of the source electrode layer and the second conductive layer of the drain electrode layer.

3. The semiconductor device according to claim 1, wherein the source electrode layer and the drain electrode layer each comprises a layer including titanium, a layer including tungsten, and a layer including aluminum.

4. The semiconductor device according to claim 1, wherein the oxide semiconductor layer comprises indium and zinc.

5. An electric apparatus comprising the semiconductor device according to claim 1.

6. The semiconductor device according to claim 1, wherein the stacked-layer structure comprises an aluminum film and a titanium film over the aluminum film.

7. The semiconductor device according to claim 1, further comprising:
    a first sidewall over the oxide semiconductor layer, the first sidewall in contact with a side surface of the source electrode layer; and
    a second sidewall over the oxide semiconductor layer, the second sidewall in contact with a side surface of the drain electrode layer.

8. A semiconductor device comprising:
    a first gate electrode layer;
    an insulating layer over the first gate electrode layer;
    an oxide semiconductor layer over the insulating layer, the oxide semiconductor layer overlapping with the first gate electrode layer;
    a source electrode layer and a drain electrode layer over the oxide semiconductor layer, the source electrode layer and the drain electrode layer each electrically connected to the oxide semiconductor layer;
    a gate insulating layer over the oxide semiconductor layer, the source electrode layer, and the drain electrode layer; and
    a second gate electrode layer over the gate insulating layer,
    wherein the second gate electrode layer overlaps with the oxide semiconductor layer, the source electrode layer, and the drain electrode layer,
    wherein the source electrode layer and the drain electrode layer each has a stacked-layer structure, and
    wherein a side surface of each of the source electrode layer and the drain electrode layer is tapered.

9. The semiconductor device according to claim 8, wherein the source electrode layer and the drain electrode layer each comprises a first conductive layer and a second conductive layer over the first conductive layer, and wherein a distance between inner sides of the first conductive layer of the source electrode layer and the first conductive layer of the drain electrode layer is shorter than a distance between inner sides of the second conductive layer of the source electrode layer and the second conductive layer of the drain electrode layer.

10. The semiconductor device according to claim 8, wherein the source electrode layer and the drain electrode layer each comprises a layer including titanium, a layer including tungsten, and a layer including aluminum.

11. The semiconductor device according to claim 8, wherein the oxide semiconductor layer comprises indium and zinc.

12. The semiconductor device according to claim 8, wherein a fixed potential is connected to the first gate electrode layer.

13. The semiconductor device according to claim 8,
wherein a transistor comprises the oxide semiconductor layer, the source electrode layer, the drain electrode layer, the second gate electrode layer, and
wherein a threshold voltage of the transistor is configured to be controlled by a potential supplied to the first gate electrode layer.

14. An electric apparatus comprising the semiconductor device according to claim 8.

15. The semiconductor device according to claim 8, wherein the stacked-layer structure comprises an aluminum film and a titanium film over the aluminum film.

16. A semiconductor device comprising:
a first gate electrode layer;
an insulating layer over the first gate electrode layer;
an oxide semiconductor layer over the insulating layer, the oxide semiconductor layer overlapping with the first gate electrode layer;
a source electrode layer and a drain electrode layer over the oxide semiconductor layer, the source electrode layer and the drain electrode layer each electrically connected to the oxide semiconductor layer;
a gate insulating layer over the oxide semiconductor layer, the source electrode layer, and the drain electrode layer; and
a second gate electrode layer over the gate insulating layer,
wherein the second gate electrode layer is electrically connected to one of the source electrode layer and the drain electrode layer,
wherein the second gate electrode layer overlaps with the oxide semiconductor layer, the source electrode layer, and the drain electrode layer,
wherein the source electrode layer and the drain electrode layer each has a stacked-layer structure, and
wherein a side surface of each of the source electrode layer and the drain electrode layer is tapered.

17. The semiconductor device according to claim 16,
wherein the source electrode layer and the drain electrode layer each comprises a first conductive layer and a second conductive layer over the first conductive layer, and
wherein a distance between inner sides of the first conductive layer of the source electrode layer and the first conductive layer of the drain electrode layer is shorter than a distance between inner sides of the second conductive layer of the source electrode layer and the second conductive layer of the drain electrode layer.

18. The semiconductor device according to claim 16, wherein the source electrode layer and the drain electrode layer each comprises a layer including titanium, a layer including tungsten, and a layer including aluminum.

19. The semiconductor device according to claim 16, wherein the oxide semiconductor layer comprises indium and zinc.

20. The semiconductor device according to claim 16, wherein a fixed potential is connected to the first gate electrode layer.

21. The semiconductor device according to claim 16,
wherein a transistor comprises the oxide semiconductor layer, the source electrode layer, the drain electrode layer, the second gate electrode layer, and
wherein a threshold voltage of the transistor is configured to be controlled by a potential supplied to the first gate electrode layer.

22. An electric apparatus comprising the semiconductor device according to claim 16.

23. The semiconductor device according to claim 16, wherein the stacked-layer structure comprises an aluminum film and a titanium film over the aluminum film.

* * * * *